(12) United States Patent
Asakawa et al.

(10) Patent No.: US 8,043,520 B2
(45) Date of Patent: *Oct. 25, 2011

(54) METHOD FOR MANUFACTURING POROUS STRUCTURE AND METHOD FOR FORMING PATTERN

(75) Inventors: Koji Asakawa, Tokyo (JP); Toshiro Hiraoka, Tokyo (JP); Yoshihiro Akasaka, Tokyo (JP); Yasuyuki Hotta, Tokyo (JP)

(73) Assignee: Kabushiki Kaisha Toshiba, Kawasaki-shi (JP)

( * ) Notice: Subject to any disclaimer, the term of this patent is extended or adjusted under 35 U.S.C. 154(b) by 356 days.

This patent is subject to a terminal disclaimer.

(21) Appl. No.: 12/355,170

(22) Filed: Jan. 16, 2009

(65) Prior Publication Data

US 2009/0130380 A1    May 21, 2009

Related U.S. Application Data

(62) Division of application No. 11/455,916, filed on Jun. 20, 2006, now Pat. No. 7,517,466, which is a division of application No. 10/374,956, filed on Jan. 22, 2003, now Pat. No. 7,090,784, which is a division of application No. 09/588,721, filed on Jun. 7, 2000, now Pat. No. 6,565,763.

(30) Foreign Application Priority Data

Jun. 7, 1999   (JP) .................................. 11-159479
Sep. 16, 1999  (JP) .................................. 11-262326
Jun. 6, 2000   (JP) ................................ 2000-169263

(51) Int. Cl.
    *C08J 9/26* (2006.01)

(52) U.S. Cl. ............................. 216/56; 216/13; 977/900
(58) Field of Classification Search .................. None
    See application file for complete search history.

(56) References Cited

U.S. PATENT DOCUMENTS

| 3,625,765 A | 12/1971 | Arrance et al. |
| 4,096,099 A | 6/1978 | Koyama et al. |
| 4,548,737 A | 10/1985 | Ballard et al. |
| 4,618,454 A | 10/1986 | Ballard et al. |
| 4,849,504 A | 7/1989 | Ballard et al. |

(Continued)

FOREIGN PATENT DOCUMENTS

JP   53-030661 A   3/1978

(Continued)

OTHER PUBLICATIONS

Labadie, Jeff W. et al, IEEE Transactions on Components, Hybrids, and Manufacturing Technology, "Nanopore Foams of High Temperature Polymers" 15 (6) 925-930, Dec. 6, 1992.*

(Continued)

*Primary Examiner* — Anita Alanko
(74) *Attorney, Agent, or Firm* — Oblon, Spivak, McClelland, Maier & Neustadt, L.L.P.

(57) ABSTRACT

A pattern forming material contains a block copolymer or graft copolymer and forms a structure having micro polymer phases, in which, with respect to at least two polymer chains among polymer chains constituting the block copolymer or graft copolymer, the ratio between N/(Nc–No) values of monomer units constituting respective polymer chains is 1.4 or more, where N represents total number of atoms in the monomer unit, Nc represents the number of carbon atoms in the monomer unit, No represents the number of oxygen atoms in the monomer unit.

9 Claims, 8 Drawing Sheets

U.S. PATENT DOCUMENTS

| | | | |
|---|---|---|---|
| 5,254,249 A * | 10/1993 | Terada et al. | 210/321.62 |
| 5,675,532 A | 10/1997 | Gemma et al. | |
| 5,716,997 A | 2/1998 | Toyosawa et al. | |
| 5,776,990 A | 7/1998 | Hedrick et al. | |
| 5,851,736 A | 12/1998 | Omote et al. | |
| 5,948,470 A | 9/1999 | Harrison et al. | |
| 5,969,020 A | 10/1999 | Shalaby et al. | |
| 6,054,507 A | 4/2000 | Funki et al. | |
| 6,125,095 A | 9/2000 | Germma et al. | |
| 6,197,399 B1 | 3/2001 | Naito et al. | |
| 6,303,277 B1 | 10/2001 | Hieda et al. | |
| 6,391,471 B1 * | 5/2002 | Hiraoka et al. | 428/623 |
| 6,465,742 B1 | 10/2002 | Hiraoka et al. | |
| 6,565,764 B2 * | 5/2003 | Hiraoka et al. | 216/56 |
| 6,592,991 B1 | 7/2003 | Wiesner et al. | |
| 6,825,056 B2 | 11/2004 | Asakawa et al. | |
| 7,037,738 B2 | 5/2006 | Sugiyama et al. | |
| 7,056,455 B2 | 6/2006 | Matyjaszewski et al. | |
| 7,090,784 B2 * | 8/2006 | Asakawa et al. | 216/41 |
| 7,097,781 B2 | 8/2006 | Asakawa et al. | |
| 7,179,672 B2 | 2/2007 | Asakawa et al. | |
| 7,347,953 B2 | 3/2008 | Black et al. | |
| 7,517,466 B2 * | 4/2009 | Asakawa et al. | 216/41 |
| 7,763,228 B2 * | 7/2010 | Oya et al. | 423/447.1 |
| 2003/0118800 A1 | 6/2003 | Thomas et al. | |
| 2004/0077156 A1 | 4/2004 | Tsakalakos et al. | |
| 2004/0142578 A1 | 7/2004 | Wiesner et al. | |
| 2005/0236714 A1 | 10/2005 | Leu et al. | |
| 2007/0293041 A1 | 12/2007 | Yang et al. | |
| 2008/0083991 A1 | 4/2008 | Yang et al. | |
| 2008/0132070 A1 | 6/2008 | Li et al. | |
| 2008/0176767 A1 | 7/2008 | Milward | |
| 2008/0193658 A1 | 8/2008 | Milward | |
| 2008/0213956 A1 | 9/2008 | Black et al. | |
| 2008/0217292 A1 | 9/2008 | Milward et al. | |

FOREIGN PATENT DOCUMENTS

| | | | |
|---|---|---|---|
| JP | 58-71903 | | 4/1983 |
| JP | 59-206455 | | 11/1984 |
| JP | 63130103 A | * | 6/1988 |
| JP | 03-119014 | | 5/1991 |
| JP | 03-119015 | | 5/1991 |
| JP | 03-292310 | | 12/1991 |
| JP | 03-292310 A | | 12/1991 |
| JP | 05-310867 A | | 11/1993 |
| JP | 09-295811 | | 11/1997 |
| JP | 10-152540 | | 6/1998 |
| JP | 10-259221 | | 9/1998 |
| JP | 11-080414 A | | 3/1999 |
| JP | 11060891 A | | 3/1999 |
| JP | 11-209558 | | 8/1999 |
| JP | 2000-169263 | | 6/2000 |
| JP | 2001-151834 | | 5/2001 |
| JP | 05-310867 | | 11/2003 |

OTHER PUBLICATIONS

Morkved, T.K., et al., "Local Control of Microdomain Orientation in Diblock Copolymer Thin Films with electric Fields," Science, vol. 273, Aug. 16, 1996, pp. 931-933.

Park, Miri, et al., "Block Copolymer Lithography: Periodic Arrays of-10" Holes in 1 Square Centimeter," Science, vol. 276, May 30, 1997, pp. 1401-1404.

Templin, Markus, et al., "Organically Modified Aluminosillicate Mesostructures from Block Copolymer Phases,"Science, vol. 278, Dec. 5, 1997, pp. 1795-1798.

Labadie, Jeff W. et al., "Nanopore Foams of High Temperature Polymers,"IEEE Transactions of Components, Hybrids, and Manufacturing technology, vol. 15, No. 6, Dec. 1992, pp. 925-930.

Spatz, Joachim P., et al. "Ultrathin Diblock Copolymer/Titanium Laminates—A Tool for Nanolithography,"Adv. Mater., 1998, 10, No. 11, pp. 849-852.

Harrison, Christopher, et al., "Lithography with a mask of block copolymer microstructures," J. Vac. Sci. Technolo., B. 16(2), Mar./Apr. 1998, pp. 544-551.

Mansky, P., et al., "Nanolithographic templates from diblock copolymer thin films," Appl. Phys. Left 38 (18), Apr. 29, 2996, pp. 2586-2588.

Mansky, P., et al., "Nanometer Scale Periodic Modulation of a 2-D Electron System with Block Copolymers,"Bull. Am. Phy. Soc., vol. 36, No. 3, 1991, pp. 1051.

Zehner, R.W. et al. "Selective Decoration of a Phas-Separated Diblock Copolymer with Thiol-Pasivated gold Nanocrystals" Langmuir, Jan. 20, 1998, 14 (2) 241-244.

Hahm, J. et al. Cylinder Alighnemnt in Annular Structures of Microphase-Seperated Polystryrene-b-Poly(methyl methacrylate): Langmuir, Apr. 14, 2000, 16, 4768-4769.

Buck, E. et al. "Surface-induced Microphase Spearation in Spin-Cast Ultrathin Diblock Copolymer Films on Silicon Substrate before and after annealing", Macromolecules, Mar. 2, 2001, 34, 2172-2178.

Spatz, Joachim P., et al., "Micellar Inorganic-Polymer Hybrid Systems-A toll for Nanolithography," Adv. Mater., 1999, 11, No. 2, pp. 149-153.

* cited by examiner

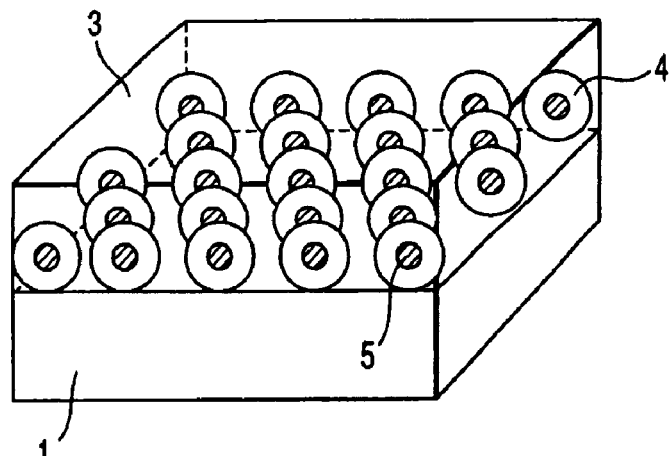
F I G. 4A
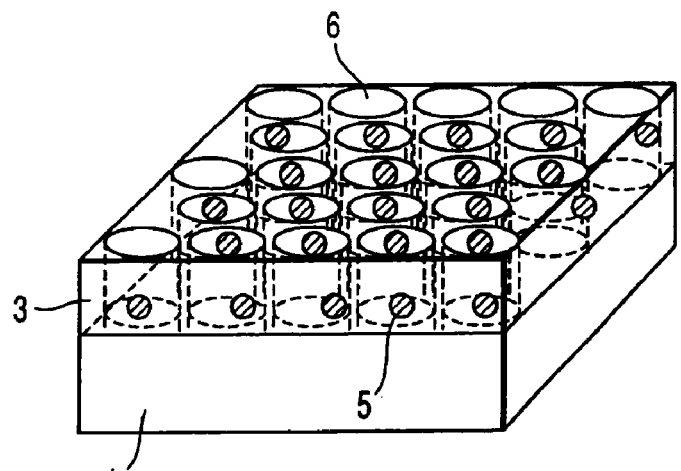
F I G. 4B
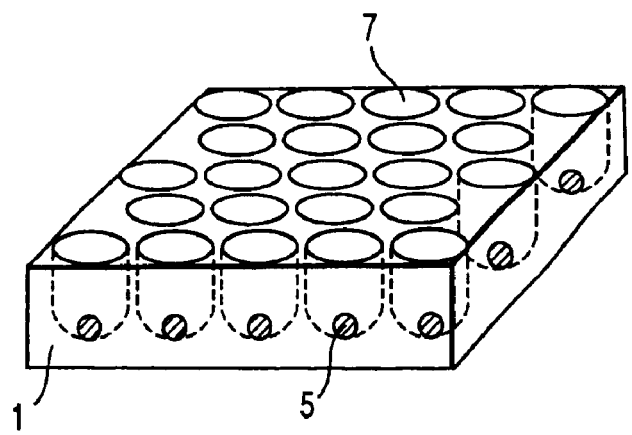
F I G. 4C

METHOD FOR MANUFACTURING POROUS STRUCTURE AND METHOD FOR FORMING PATTERN

CROSS-REFERENCE TO RELATED APPLICATIONS

This application is a Divisional application of U.S. application Ser. No. 11/455,916, filed on Jun. 20, 2006 now U.S. Pat. No. 7,517,466, which is a Divisional application of U.S. application Ser. No. 10/374,956, filed on Jan. 22, 2003 now U.S. Pat. No. 7,090,784, which is a Divisional application of U.S. application Ser. No. 09/588,721, filed on Jun. 7, 2003 now U.S. Pat. No. 6,565,763.

BACKGROUND OF THE INVENTION

The present invention relates to a material that is capable of forming a pattern of the order of nanometers in a self-organized manner on a substrate, the pattern being utilized as a mask for forming a nanopattern excellent in regularity. The present invention also relates to a material that is capable of forming a bulk structure of the order of nanometers in a self-organized manner, the structure being utilized as it is as a nanostructure of high regularity, or utilized as a template for forming another nanostructure of high regularity. The material of the present invention is applied for manufacturing a magnetic recording medium for hard disks having a recording density of 10 Gbit/inch$^2$ or more, an electrochemical cell, a solar cell, a photovoltaic device, a light emitting device, a display, a light modulating device, an organic FET device, a capacitor, a high-precision filter, etc.

Needs for a fine pattern or structure are increasingly desired, as improvement in performance of electronic parts. In the electronic parts such as LSI and liquid crystal display, for example, micro-fabrication techniques are required. Many devices such as an electric cell and a capacitor are required small volume and large surface area. In future, a high-density three-dimensional packaging will be needed. Lithography is employed in these processes, and thus the manufacturing cost becomes higher as more micro-fabrications are needed.

On the other hand, there is a technical field where precision as high as in the case of the lithography is not needed, although a patterning of the order of nanometers is required. However, a simple patterning method has not known hitherto, there is no other choice to form a fine pattern by lithography using an electronic beam or deep ultraviolet ray in such a technical field. As mentioned above, in the lithography technique, operations are complicated and enormous investment is required as the processing dimension becomes smaller.

Under these circumstances, as a simple pattern forming method alternative to the lithography technique, a method utilizing a structure having micro polymer phases formed in a self-developed manner from a block copolymer.

For example, P. Mansky et al. have reported, in Appl. Phys. Lett., Vol. 68, No. 18, p. 2586-2588, a method in that a sea-island type microphase-separated film made of a block copolymer of polystyrene and polyisoprene is formed on a substrate, the polyisoprene is decomposed by ozonation and removed to form a porous film, and the substrate is etched using the porous film as a mask, thereby forming a pattern, to which the structure having micro polymer phases is transferred, on the substrate. In addition, M. Park et al. have reported, in Science, Vol. 276, 1401-1406, a method in that a sea-island type microphase-separated film made of a block copolymer of polystyrene and polyisoprene is formed on a substrate, the polyisoprene phase is doped with osmium oxide by a vapor phase reaction to improve etch resistance, and a pattern is formed using the polyisoprene phase selectively doped with osmium oxide as a mask.

Such a method using the microphase separation of the block copolymer is simple and inexpensive as compared with the lithography technique. However, the ozonation is complicated as well as needs relatively long reaction time, so that it is difficult to improve throughput. Also, since the osmium oxide has high level of toxicity, it is scarcely used in general purpose from the viewpoint of safety.

BRIEF SUMMARY OF THE INVENTION

An object of the present invention is to provide a pattern forming material and a method for forming a pattern, which show high process throughput and capable of forming very easily a planar pattern or three-dimensional structure of the order of nanometers having considerable regularity.

A still another object of the present invention is to provide a method for manufacturing easily a magnetic recording medium, a field emission display, a field emission cathode, a separator and electrode for an electrochemical cell, a catalytic electrode for a fuel cell, a filter, etc., by making use of the aforementioned material.

A pattern forming material according to the present invention comprises a block copolymer or graft copolymer having two polymer chains whose ratio between N/(Nc−No) values of respective monomer units is 1.4 or more, where N represents total number of atoms in the monomer unit, Nc represents the number of carbon atoms in the monomer unit, No represents the number of oxygen atoms in the monomer unit.

The block copolymer or graft copolymer satisfies the conditions is typically that having a polymer chain containing aromatic rings and an acrylic polymer chain.

A pattern forming material of the present invention contains a block copolymer or graft copolymer having a polysilane chain and a carbon-based organic polymer chain.

A method for forming a pattern of the present invention comprises steps of: forming a molded product made of an above-mentioned pattern forming material; forming a structure having micro polymer phases in the molded product; and dry-etching the molded product to remove selectively a polymer phase from the structure having micro polymer phases, thereby forming a porous structure.

A method for forming a pattern of the present invention comprises steps of: forming a film made of an above-mentioned pattern forming material on a substrate; forming a structure having micro polymer phases in the film; selectively removing a polymer phase from the structure having micro polymer phases formed in the film by dry-etching; and etching the substrate using remaining another polymer phase as a mask, thereby transferring the structure having micro polymer phases to the substrate.

A method for forming a pattern of the present invention comprises steps of: forming a pattern transfer film on a substrate; forming a film made of a pattern forming material comprising a block copolymer or graft copolymer having two polymer chains whose ratio between dry etch rates is 1.3 or more on the pattern transfer film; forming a structure having micro polymer phases in the film; selectively removing a polymer phase from the structure having micro polymer phases formed in the film by dry-etching; etching the pattern transfer film using remaining another polymer phase as a mask, thereby transferring the structure having micro polymer phases to the pattern transfer film; and etching the substrate using the pattern transfer film as a mask to which the structure having micro polymer phases is transferred, thereby transferring the structure having micro polymer phases to the substrate.

Another pattern forming material of the present invention contains a block copolymer or graft copolymer having a polymer chain whose main chain is cut by irradiation with an energy beam and an indecomposable polymer chain against irradiation with an energy beam.

An electron beam is typically used as the energy beam. The polymer chain whose main chain is cut by irradiation with the energy beam is typically an acrylic chain substituted by a methyl group or halogen at α-position or a polysilane chain.

A method for forming a pattern of the present invention comprises steps of: forming a molded product made of an above-mentioned pattern forming material; forming a structure having micro polymer phases in the molded product; irradiating the molded product with an energy beam, thereby cutting a main chain of a polymer phase in the structure having micro polymer phases; and selectively removing the polymer chain whose main chain is cut by development or etching, thereby forming a porous structure consisting of remaining another polymer phase.

A method for forming a pattern of the present invention comprises steps of: forming a film made of an above-mentioned pattern forming material on a substrate; forming a structure having micro polymer phases in the film; irradiating the film with an energy beam, thereby cutting the main chain of a polymer phase in the structure having micro polymer phases; selectively removing the polymer chain whose main chain is cut from the structure having micro polymer phases by etching; and etching the substrate using remaining another polymer phase as a mask, thereby transferring the structure having micro polymer phases to the substrate.

A method for forming a pattern of the present invention comprises steps of: forming a pattern transfer film on a substrate; forming a film made of an above-mentioned pattern forming material on the pattern transfer film; forming a structure having micro polymer phases in the film; irradiating the film with an energy beam, thereby cutting the main chain of a polymer phase in the structure having micro polymer phases; selectively removing the polymer chain whose main chain is cut from the structure having micro polymer phases by etching; etching the pattern transfer film using remaining another polymer phase as a mask, thereby transferring the pattern of the structure having micro polymer phases to the pattern transfer film; and etching the substrate using the pattern transfer film to which the pattern of the structure having micro polymer phases is transferred as a mask, thereby transferring the structure having micro polymer phases to the substrate.

A still another pattern forming material of the present invention comprises a block copolymer or graft copolymer comprising: a polymer chain comprising a repeating unit represented by the following formula:

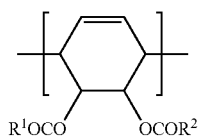

where $R^1$ and $R^2$ independently represent a substituted or unsubstituted alkyl group, aryl group aralkyl group or alkoxyl group having 1 to 20 carbon atoms, and a thermally decomposable polymer chain.

The thermally decomposable polymer chain is typically a polyethylene oxide chain and a polypropylene oxide chain.

A method for forming a pattern of the present invention comprises steps of: forming a film made of a pattern forming material comprising a block copolymer or graft copolymer having at least one thermally decomposable polymer chain on a substrate; forming a structure having micro polymer phases in the film; removing the thermally decomposable polymer phase from the structure having micro polymer phases by heating to a thermal decomposition temperature or more; etching the substrate using remaining another polymer phase as a mask, thereby transferring the pattern of the structure having micro polymer phases to the substrate.

A method for forming a pattern of the present invention comprises steps of: forming a pattern transfer film on a substrate; forming a film made of a pattern forming material comprising a block copolymer or graft copolymer having at least one thermally decomposable polymer chain on the pattern transfer film; forming a structure having micro polymer phases in the film; removing the thermally decomposable polymer phase from the structure having micro polymer phases by heating to a thermal decomposition temperature or more; etching the pattern transfer film using remaining another polymer phase as a mask, thereby transferring the pattern of the structure having micro polymer phases to the pattern transfer film; etching the substrate using the pattern transfer film as a mask, to which the pattern of the structure having micro polymer phases is transferred, thereby transferring the pattern of the structure having micro polymer phases to the substrate.

A method for forming a pattern of the present invention comprises steps of: forming a molded product made of a pattern forming material comprising a block copolymer or graft copolymer having at least one thermally decomposable polymer chain; forming a structure having micro polymer phases in the molded product; removing the thermally decomposable polymer phase by heating to a thermal decomposition temperature or more, thereby forming a porous structure consisting of remaining another polymer phase; and filling pores of the porous structure with an inorganic material.

An electrochemical cell of the present invention comprises a pair of electrodes and a separator interposed between the electrodes and impregnated with an electrolyte, wherein the separator is constituted by a porous structure formed by selectively removing a polymer phase from a block copolymer or graft copolymer having a structure having micro polymer phases.

An electrochemical cell of the present invention comprises a pair of electrodes and an electrolyte layer interposed between the electrodes, wherein at least a part of the electrodes is constituted by a porous structure formed by selectively removing a polymer phase from a block copolymer or graft copolymer having a structure having micro polymer phases. The porous structure typically made of carbon.

A hollow fiber filter of the present invention is made of a porous structure formed by selectively removing a polymer phase from a block copolymer or graft copolymer having a structure having micro polymer phases.

A method for manufacturing a porous carbon structure of the present invention comprises steps of: mixing a precursor of thermosetting resin, a surfactant, water and oil, thereby preparing a microemulsion in which colloidal particles containing the precursor of thermosetting resin are dispersed; curing the precursor of thermosetting resin unevenly distributed in the colloidal particles; removing the surfactant, water and oil from the colloidal particles, thereby providing porous structures of cured thermosetting resin; firing to carbonize the porous structures.

A still another method for forming a pattern of the present invention comprises steps of: applying a blend of a polymer including a metal particle and a block copolymer or graft copolymer to a substrate to form a film; forming a structure having micro polymer phases in the film and segregating the metal particles covered with the polymer in a central portion of a polymer phase or at an interface between the polymer phases in the block copolymer or the graft copolymer; selectively or entirely removing the polymer phases by etching in which the metal particles are segregated, thereby leaving the metal particles.

The method is suitably applicable to magnetic recording medium by depositing a magnetic material on the remaining metal particles. Also, the method is suitable applicable to manufacture of a field emission by depositing a conductor or semiconductor on the remained metal particles to form emitters.

A method for manufacturing a capacitor of the present invention comprises steps of: forming a film made of a blend of a polymer including a metal particle and a block copolymer or graft copolymer; allowing the film to form a lamella structure having micro polymer phases and segregating the metal particles covered with the polymer in a central portion of each polymer phase in the lamella structure; and aggregating the metal particles to form a metal layer in the central portion of each polymer phase in the lamella structure.

A method for manufacturing a catalytic layer of a fuel cell of the present invention comprises steps of: forming a film made of a blend of a block copolymer or graft copolymer including a metal particle and a block copolymer or graft copolymer; forming a structure having micro polymer phases in the film and segregating the metal particles covered with the polymer at an interface between the polymer phases forming the structure having micro polymer phases; and selectively removing a polymer phase in the structure having micro polymer phases, thereby leaving the metal particles on a surface of remaining another polymer phase.

BRIEF DESCRIPTION OF THE SEVERAL VIEWS OF THE DRAWING

FIG. 4A is a cross-sectional view showing a method of manufacturing a magnetic recording medium of the present invention;

FIG. 4B is a cross-sectional view showing a method of manufacturing a magnetic recording medium of the present invention;

FIG. 4C is a cross-sectional view showing a method of manufacturing a magnetic recording medium of the present invention;

DETAILED DESCRIPTION OF THE INVENTION

Figure 1A:
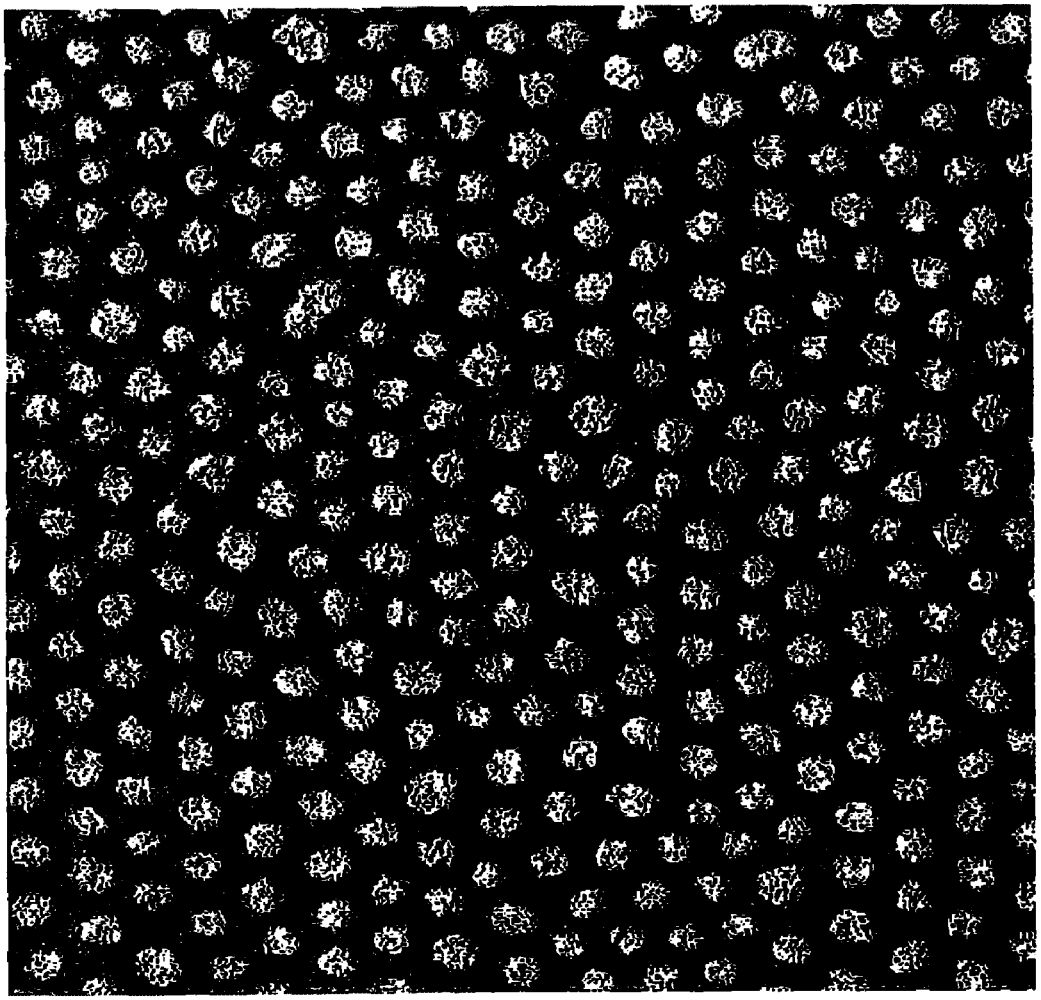
FIGS. 1A and 1B are atomic force micrographs (AFM) showing examples of structures having micro polymer phases of the block copolymers according to the present invention.

Hereinafter, the present invention will be described in more detail.

The principle of the present invention is that a film or a bulk-molded product of a block copolymer or graft copolymer is formed, which copolymer is allowed microphase-separation, and then a polymer phase is selectively removed, thereby forming a porous film or porous structure having a pattern of the order of nanometers. The resultant porous film can be used for a mask for etching an underlayer to transfer the pattern. Also, the porous structure can be used as it is for various applications as well as can be used for a template for forming another porous structure. In the present invention, a difference in dry etch rates, decomposition properties against an energy beam or thermal decomposition properties between two polymer phases is used in order to remove selectively a polymer phase from a structure having micro polymer phases. Since it is not necessary to use a lithography technique, high throughput and reduced cost can be obtained.

First, the block copolymer and graft copolymer will be described. The block copolymer means a linear copolymer in which homopolymer chains are bonded together in a form of blocks. A typical example of the block copolymer is an A-B type block copolymer in which an A polymer chain having a repeating unit A and a B polymer chain having a repeating unit B are connected each other and having a structure of: -(AA--AA)-(BB--BB)-. It is possible to employ a block copolymer in which three of more kinds of polymer chains are bonded together. In the case of a triblock copolymer, any of A-B-A type, B-A-B type and A-B-C type can be employed. A star type block copolymer in which one or more kinds of polymer chains extend radialy from a central portion can be employed. A block copolymer of (A-B)n type or (A-B-A)n type having four or more blocks can be employed. The graft copolymer has a structure comprising a polymer main chain and another pendent polymer chains as side chains. In the graft copolymer, plural kinds of polymers may be pendant as side chains. Also, a combination of a block copolymer and a graft copolymer comprising a block copolymer, such as A-B type, A-B-A type and B-A-B type, and pendent polymer chains C can be employed.

The block copolymer is preferable compared to the graft copolymer because a polymer having a narrow molecular weight distribution can be easily obtained and its composition ratio is also easily controlled. Note that, in the following description, the block copolymer will be mainly described, though the description concerning the block copolymer is applicable as it is to the graft copolymer.

The block copolymer and graft copolymer can be synthesized by various polymerization methods. The most preferable method is a living polymerization method. In the living anion polymerization or living cation polymerization methods, the polymerization of a monomer is initiated with a polymerization initiator capable of generating an anion or an cation, and then another monomer is successively added thereto, thus a block copolymer can be synthesized. A monomer having a double bond such as vinyl compound or butadiene, a cyclic ether monomer such as ethylene oxide, or a cyclic oligosiloxane monomer can be used as a monomer. It is also possible to use a living radical polymerization method. According to the living polymerization method, the molecular weight and copolymer ratio can be precisely controlled, thus making it possible to synthesize a block copolymer having a narrow molecular weight distribution. In the case where the living polymerization is employed, it is preferable to dry sufficiently a solvent with a desiccant such as metal sodium and to prevent oxygen from mixing thereto using a method of freeze drying or bubbling of an inert gas. The polymerization reaction is preferably carried out under flow of an inert gas and under a pressurized condition of preferably two atm or more. The pressurized condition is preferred because contamination of water and oxygen from outside the reaction vessel can be prevented effectively as well as reaction process can be performed in relatively low cost.

A block copolymer and graft copolymer can also be synthesized by a reaction between macromers such as telechelic polymers or by polymerizing a different type of monomer from a macromer terminal as a polymerization initiation point. By making use of a reactive processing method, a block copolymer and graft copolymer can also be synthesized in situ by advancing the above reaction in the process of forming a structure having micro polymer phases. For example, an A polymer, in which reactive terminal groups or side chain groups are introduced, and a B monomer are mixed, and then the monomer is polymerized by a method such as heating, light irradiation and addition of a catalyst in the process of forming a structure having micro polymer phases, thus a block or graft copolymer comprising a polymer A and polymer B can be synthesized. In addition, a block or graft copolymer can be synthesized in situ even by a method in which two or more kinds of telechelic polymers each having a complementary bonding group at the ends or side chains are blended.

It is preferable for a chemical bond linking the polymer chains with each other to be a covalent bond from a viewpoint of bond strength, and particularly preferable to be a carbon-carbon bond or a carbon-silicon bond.

Since special equipment and skill are required in the synthesis methods of a block copolymer or a graft copolymer as compared with the general radical polymerization, these methods have been mainly adopted in a research laboratory level, and therefore, the industrial applications thereof have been very limited in view of cost. However, in the technical fields such as an electronic industry where highly value-added products are manufactured, a sufficient cost effectiveness can be obtained even if a block copolymer or a graft copolymer is employed.

The block copolymer and graft copolymer, unlike a random copolymer, can form a structure, i.e., a structure having micro polymer phases, in which an A phase consisting of aggregated A polymer chains are spatially separated from a B phase consisting of aggregated B polymer chains. In a phase separation given by a general polymer, i.e., a macrophase separation, since two polymer chains can be completely separated to each other, thus ultimately two phases are completely separated. Also, the scale of fluctuation generation is 1 μm or so, the size of a unit cell is 1 μm or more. On the contrary, the size of a unit cell in the microphase separation given by a block copolymer of graft copolymer is not made larger than the size of a molecular chain, which is in the order of several nanometers or several tens nanometers. In addition, the structure having micro polymer phases exhibits morphology in which fine unit cells are very regularly arrayed.

Figure 1B:
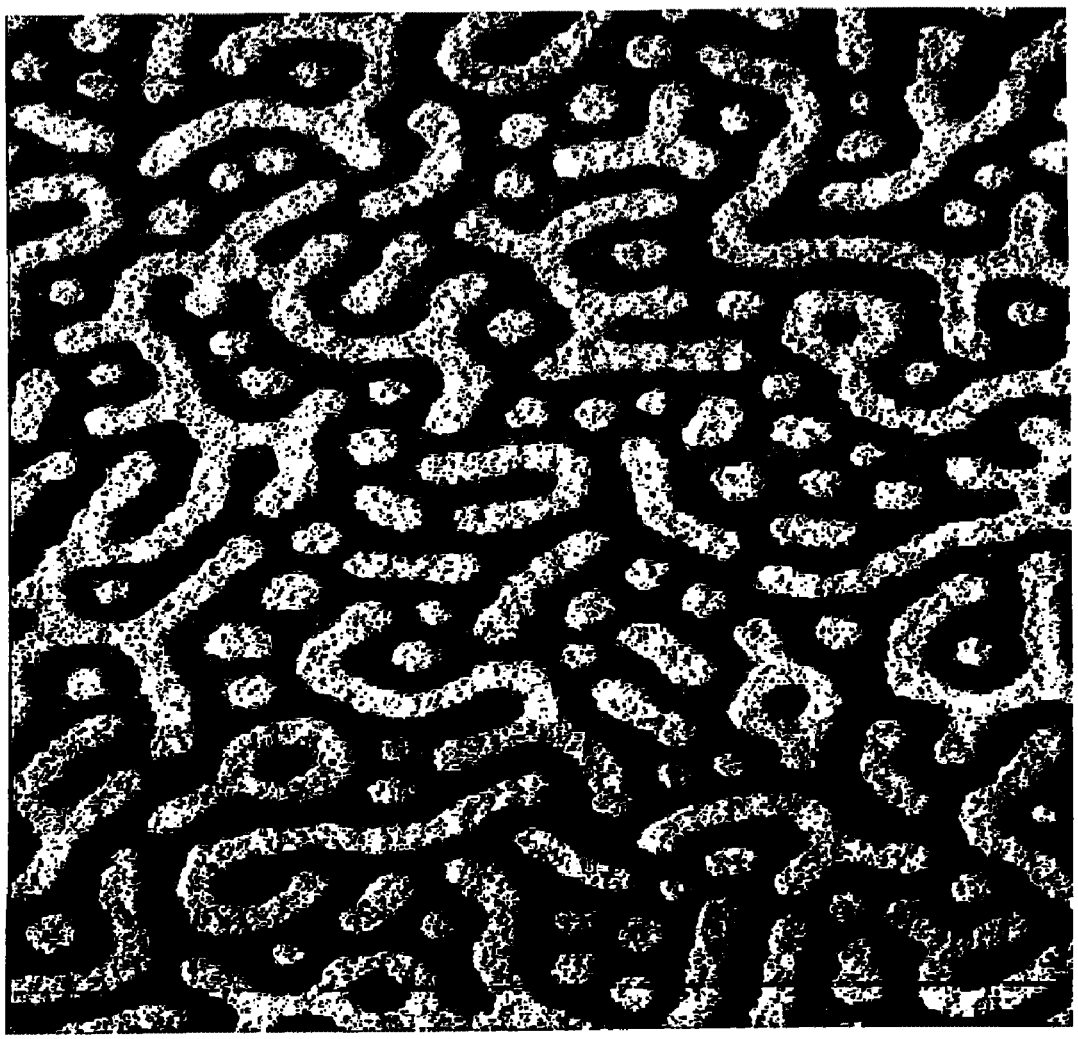
Figure 2A:
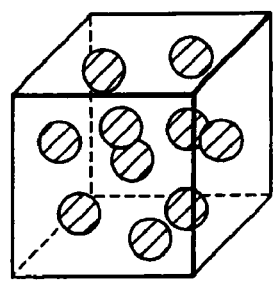
FIG. 2A is a diagrammatic view showing an example of a structure having a micropolymer phase of the block copolymer according to the present invention.
Figure 2C:
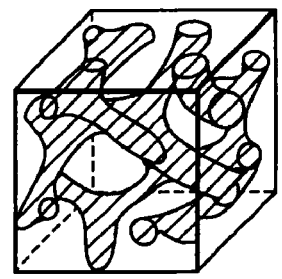
FIG. 2C is a diagrammatic view showing an example of a structure having a micropolymer phase of the block copolymer according to the present invention.
Figure 2B:
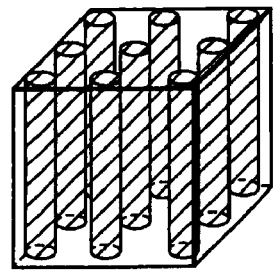
FIG. 2B is a diagrammatic view showing an example of a structure having a micropolymer phase of the block copolymer according to the present invention.
Figure 2D:
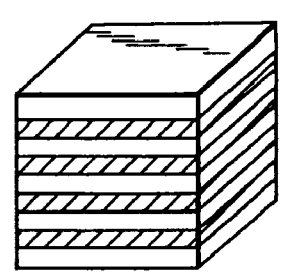
FIG. 2D is a diagrammatic view showing an example of a structure having a micropolymer phase of the block copolymer according to the present invention.

Various types of morphology of the structure having micro polymer phases will be described. FIGS. 1A and 1B are microphotographs with an atomic force microscope (AMF) of a polystyrene (PS)-polymethacrylate (PMMA) block copolymer, which show plan views of structures having micro polymer phases. FIG. 1A is referred to as a dot structure or a sea-island structure, whereas FIG. 1B is referred to as a worm-like structure. FIGS. 2A to 2D show schematic views of the structures having micro polymer phases viewed stereoscopically. FIG. 2A is referred to as a sea-island structure in which another phases are spherically distributed in one phase. FIG. 2B is referred to as a cylindrical structure in which another phases in a rod-like form are regularly distributed in one phase. FIG. 2C is referred to as a bicontinuous structure. FIG. 2D is referred to as a lamella structure in which A phases and B phases are alternately and regularly laminated.

The structure having micro polymer phases of a block copolymer or graft copolymer can be formed in the following manner. For example, a block copolymer or graft copolymer is dissolved in a suitable solvent to prepare a coating solution, which is applied to a substrate to form a film. The film is annealed at a temperature above a glass transition temperature of the polymers, thus a favorable phase-separated structure can be formed. It is also possible to use a method that a copolymer is melted and annealed at a temperature in the range between above the glass transition temperature and below the phase transition temperature to allow the copolymer to form a structure having micro polymer phases, and the structure having micro polymer phases is fixed at room temperature. A structure having micro polymer phases can also be formed by slowly casting a solution of a copolymer. A structure having micro polymer phases can also be formed by a method that a copolymer is melted and molded into a desired shape by a hot press molding, an injection molding and a transfer molding, etc., followed by annealing.

According to the Flory-Huggings theory, it is required for the phase separation between an A polymer and B polymer that the free energy ΔG of mixing must be positive. If the A polymer and B polymer are hard to be blended and the repulsive force between two polymers is intense, a phase separation easily occurs. In addition, the microphase separation easily occurs as a degree of polymerization of the block copolymer becomes large, and therefore, there is a lower limit in the molecular weight. However, polymers of respective phases forming the phase-separated structure are not necessarily incompatible with each other. As long as the precursor polymers of these polymers are incompatible with each other, the structure having micro polymer phases can be formed.

After a phase-separated structure is formed by use of the precursor polymers, the precursor polymers can be reacted by heating, light irradiation or addition of a catalyst to be converted into desired polymers. When the reaction conditions are suitably selected at that time, the phase-separated structure formed by the precursor polymers is not destroyed.

The phase separation is most liable to occur when the composition ratio of an A polymer and B polymer is 50:50. This means that a structure having micro polymer phases that is formed most easily is a lamella structure. On the contrary, there may be a case where, even by raising the content of one polymer, it is difficult to form a sea-island structure containing small islands consisting of the other polymer. Therefore, the molecular weight of the block copolymer may be an important factor in order to obtain a desired structure having micro polymer phases.

However, it is very difficult to polymerize a block copolymer with precisely controlling the molecular weight. Therefore, it may be possible to adjust the composition ratio by measuring the molecular weight of the synthesized block copolymer and blending a homopolymer so as to give a desired composition ratio. The addition amount of the homopolymer is set to 100 parts by weight or less, preferably 50 parts by weight or less, and more preferably 10 parts by weight or less to 100 parts by weight of the block copolymer.

If the addition amount of the homopolymer is excessive, there is a possibility to disrupt the structure having micro polymer phases. In addition, if the difference between the solubilities of the two polymer constituting the block copolymer is too large, there may be occur a phase separation between the A-B block copolymer and the A homopolymer. In order to avoid the particular phase separation as much as possible, it is preferable to lower the molecular weight of the A homopolymer. This is because the A homopolymer having a low molecular weight increases the negative value of the enthoropy term in the Flory-Huggins equation, making it easy for the A-B block copolymer and the A homopolymer to be blended together. In addition, the fact that the molecular weight of the A homopolymer is lower than molecular weight of the A block in the block copolymer leads to thermodynamic stability. Taking the thermodynamic stability into consideration, it is preferable that the molecular weight of the A homopolymer is lower than two thirds of the molecular weight of the A block constituting the block copolymer. On the other hand, if the molecular weight of the A homopolymer is lowered to less than 1,000, it may possibly be blended to the B block in the block copolymer, which is not preferable. In addition, taking the glass transition temperature into consideration, the molecular weight of the A homopolymer is more preferably 3,000 or more.

When a thin film consisting of the pattern forming material of the present invention is formed, it is preferable to apply a homogeneous solution. When the homogeneous solution is used, it is possible to prevent hysteresis during film formation from being remained. If the coating solution is inhomogeneous as the case where micelles having a relatively large particle size are produced in the solution, it is made difficult to form a regular pattern due to mixing of an irregular phase-separated structure or it takes a long time to form a regular pattern, which is not preferable.

The solvent for dissolving the block copolymer should desirably be a good solvent to two kinds of polymers constituting the block copolymer. The repulsive force between polymer chains is proportional to a square of the difference in solubility parameter between two kinds of polymer chains. Consequently, when the good solvent to the two polymers is employed, it makes the difference in solubility parameter between two kinds of polymer chains smaller and makes free energy of the system smaller, which leads to an advantageous condition for a phase separation.

When a thin film of a block copolymer is intended to form, it is preferable to employ a solvent having a high boiling point of 150° C. or more so as to make it possible to prepare a homogeneous solution. When a bulk-molded product of a block copolymer is intended to form, it is preferable to employ a solvent having a low boiling point such as THF, toluene and methylene chloride.

Examples of pattern forming materials used in the present invention will be described hereinafter. First, a pattern forming material consisting of a block copolymer or graft copolymer comprising two or more polymer chains whose difference in dry etch rates is large will be described. The pattern forming material of the present invention comprises a block copolymer or graft copolymer comprising at least two polymer chains whose ratio between N/(Nc−No) values of respective monomer units is 1.4 or more, where N represents total number of atoms in the monomer unit, Nc represents the number of carbon atoms in the monomer unit, No represents the number of oxygen atoms in the monomer unit, and a block copolymer and a graft copolymer comprising a polysilane chain and a carbon-based organic polymer chain. The condition that the ratio between N/(Nc−No) values is 1.4 or more with respect to two polymer chains means the fact that the etching selectivity of each polymer chain constituting the structure having micro polymer phases is large. Namely, when the pattern forming material that meets the above condition is allowed to form a structure having micro polymer phases and then is subjected to dry etching, a polymer phase is selectively etched and the other polymer phase is left remained.

The parameter of N/(Nc−No) will be described in detail below. In this parameter, N is a total number of atoms per segment (which corresponds to monomer unit) of a polymer; Nc is the number of carbon atom; and No is the number of oxygen atom. The parameter is an index indicating the dry etch resistance of a polymer, in that the etch rate by dry etching is made higher (or the dry etch resistance is lowered) as the value of the parameter becomes larger. In other words, there is a following relationship between the etch rate $V_{etch}$ and the aforementioned parameter.

$$V_{etch} \propto N/(Nc-No)$$

This tendency is scarcely dependent on the types of etching gas such as Ar, $O_2$, $CF_4$, $H_2$, etc. (J. Electrochem. Soc., 130, 143 (1983)). As for the etching gas, in addition to Ar, $O_2$, $CF_4$ and $H_2$ that are described in the above publication, it is also possible to employ $C_2F_6$, $CHF_3$, $CH_2F_2$, $CF_3Br$, $N_2$, $NF_3$, $Cl_2$, $CCl_4$, HBr, $SF_6$, etc. Note that, the parameter has nothing to do with the etching of an inorganic material such as silicon, glass and metal.

The specific value of the parameter can be calculated by referring to the following chemical formula. Since the monomer unit of polystyrene (PS) is $C_8H_8$, the parameter is expressed as 16/(8−0)=2. Since the monomer unit of polyisoprene (PI) is $C_5H_8$, the parameter is expressed as 13/(5−0)=2.6. Since the monomer unit of polymethacrylate (PMMA) is $C_5O_2H_8$, the parameter is expressed as 15/(5−2)=5. Therefore, in the block copolymer of PS-PMMA, it is expected that the etch resistance of PS is higher, and only PMMA is likely etched. For example, it has been confirmed that, when the block copolymer is subjected to a reactive ion etching (RIE) with flowing $CF_4$ in a flow rate of 30 sccm and setting the pressure to 0.01 Torr under the conditions of 150 W in progressive wave and 30 W in reflective wave, PMMA is etched at an etch rate that is 4±0.3 times faster than PS.

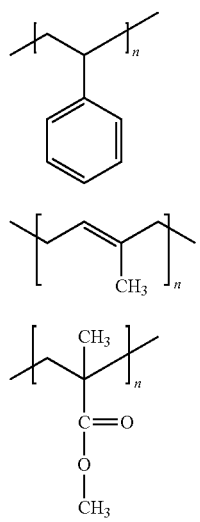

Figure 3:
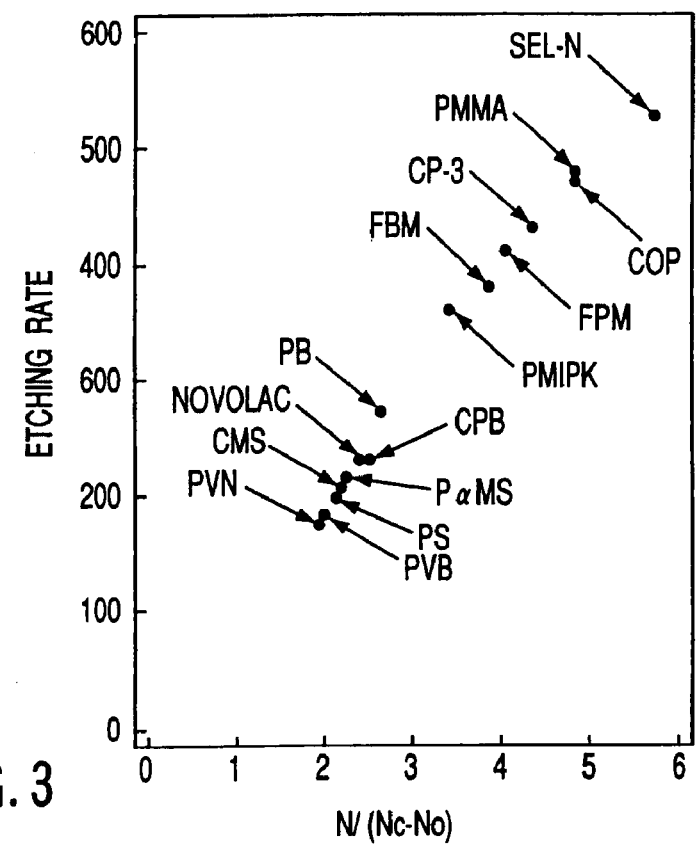
FIG. 3 is a graph showing the relationship between N/(Nc−No) value and dry etch rate of various polymers.

FIG. 3 shows a relationship between the N/(Nc−No) value of each polymer and the etch rate thereof. The abbreviations employed in FIG. 3 respectively represent the following polymers. SEL-N=(trade name, Somer Kogyo Co., Ltd.), PMMA=polymethyl methacrylate, COP=glycidyl methacrylate-methyl acrylate copolymer, CP-3=methacrylate-t-butyl methacrylate copolymer, PB=polybenzyl methacrylate, FBM=polyhexafluorobutyl methacrylate, FPM=polyfluoropropyl methacrylate, PMIPK=polymethyl isopropenyl ketone, PS=polystyrene, CMS=chloromethlated styrene, PαMS=poly(α-methylstyrene), PVN=polyvinylnaphthalene, PVB=polyvinylbiphenyl, and CPB=cyclized polybutadiene. As shown in the figure, it is found that the relationship of $V_{etch} \propto N/(Nc-No)$ is effected.

In a polymer including an aromatic ring and having many double bonds, the value of the above parameter becomes smaller in general because the ratio of carbon is relatively increased. As seen from the afore-mentioned parameter, the larger the number of carbon atom in the polymer (the smaller the value of the parameter), the higher the dry etch resistance, and the larger the number of oxygen atom in the polymer (the larger the value of the parameter), the lower the dry etch resistance. This can be described qualitatively as follows. Namely, carbon is less reactive to radicals, and hence is chemically stable. Therefore, a polymer containing a large number of carbon atoms is hardly reactive to various kinds of radicals, which leads to improve etch resistance. Whereas oxygen is highly reactive to radicals, so that a polymer having a large number of oxygen atoms is etched at a high etch rate, and thus has low etch resistance. Additionally, when oxygen is included in a polymer, oxygen radicals may be easily generated. Therefore, when a fluorine-based etching gas such as $CF_4$ is employed, F radicals are multiplied due the effect of oxygen radicals and the radicals taking part in the etching are increased, leading to increase the etch rate. An acrylic polymer has high oxygen content and a small number of double bonds, which brings about increase in the value of the above parameter, so that it can be easily etched.

Therefore, typical block copolymers having a large difference in dry etch rates comprise an aromatic ring-containing polymer chain and an acrylic polymer chain. An example of the aromatic ring-containing polymer chain includes a polymer chain synthesized by polymerizing at least one monomer selected from the group consisting of vinyl naphthalene, styrene and derivatives thereof. An example of the acrylic polymer chain includes a polymer chain synthesized by polymerizing at least one monomer selected from the group consisting of acrylic acid, methacrylic acid, crotonic acid and derivatives thereof.

As mentioned above, when the ratio of the N/(Nc−No) parameter between the A polymer chain and the B polymer chain constituting the pattern forming material is 1.4 or more, it is possible to obtain a clear pattern etching. When this ratio is 1.5 or more, preferably 2 or more, it is possible to ensure a large difference in etch rates between two kinds of polymer chain, thereby making it possible to enhance the stability in the processing. It is preferable in the actual dry etching that the etching selectivity between two kinds of polymer chains be 1,3 or more, more preferably 2 or more, still more preferably 3 or more. When the ratio of the N/(Nc−No) parameter between the A polymer chain and the B polymer chain constituting the pattern forming material is 1.4 or more, it is possible to obtain a satisfactory pattern by means of etching without employing a polymer chain to which a metal element is doped or a metal element is introduced. Since patterning can be performed without employing a metal element, the material is very useful for manufacturing various electronic devices in which metal impurities bring about problems.

In order to enhance the etching selectivity in the case where $O_2$ gas is employed as an etching gas, it is especially preferable to use a silicon-containing polymer chain as a polymer chain having higher etch resistance and a halogen-containing polymer chain as a polymer chain having lower etch resistance. As the silicon-containing polymer chain, a silicon-containing aromatic polymer chain such as poly(p-trimethylsilyl styrene) is preferred. As the halogen-containing polymer chain, a halogen-containing acrylic polymer chain such as poly(chloroethyl methacrylate) is preferred.

Another pattern forming material consisting of a block copolymer or graft copolymer comprising two or more kinds of polymer chains having large difference in etch rates will be described. A pattern forming material of the present invention comprises a block copolymer or graft copolymer comprising a polysilane chain and a carbon-based organic polymer chain.

The block copolymer having a polysilane chain can be synthesized by copolymerization between a polystyrene-based macromer and dichlorosilane as disclosed by S. Demoustier-Champagne et al (Journal of Polymer Science: Part A: Polymer Chemistry, Vol. 31, 2009-2014 (1993)), or by living polymerization between polysilane using masked disilene and methacrylates as disclosed by Sakurai et al (Japan Chemical Society, 76th Spring Meeting, Preprint I, Lecture No. 4B513). Since polysilane is a silicon-based polymer, which can be dry-etched easier than a general carbon-based polymer.

The polysilane chain employed in the pattern forming material of the present invention comprises any one of the repeating units represented by the following chemical formulas at least partly.

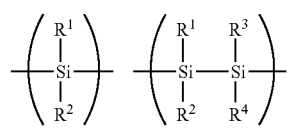

where $R^1$, $R^2$, $R^3$ and $R^4$ respectively represent a substituted or unsubstituted alkyl, aryl or aralkyl group having 1 to 20 carbon atoms.

The polysilane may be a homopolymer or a random copolymer, or may be a block copolymer having a structure in which two kinds of polysilane are linked together via an oxygen atom, a nitrogen atom, an aliphatic group or an aromatic group. Examples of the polysilane include poly(methylphenylsilane), poly(diphenylsilane), poly(methylchloromethylphenyl-silane), poly(dihexylsilane), poly(propylmethylsilane), poly(dibutylsilane), and a random and block copolymer thereof.

Next, a pattern forming material utilizing difference in decomposition properties by an energy beam between two or more polymer chains constituting a block-copolymer or graft copolymer will be described. The pattern forming material of the present invention comprises a block copolymer or graft copolymer comprising a polymer chain whose main chain is cut by irradiation with an energy beam and an indecomposable polymer chain against irradiation with an energy beam. The polymer chain whose main chain has been cut by irradiation with the energy beam can be removed by means of wet etching such as rinsing with a solvent or by evaporation by heat treatment. Thus, a fine pattern or a structure retaining a structure having micro polymer phases can be formed without a dry etching process. There are some cases depending on the types of electronic materials where a dry etching process is not applicable or a wet etching process is more preferable in view of manufacturing cost even if a dry etching process is applicable. Therefore, it is very advantageous not to use a dry etching process.

Since a block copolymer has two or more kinds of polymers linked through a chemical bond, the block copolymer is generally hard to be developed even if one polymer chain represents high solubility to a developer. However, when a block copolymer of polystyrene (PS) and polymethyl methacrylate (PMMA), for example, is irradiated with an electron beam, the main chain of PMMA is cut, so that only the PMMA phase can be dissolved in the developer. The developer is not particularly restricted as long as it can selectively dissolve out to remove the decomposed polymer chain, and therefore it may be a water-based solvent or an organic solvent. In the case of PMMA, methyl isobutyl ketone (MIBK), ethyl lactate, acetone, etc., can be employed. In order to adjust the solubility of the polymer, other solvent such as isopropyl alcohol (IPA) may be added to the developer as well as a surfactant may be added. Ultrasonic cleaning may be performed during development. Since the polymer chain after decomposition is lowered in molecular weight and can be evaporated by heat treatment, it can be easily removed.

At least one polymer constituting a block copolymer or graft copolymer is cut in the main chain by irradiation with an energy beam such as an electron beam, an X-ray, a γ-ray and a heavy particle beam. An electron beam, an X-ray and a γ-ray are preferred since they can penetrate deep into the molded product of the polymer and advantageous in view of reducing processing cost because of relatively low cost in irradiation equipment. In particular, the electron beam and X-ray are more preferable, and further the electron beam is most preferable because it brings about high efficiency for decomposition of the polymer chain by its irradiation. As an electron beam source, various types of electron beam accelerators such as Cockcroft-Walton type, Van de Graaff type, resonance transformer type, insulated-core transformer type, or linear type, dynamitron type and radio frequency type can be employed.

The polymer chains decomposed by an energy beam include those having a methyl group at α-position such as polypropylene, polyisobutylene, poly(α-methylstyrene), polymethacrylic acid, polymethyl methacrylate, polymethacrylamide and polymethyl isopropenyl ketone. Also, a polymer chain whose α-position is substituted by a halogen atom exhibits higher decomposition property in main chain. Further, methacrylate polymers whose ester group is substituted by a fluorinated carbon or halogenated carbon such as polytrifluoromethyl methacrylate, polytrifluoromethyl-α-acrylate, polytrifluoroethyl methacrylate, polytrifluoroethyl-α-acrylate and polytrichloroethyl-α-acrylate are more preferable because they exhibit high sensitivity to the energy beam. In the case where the energy beam is an X-ray, it is preferable that the polymer contains a metal element because it brings about improvement in decomposition efficiency.

The main chain of another at least one polymer chain constituting the block copolymer is indecomposable against irradiation with an energy beam. A polymer capable of cross-linking by irradiation with the energy beam is more preferred. As the polymer chain indecomposable against irradiation with the energy beam, those having a hydrogen atom at the α-position of the polymer chain such as polyethylene, polystyrene, polyacrylic acid, polymethyl acrylate, polyacrylamide and polymethyl vinyl ketone are preferred. In addition, a polymer chain having a double bond such as 1,2-butadiene, which can be cross-linked by the energy beam, may be employed. Further, derivatives of polynorbornene, polycyclohexane, etc., may be employed.

The electron beam is particularly useful among energy beams for exposure of not only a thin film but also a bulk-molded product. Since an electron beam exhibits high penetration efficiency to an organic material, in the case, for example, where one of two phases is methacrylic polymer whose main chain is decomposed by the electron beam, the polymer located inside the bulk is also decomposed. Therefore, when a three-dimensional phase-separated structure is formed by use of a block copolymer or a graft copolymer, followed by irradiation with the electron beam and development, regularly arrayed pores of the order of nanometers can be easily formed with retaining the three-dimensional structure. Since such a structure that the regularly arrayed pores are formed has a very large specific surface area, it can be used for a separator of a polymer battery or a capacitor and for a hollow fiber.

When a blend polymer of polystyrene (PS) and polymethyl methacrylate (PMMA) is irradiated with an ultraviolet ray, the side chain methyl groups of PMMA are eliminated and carboxylic acids are formed, bringing about change in polarity, so that only one of the phases can be removed by utilizing difference in polarity. However, even when an ArF excimer laser (193 nm) is employed as a light source and exposure is performed at an exposure dose of 1 J/cm$^2$, not more than about 1% of the side chain methyl groups are eliminated. When a KrF excimer laser (248 nm), which has relatively weak energy, is employed as a light source, it is necessary to perform exposure at an exposure dose of about 3.4 J/cm$^2$. Further, when an i-line (365 nm) or g-line (436 nm) of mercury bright lines is employed, almost no side chain methyl group is eliminated. It is sufficient to set the exposure dose to about 10 mJ/cm$^2$ for exposure to a resist for an ordinary semiconductor, when the ArF or KrF excimer laser is employed. Taking these facts into consideration, it will be recognized that the aforementioned exposure dose of the ultraviolet ray is very high, which brings about a significant burden to the apparatus.

In order to eliminate one polymer phase from the copolymer in which two or more kinds of polymer chains are chemically bonded, it is preferable to cut the main chain of the polymer phase. However, high energy is required for the ultraviolet ray to cut the polymer main chain, which fact brings a tendency to cause damage to the indecomposable polymer chain. Therefore, it is very difficult to eliminate one of the phases in the copolymer by irradiation with the ultraviolet ray. In addition, since the ultraviolet ray is poor in penetration efficiency to the polymer, it is not suitable for the purpose of making a bulk-molded product porous. In particular, a block copolymer containing a structure capable of absorbing the ultraviolet ray such as an aromatic ring impairs the penetration efficiency. Further, since a polymer chain decomposed by the ultraviolet ray in high sensitivity is hard to be polymerized by living polymerization, it is difficult to control the molecular weight distribution or the molecular weight.

On the contrary, as described above, an electron beam, an X-ray or a γ-ray is very effective because of high penetration efficiency to a molded-product and high selectivity in decomposition reaction as well as high decomposition efficiency and low cost. In particular, the electron beam is most preferable because its irradiation can be performed conveniently and in low cost.

Although the exposure dose of the electron beam is not particular restricted, it is preferable to set the exposure dose to 100 Gy-10 MGy, more preferably to 1 kGy-1 MGy, and particularly preferably to 10 kGy-200 kGy. If the exposure dose is too small, the decomposable polymer chain cannot be sufficiently decomposed. If the exposure dose becomes excessive, there is a possibility that the decomposed products of the decomposable polymer chain may be three-dimensionally cross-linked to form a cured product as well as the indecomposable polymer chain may be decomposed.

Although the accelerating voltage for the electron beam differs depending on the thickness of the polymer molded product, it is preferable to set the accelerating voltage to about 20 kV-2 MV for a thin film having a thickness of 10 nm to several tens micrometers, and to about 500 kV-10 MV for a film having a thickness of 100 μm or more and a bulk-molded product. The accelerating voltage may be raised if a metallic molded product is included in the polymer molded product and the electron beam is shielded. Electron beams different in accelerating voltage may be applied. Further, the accelerating voltage may be varied during irradiation with the electron beam.

Next, a pattern forming material consisting of a block copolymer or graft copolymer comprising a thermally decomposable polymer chain will be described. As for such a block copolymer or graft copolymer, it is preferable to employ a copolymer synthesized from a thermally decomposable polymer chain and a heat resistant polymer chain. The difference in thermal decomposition temperature between the thermally decomposable polymer chain and the heat resistant polymer chain is 10° C. or more, preferably 50° C. or more, more preferably 100° C. or more. Here, the thermal decomposition temperature represents a temperature where the weight of the polymer degreases by a half when the polymer is heated at 1 atm under an inert gas flow for 30 minutes.

It is preferable for the thermally decomposable polymer chain whose main chain is decomposed by heating. On the other hand, it is preferable for the heat resistant polymer chain to have a glass transition temperature above the thermal decomposition temperature of the thermally decomposable polymer chain or to be constituted by a polymer that causes a cross-linking reaction or intramolecular cyclization reaction at a temperature below the thermal decomposition temperature of the thermally decomposable polymer chain and converts into a heat-resistant structure such as a three-dimensional cross-linked structure or ladder structure.

Examples of the thermally decomposable polymer chain are a polyether such as polyethylene oxide and polypropylene oxide, poly(α-methylstyrene), an acrylic resin such as polyacrylate and polymethacrylate, and polyphthalaldehyde. Polyethylene oxide, polypropylene oxide, poly(α-methylstyrene) and an acrylic resin are particularly preferable because they can be obtained by living polymerization as a polymer chain having a narrow molecular weight distribution.

Examples of a carbon-based polymer chain among the heat resistant polymer chain include polyacrylonitrile, a polyacrylonitrile derivative such as α-halogenated polyacrylonitrile, polyamic acid, polyimide, a polyaniline derivative, a polyparaphenylene derivative, a polycyclohexadiene derivative, polybutadiene, and polyisoprene. It is preferable that the polymer chain is allowed to form a structure having micro polymer phases and then is made infusible by heating in air. Polyvinylidene chloride can also be employed as the heat resistant polymer chain because it can be made infusible by an appropriate method. In order to enhance to make the polymer infusible, a radical generator or a cross-linking agent may be added.

Among the heat resistant polymer chains, polyacrylonitrile and a polycyclohexadiene derivative are preferred because they can be formed into a block copolymer having a narrow molecular weight distribution by anion polymerization or radical polymerization.

A block copolymer having a polyacrylonitrile chain can be synthesized by a method of, for example, T. Suzuki et al (Polymer Journal, Vol. 14, No. 6, 431-438 (1982)). In this method, a block copolymer is synthesized by polymerizing acrylonitrile using a polyether, such as polyethylene oxide whose terminal hydroxyl groups are anionized, as a reaction initiator. A graft copolymer having a polyacrylonitrile chain can be synthesized by radical copolymerization between a macromer such as polyethylene oxide or polypropylene oxide having a methacrylate structure or a styrene structure at ends and acrylonitrile. When the polyacrylonitrile chain is subjected to heat treatment at a temperature of 200° C. or more, preferably 400° C. or more, a pyridine type ladder-like conductive polymer can be produced.

A block copolymer having a polycyclohexadiene derivative chain can be synthesized by living polymerization using a cyclohexadiene derivative monomer and another monomer forming a thermally decomposable polymer chain. Further, the polycyclohexadiene derivative is converted into polyparaphenylene by heating. The cyclohexadiene derivative monomer and the polycyclohexadiene derivative are represented by the following chemical formulas.

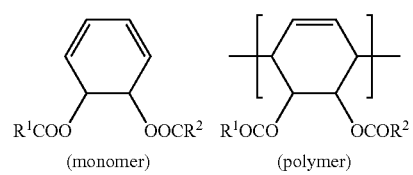

where $R^1$ and $R^2$ independently represent a substituted or unsubstituted alkyl group, aryl group, aralkyl group or alkoxyl group having 1 to 20 carbon atoms. Examples of $R^1$ and $R^2$ include a methyl group, ethyl group, isopropyl group, t-butyl group, phenyl group, methoxymethyl group and methoxyl group.

As a polycyclohexadiene derivative, a polymer having a cyclic carbonate structure such as that represented by the following chemical formula is also suitable.

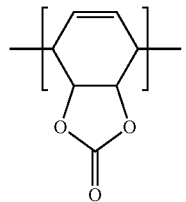

The polycyclohexadiene derivative linked at the 1- and 4-positions, as shown in the above chemical formula, is most preferable because cross-linking occurs easily between neighboring polymer chains. However, a polycyclohexadiene derivative having a structure that linked at the 1- and 2-positions or a structure in which a portion that linked at the 1- and 2-positions and a portion that linked at the 1- and 2-positions coexist can be employed. A combination of the heat resistant polymer consisting of the polycyclohexadiene derivative polymer chain and the thermally decomposable polymer chain selected from polyethylene oxide chain and polypropylene oxide chain is preferred.

A polymer chain having sites at the side chain or the main chain that is cross-linked to form a heat resistant molecular structure can be employed as a heat resistant polymer chain. For example, a polymer having a perylene skeleton in the side chains or the main chain can be suitable used. Also, a polymer chain having a siloxane cluster such as POSS (Polyhedral Oligomeric Silsesquioxane: polysiloxane $T_8$-cube) in the side chains or the main chain can be used. For example, a polymer chain synthesized from the polysiloxane $T_8$ cube represented by the following chemical formula is preferred.

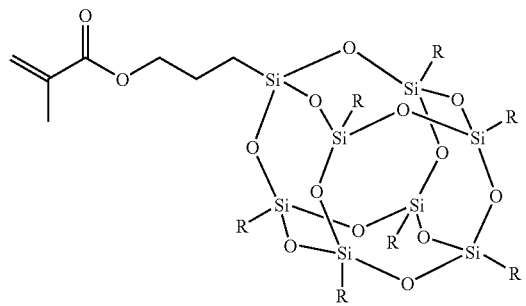

where R represents H or a substituted or unsubstituted alkyl group, aryl group or aralkyl group. Specific examples of R include a methyl group, an ethyl group, a butyl group, an isopropyl group and a phenyl group.

As a heat resistant polymer chain, polybutadiene or polyisoprene synthesized by polymerizing a monomer having conjugated double bonds, followed by being three-dimensionally cross-linked at the side chain or main chain with each other, may be used. 1,2-Polybutadien is most preferably used as an afore-mentioned cross-linkable polymer. A copolymer comprising a polybutadiene chain may contain a little amount of 1,4-polybutadiene units besides the 1,2-polybutadien units. However, since the 1,4-polybutadiene unit is poor in cross-linking capability, the content of the unit is preferably 10% or less, more preferably 5% or less based on the total monomer units in the polybutadiene chain.

A block copolymer or graft copolymer having a polybutadiene chain or polyisoprene chain as a cross-linkable polymer chain and a polyethylene oxide chain or polypropylene oxide chain as a thermally decomposable polymer chain is preferred.

These cross-linkable polymer chains are three-dimensionally cross-linked with each other by adding a radical generator or cross-linking agent. The cross-linkable polymer chain such as polybutadiene is hydrophobic and the polyethylene oxide chain is hydrophilic. Therefore, a radical generator or cross-linking agent having relatively high hydrophobicity is preferred because it has a high affinity to the phase of the cross-linkable polymer chain.

Typical radical generator is organic peroxide. Examples of the organic peroxide include ketone peroxide such as methyl ethyl ketone peroxide, cyclohexanon peroxide, methyl cyclohexanon peroxide, methyl acetoacetate peroxide, and acetoacetate peroxide; peroxyketal such as 1,1-bis(t-hexylperoxy)-3,3,5-trimethylcyclohexane, 1,1-bis(t-hexylperoxy)cyclohexane, 1,1-bis(t-butylperoxy)-3,3,5-trimethylcyclohexane, di-t-butylperoxy-2-methylcyclohexane, 1,1-bis(t-butylperoxy)cyclohexane, 1,1-bis(t-butylperoxy)cyclododecane, 2,2-bis(t-butylperoxy)butane, n-butyl-4,4-bis(t-butylperoxy) valerate, and 2,2-bis(4,4-di-t-butylperoxycyclohexyl) propane; hydroperxoide such as p-menthane hydroperxoide, diisopropylbenzene hydroperxoide, 1,1,3,3-tetramethylbutyl hydroperxoide, cumene hydroperxoide, t-hexyl hydroperxoide, and t-butyl hydroperxoide; dialkyl peroxide such as α,α'-bis(t-butylperoxy)diisopropylbenzene, dicumyl peroxide, 2,5-dimethyl-2,5-bis(t-butylperoxy)hexane, t-butyl cumyl peroxide, di-t-butyl peroxide, and 2,5-dimethyl-2,5-bis(t-butylperoxy)hexyne; diacyl peroxide such as isobutyryl peroxide, 3,5,5-trimethylhexanoyl peroxide, octanoyl peroxide, lauroyl peroxide, stearoyl peroxide, succinic acid peroxide, m-toluoyl and benzoyl peroxide, and benzoyl peroxide; peroxycarbonate such as di-n-propyl peroxydicarbonate, diisopropyl peroxydicarbonate, bis(4-t-butylcyclohexyl) peroxydicarbonate, di-2-ethoxyethyl peroxydicarbonate, di-2-ethyhexyl peroxydicarbonate, di-3-methoxybutyl peroxydicarbonate, and di(3-methyl-3-methoxybutyl) peroxydicarbonate; peroxy ester such as α,α'-bis(neodecanoylperoxy)diisopropylbenzene, cumyl peroxyneodecanoate, 1,1,3,3-tetramethylbutyl peroxyneodecanoate, 1-cyclohexyl-1-methylethyl peroxyneodecanoate, t-hexyl peroxyneodecanoate, t-butyl peroxyneodecanoate, t-hexyl peroxypivalate, t-butyl peroxypivalate, 1,1,3,3-tetramethylbutyl peroxy-2-ethyhexanoate, 2,5-dimethyl-2,5-bis(2-ethylhexanoylperoxy)hexane, 1-cyclohexyl-1-methyethyl peroxy-2-ethylhexanoate, t-hexyl peroxy-2-ethylhexanoate, t-butyl peroxy-2-ethylhexanoate, t-butyl peroxyisobutyrate, t-hexyl peroxyisopropylmonocarbonate, t-butyl peroxymaleic acid, t-butyl peroxy-3,5,5-trimethylhexanoate, t-butyl peroxylaurate, 2,5-dimethyl-2,5-(m-toluoyl peroxy)hexane, t-butyl peroxyisopropylmonocarbonate, t-butyl peroxy-2-etylhexyl monocarbonate, t-hexyl peroxybenzoate, 2,5-dimethyl-2,5-bis(benzoyl peroxy)hexane, t-butyl peroxyacetate, t-butyl peroxy-m-toluoylbenzoate, t-butyl peroxybenzoate, and bis(t-butyl peroxy)isophthalate; t-butyl peroxyallylmonocarbonate, t-butyl trimethylsilyl peroxide, 3,3',4,4'-tetrakis(t-butyl peroxycarbonyl)benzophenone, and 2,3-dimethyl-2,3-diphenylbutane. A polyfunctional radical generator such as 2,2-bis(4,4-di-t-butyl peroxycyclohexyl)propane or 3,3,4,4'-tetra(t-butyl peroxycarbonyl)benzophenone is preferred because it also functions as a cross-linking agent. Also, a radical generator such as azobisisobutylonitrile other than peroxide can be employed.

The addition amount of the radical generator is preferably 0.1 to 20 wt %, more preferably 1 to 5 wt % based on the cross-linkable polymer chain. If the amount of the radical generator is too small, density of the cross-linkage is decreased, whereas, if the amount of the radical generator is too large, the cross-linked product may be porous or the structure having micro polymer phases may be disordered.

In the case where the radical generator is added to a copolymer comprising a cross-linkable polymer chain, it is preferable that the cross-linking reaction is initiated after formation of the structure having micro polymer phases has sufficiently advanced. The formation of the structure having micro polymer phases occurs at a temperature above the glass transition temperature of each polymer chain in the copolymer. Therefore, it is preferable that the glass transition temperature of the polymer chains is sufficiently lower than the radical generation temperature of the radical generator.

From this point of view, preferred is a composition in which 2,2-bis(4,4-di-t-butyl peroxycyclohexyl)propane or 3,3',4,4'-tetra(t-butyl peroxycarbonyl)benzophenone is added to a block copolymer comprising a 1,2-polybutadiene chain and a polyethylene oxide chain or polypropylene oxide chain by 1 to 5 wt % based on the 1,2-polybutadiene chain. The glass transition temperature of 1,2-polybutadiene is about 20° C., and the glass transition temperature of the polyethylene oxide or polypropylene oxide is lower than 0° C. When each of 2,2-bis(4,4-di-t-butyl peroxycyclohexyl) propane and 3,3',4,4'-tetra(t-butyl peroxycarbonyl)benzophenone is heated at a rate of 4° C./min, the thermal decomposition temperatures of the radical generators are 139° C. and 125° C., respectively.

When the above composition is heated to a temperature between room temperature and 50° C. to form a structure having micro polymer phases and then is slowly heated to a thermal decomposition temperature of the radical generator, the cross-linkable polymer chains can be cross-linked and cured. However, if the temperature is too high, there is a possibility that the composition reaches the order-disorder transition temperature before sufficient cross-linkage occurs and thus turns into a homogeneous melt. In this case, 3,3',4, 4'-tetra(t-butyl peroxycarbonyl)-benzophenone is advantageous because it generates radicals even when irradiated with an ultraviolet ray, which enables cross-linking at low temperature.

A block copolymer comprising a polybutadiene chain and an α-methylacrylic polymer chain can also be employed. An example is a composition in which 2,2-bis(4,4-di-t-butyl peroxycyclohexyl)propane or 3,3,4,4-tetra(t-butyl peroxycarbonyl)benzophenone is added to a block copolymer comprising a 1,2-polybutadiene chain and a polymethyl methacrylate chain by 1 to 5 wt % based on the 1,2-polybutadiene chain. The polymethyl methacrylate has a relatively high glass transition temperature of 105° C., but it is decomposed by irradiation with an electron beam and is likely to evaporate by annealing at relatively low temperature. Namely, with respect to the polymethyl methacrylate, a thermal decomposition promoting effect can be obtained.

In addition, when a thick film is formed by evaporating a solvent from a solution of a block copolymer comprising a polybutadiene chain and a polymethyl methacrylate chain, a preferable structure having micro polymer phases can be formed without annealing. In this case, when the solvent is evaporated at a temperature sufficiently lower than the thermal decomposition temperature of the radical generator, the advance of cross-linkage in the cross-linkable polymer chains may not disturb formation of the structure having micro polymer phases. This method can be used advantageously where a nanostructure is manufactured by forming a thick porous film and filling the pores with metal. The same effect similar to that of the polymethyl methacrylate case be obtained even in the case where poly(α-methylstyrene) is used.

In the polymethyl methacrylate or poly(α-methylstyrene), the glass transition temperature can be adjusted by a substituent. For example, the glass transition temperatures of poly(n-propyl methacrylate) and poly(n-butyl methacrylate) are 35° C. and 25° C., respectively. Therefore, a copolymer comprising such a polymer chain can be annealed at low temperature, making it possible to form a good structure having micro polymer phases. Poly(α-methylstyrene) substituted by a butyl group at the 4-position also exhibits a low glass transition temperature. Polymethyl methacrylate substituted by an alkyl group having six or more carbon atoms exhibits a lower glass transition temperature, but such a polymer likely to cause cross-linking reaction when irradiated with an electron beam. Poly(n-propyl methacrylate), poly(n-butyl methacrylate) and poly(s-butyl methacrylate) are preferred because they have both a low glass transition temperature and a thermal decomposition promoting effect by electron beam irradiation. Polymethacrylate substituted by a branched alkyl group such as a 2-ethylhexyl group exhibits the thermal decomposition promoting effect by electron beam irradiation although it has many carbon atoms, but its monomer is expensive. Taking easiness in availability into consideration, poly (n-butyl methacrylate) and poly(s-butyl methacrylate) are most preferred.

Polyisobutylene or polypropylene can also be used as a polymer chain having both a low glass transition temperature and a thermal decomposition promoting effect by electron beam irradiation.

In the case where electron beam irradiation is performed to obtain the thermal decomposition promoting effect, 1,2-butadiene can be cross-linked at the same time, the amount of the radical generator can be decreased, and there is no need to add the radical generator in some cases. When the radical generator is not added, there is no need to use a copolymer having a low glass transition temperature, but there is a tendency that the cross-linkage density is decreased. Therefore, it is preferable, in this case, to add a cross-linking agent.

Examples of the cross-linking agent include bismaleimide, polyfunctional acrylate, polyfunctional methacrylate, polyfunctional vinyl compound, and a silicon compound having a Si—H bond. In particular, bismaleimide is excellent in terms of heat resistance. Examples of bismaleimide include bis(4-maleimidophenyl)methane, bis(4-maleimidophenyl)ether, 2,2'-bis[4-(paraminophenoxy)phenyl]propane, and 2,21-bis [4-(paraminophenoxy)phenyl]hexafluoropropane. The addition amount of the cross-linking agent is preferably 0.1 to 100 wt %, more preferably 1 to 20 wt % based on the cross-linkable polymer chain. If the addition amount is too small, the cross-linkage density is decreased, whereas if the addition amount is too large, the structure having micro polymer phases is likely to be disturbed.

A cross-linked product of 1,2-polybutadiene is excellent in heat resistance, electric characteristics such as insulating property, moisture resistance and mechanical characteristics. Therefore, a composition comprising a copolymer consisting of a 1,2-polybutadiene chain and a polyethylene oxide, polypropylene oxide or polymethyl methacrylate chain and a radical generator is suitable for manufacturing a film for pattern formation or a porous structure. A porous material consisting of cross-linked polybutadiene is very useful because it can be used for various filters.

A polysilane chain can be employed as a precursor of a heat-resistant polymer chain. Chemical formulas, specific examples and synthesis methods for polysilanes are already described. The polysilane chain is photo-oxidized by irradiation with an ultraviolet ray in air or an oxygen-containing atmosphere. As a result, reactive or cross-linkable radical terminals are generated by elimination of side chains and cutting of main chain and oxygen insertion produces siloxane bonds. When fired after the photo-oxidization, a cross-linking reaction mainly involving the siloxane bond occurs, and the polysilane chain is transformed into a structure analogous to the $SiO_2$ structure. Also, when a polysilane chain or polycarbosilane chain is irradiated with an ultraviolet ray under a nonoxygen or low-oxygen atmosphere and then fired, the polymer chain is converted to silicone carbide (SiC). The resultant $SiO_2$ or SiC exhibits high heat resistance.

An example of a preferable polysilane chain is one having an aromatic substituent and an alkyl group. Such polysilane has a repeating unit represented by the following chemical formula.

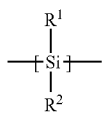

where $R^1$ represents a substituted or unsubstituted aromatic substituent having 6 to 20 carbon atoms wherein a phenyl group is most preferred, and $R^2$ represents a substituted or unsubstituted alkyl group having 1 to 6 carbon atoms wherein a methyl group is most preferred. Poly(methylphenylsilane) is particularly preferred because it can be easily cross-linked through the elimination of the phenyl group by irradiation with ultraviolet ray.

It is preferable to use a block copolymer consisting of a polysilane chain and a polyethylene oxide or polypropylene oxide chain. Such a block copolymer is applied to a substrate by spin coating to form a film, followed by forming a phase-separated structure, and then the film is exposed to an ultraviolet ray, and heated if desired, to advance cross-linking reaction. Further, the film is heated to thermally decompose to remove the thermally decomposable polymer chain. As a result, a pattern of a product analogous to $SiO_2$ or SiC, to which a phase-separated structure is transformed, is formed. Using the pattern as a mask, etching processing of the underlayer or plating can be performed successfully.

An additive such as a sensitizer, radical generator and acid generator, for example, fullerene, 3,3',4,4'-tetrakis(t-butyl peroxycarbonyl)benzophenone and etc., can be added to the copolymer having a polysilane chain, if desired.

A polysiloxane chain can be used as a precursor of a heat resistant polymer chain. The molecular weight distribution of the polysiloxane chain can be made small by living polymerization of cyclic oligosiloxane. When a polysiloxane chain having alkoxyl groups on the side chains is heated in a presence of an acid catalyst, it produces siloxane bonds accompanied by elimination of alkoxyl groups to be three-dimensionally cross-linked, which brings about improvement in heat resistance and mechanical characteristics.

A polysilane chain and polysiloxane chain having hydroxyl groups or alkoxyl groups on the side chains are transformed into $SiO_2$ or $SiO_2$ analogues by firing. Such polysilane and polysiloxane have a repeating unit, for example, represented by the following chemical formulas.

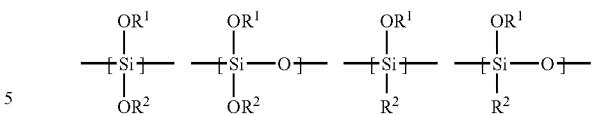

where $R^1$ and $R^2$ independently represent a hydrogen atom, or a substituted or unsubstituted alkyl group, aryl group or aralkyl group having 1 to 20 carbon atoms. Specific examples are polysilane such as poly(di-i-propoxysilane) and poly(di-t-butoxysilane), and polysiloxane such as poly(di-i-propoxysiloxane) and poly(di-t-butoxysiloxane).

When a block copolymer or graft copolymer having a polysilane chain or polysiloxane chain and a thermally decomposable polymer chain such as a polyethylene oxide or polypropylene oxide chain is fired, a porous structure consisting of an $SiO_2$ analogue material, to which a phase-separated structure is transformed, can be formed. Such a porous film functions well as a mask. Also, a porous structure can be applied to various functional members such as a magnetic recording medium and an electrode material by filling the pores with an inorganic material such as metal.

Polyamic acid can be used as a heat resistant polymer chain. When polyamic acid and an amino-terminated polymer are mixed, a carboxyl group and an amino group forms a salt, thus a graft copolymer having a polyamic acid main chain and pendent amino-terminated polymers is formed. A Kapton precursor can be used as the polyamic acid. As the amino-terminated polymer, polyethylene oxide, polypropylene oxide or polymethyl methacrylate having an aminopropoxyl group or dimethyl aminopropoxyl group as one terminal group and a methoxyl group or diphenylmethoxyl group as the other terminal group can be employed. A copolymer consisting of polyamic acid and amino-terminated polypropylene oxide is particularly preferable because it can be phase-separated well. In this case, varying the molecular weights of the polyamic acid and amino-terminated polymer, respectively, can control the size of domains in the structure having micro polymer phases. Also, varying the mixing ratio of the polyamic acid and amino-terminated polymer can easily change morphology of the structure having micro polymer phases.

Examples of suitable combinations of a heat resistant polymer chain and a thermally decomposable polymer chain described above include: a polyacrylonitrile chain and a polyethylene oxide chain, a polyacrylonitrile chain and a polypropylene oxide chain, a polymethylphenylsilane chain and a polystyrene chain, a polymethylphenylsilane chain and a poly (α-methylstyrene) chain, a polymethylphenylsilane chain and a polymethyl methacrylate chain, a polymethylphenylsilane chain and a polyethylene oxide chain, and a polymethylphenylsilane chain and a polypropylene oxide chain.

A heat resistant material may be segregated on one polymer phase in a block copolymer or graft copolymer consisting of a hydrophilic polymer chain and hydrophobic polymer chain. As the heat resistant material, an inorganic heat resistant material or a precursor thereof, or thermosetting resin can be employed. In this case, all of the polymer chains constituting the copolymer may be thermally decomposable. For example, in a block copolymer consisting of a polyethylene oxide chain and polypropylene oxide chain, both polymer chains are thermally decomposable, but the polyethylene oxide chain is hydrophilic and the polypropylene oxide chain is hydrophobic. When the inorganic heat resistant material or thermosetting resin is blended with the block copolymer, it is apt to be distributed unevenly on the hydrophilic polyethylene oxide chain. When the blend is allowed to form a structure having micro polymer phases, followed by heating to thermally decompose and evaporate the block copolymer, a porous pattern consisting of the inorganic heat resistant material or thermosetting resin, to which the structure having micro polymer phases is transferred, can be formed. When the porous pattern is used as a mask, high etching selectivity can be given. In addition, when a porous structure whose pores filled with metal is used for a magnetic recording medium or an electrode, good durability can be given.

Examples of the inorganic heat resistant material or precursor thereof include a metal oxide gel, a metal alkoxide polymer, a metal oxide precursor, a metal nitride precursor, metal fine particles, a metal salt and a metal complex. Examples of the metal include silicon, titanium, aluminum, zirconium, tungsten, and vanadium. The metal oxide gel can be obtained by hydrolysis of the metal alkoxide. Examples of the metal alkoxide include alkoxysilane such as tetramethoxysilane, tetraethoxysilane, tetraisopropoxysilane, tetraisopropoxyaluminum and tetraisopropoxytitanium, and alkylalkoxysilane such as butyltriethoxysilane and propyltriethoxyaluminum. An example of the metal alkoxide polymer includes polydiethoxysiloxane. Examples of the metal oxide precursor or metal nitride precursor include polysilsesquioxane, T-resin such as polyhedral oligomeric silsesquioxane (POSS), and polysilazane.

However, the metal oxide gel is poor in storage stability. In addition, if the cross-linking density of the metal oxide gel is too high, formation of a structure having micro polymer phases of a copolymer is disturbed. Therefore, it is preferable that a solution in which a metal oxide gel precursor such as low-molecular weight metal alkoxide or organic metal salt is mixed with a copolymer is applied to a substrate to form a film, followed by forming a structure having micro polymer phases, and then the precursor is transformed into a metal oxide gel by the action of a catalyst such as an acid.

Further, it is preferable to use polysilsesquioxane, T-resin or polysilazane. In particular, the T-resin does not disturb formation of a structure having micro polymer phases, since its curing rate by cross-linking can be controlled by a catalyst. After the structure having micro polymer phases is formed, T-resins can be three-dimensionally cross-linked with each other and cured by the catalyst. An example of T-resin is represented by the following chemical formula.

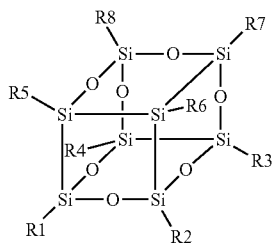

where $R^1$ to $R^8$ independently represent a hydrogen atom, a halogen atom, a hydroxyl group, a thiol group, an alkoxyl group, a silyloxy group or a substituted or unsubstituted alkyl group, alkenyl group, alkynyl group, aryl group or aralkyl group having a 1 to 20 carbon atoms. Specific examples of T-resin are: those having a hydrogen atom, methyl group, hexyl group, vinyl group or dimethylsilyloxyl group as $R^1$ to $R^8$, and those having cyclopentyl groups as $R^1$ to $R^7$ and having a hydrogen atom, hydroxyl group, allyl group, 3-chloropropyl group or 4-vinylphenyl group as $R^8$.

Examples of polysilsesquioxane include polymethylsilsesquioxane, polymethylhydroxyl silsesquioxane, polyphenylsilsesquioxane, polyphenylmethylsilsesquioxane, polyphenylpropyl silsesquioxane, polyphenylvinylsilsesquioxane, polycyclohexylsilsesquioxane, polycyclopentyl silsesquioxane, polycyclohexylsilsesquioxane $T_8$-cube and poly(2-chloroethyl)silsesquioxane.

In poly(2-bromoethyl)silsesquioxane, a cross-linking reaction proceeds at low temperature as well as the cross-linking can be performed by irradiation with an ultraviolet ray. Therefore, a polysiloxane-based polymer having a low glass transition temperature is used and a structure having micro polymer phases is formed, and then it can be cured by UV irradiation. Polyhydroxylsilsesquioxane, polyphenylsilsesquioxane and poly-t-butoxysilsesquioxane can be used in the similar manner as above.

Polyphenylsilsesquioxane is mixed with a copolymer, followed by formation of a structure having micro polymer phases, and then it can be cross-linked and cured by the action of a curing catalyst. As the curing catalyst, dibutyltin diacetate, zinc acetate, and zinc 2-ethylhexanoate can be used. It is preferable to add the curing catalyst in the range of 0.1 to 0.5 wt % based on the silsesquioxane. Silsesquioxane is mixed with a copolymer, followed by formation of a structure having micro polymer phases, and then it can be cross-linked and cured by hydrochloric acid gas or a hydrochloric acid solution.

Examples of the thermosetting resin include: polyamic acid, epoxy resin, polyamide resin, polysulfide resin, urea-formaldehyde resin, phenol-formaldehyde resin, resorcinol-formaldehyde resin, furan resin such as furfuryl alcohol resin, melamine resin, aniline resin, toluenesulfonic amide resin, isocyanate resin, alkyd resin, furfural resin, polyurethane, resorcinol resin, polycarbodiimide, and a precursor polymer of polyparaphenylenevinylene. The thermosetting resin is preferred because it is excellent in storage stability as well as it can be easily removed by ashing after it is used as a mask. In particular, polyamic acid, urea-formaldehyde resin, phenol-formaldehyde resin, resorcinol-formaldehyde resin, furan resin such as furfuryl alcohol resin and melamine resin are preferred, and polyamic acid is most preferable.

Examples of the hydrophilic polymer chain constituting a block copolymer include polyethylene oxide, poly(hydroxymethyl methacrylate), polyacrylic acid, polymethacrylic acid and carboxylate thereof, quarternized polyvinylpyridine, polyvinyl alcohol, and poly(hydroxystyrene). In particular, polyethylene oxide, poly(hydroxymethyl methacrylate), polyacrylic acid and polymethacrylic acid are preferred.

Examples of the hydrophobic polymer chain constituting a block copolymer include polypropylene oxide, polystyrene, poly(α-methylstyrene), polymethacrylate, polybutadiene, polyisoprene, polysiloxane, fluorine-containing polymer. It is preferable that these polymer chains have a low glass transition temperature and are thermally decomposable so as to be able to form a structure having micro polymer phases before the heat resistance material is cured. In particular, polypropylene oxide, poly(α-methylstyrene) and polymethacrylate, which are thermally decomposable at low temperature, and polysiloxane such as polydimethylsiloxane, which has a low glass transition temperature are preferred, and further polypropylene oxide and polydimethylsiloxane are most preferable.

Examples of suitable combinations of polymer chains constituting a block copolymer or graft copolymer used together with a heat resistance material include: a polyethylene oxide chain and a polypropylene oxide chain, a polyethylene oxide chain and a polymethyl methacrylate chain, a polyethylene oxide chain and a poly(α-methylstyrene) chain, a polyethylene oxide chain and a polystyrene chain, a polyethylene oxide chain and a polyvinylpyridine chain, a poly(hydroxyethyl methacrylate) chain and a polypropylene oxide chain, a poly (hydroxyethyl methacrylate) chain and a poly(α-methylstyrene) chain, a poly(hydroxyethyl methacrylate) chain and a polystyrene chain, a polyacrylic acid chain and a polypropylene oxide chain, a polyacrylic acid chain and a polymethyl methacrylate chain, a polymethacrylic acid chain and a polymethyl methacrylate chain, a polyacrylic acid chain and a polyphenylmethylsiloxane chain, a polyethylene oxide chain and a polydimethylsiloxane chain, a polyethylene oxide chain and a polyphenylmethylsiloxane chain, and a polyethylene oxide chain and a polyvinylmethylsiloxane chain. Among these combinations, combinations of the polyethylene oxide chain and the polypropylene oxide chain, and the polyethylene oxide chain and the polydimethylsiloxane chain are preferred, and the combination of the polyethylene oxide chain and the polydimethylsiloxane chain is most preferable. For example, a composition in which thermosetting resin such as polyamic acid is blended with a block copolymer or graft copolymer of the polyethylene oxide chain and the polydimethylsiloxane chain can be used well as a composition for forming a pattern.

The mixing ratio between a heat resistance material and a block copolymer or graft copolymer is not particularly restricted. The heat resistance material is preferably used in the range of 1 to 500 parts by weight, more preferably 5 to 100 parts by weight, still more preferably 10 to 50 parts by weight relative to 100 parts by weight of block copolymer or graft copolymer. If the mixing amount of the heat resistance material is too small, the composition cannot function sufficiently as a mask. If the mixing amount of the heat resistance material is too large, the microphase-separation structure is disturbed and a good pattern cannot be formed.

A solvent used for preparing a solution of a mixture of a copolymer and a heat resistant material or precursor thereof should desirably be a good solvent to both the copolymer and the heat resistant material or precursor thereof. In particular, it is preferable to use a good solvent, at the same time, to any of polymer chains constituting the copolymer. If a solvent extremely poor in solubility to a particular polymer chain is used, micelles are apt to be formed in the solution. In this case, on the occasion of forming a structure having micro polymer phases in a form of a thin film such as a mask for patterning or a template film for a magnetic film for a magnetic recording medium, the hysteresis of the micelle structure formed in the solution is left remained, which makes it difficult to form a good pattern of the structure having micro polymer phases.

In order to form a desired structure having micro polymer phases from a block copolymer or graft copolymer, it is preferable to adjust the composition ratio between the two kinds of polymer chains, as described above. In the case of an A-B diblock copolymer, the morphology of the structure having micro polymer phases varies depending on the composition ratio between the A polymer and the B polymer, as schematically described below. Where the ratio of a minority phase is very small, the minority phase is aggregated to form spherical domains into a sea-island structure. When the composition ratio of two phases becomes 7:3, the minority phase forms columnar domains into cylindrical structure. When the composition ratio of two phases becomes about 1:1, both phases form sheet-like domains that are alternately laminated into a lamella structure.

Here, for the A-B diblock copolymer, the phase diagram leans toward the side of a polymer phase having a larger surface energy, i.e., having a larger value of solubility parameter. This means that the composition where a domain structure such as a lamella, cylinder or sea-island structure is formed is slightly deviated depending on the combination of two kinds of polymer chains. Specifically, where the solubility parameters of two kinds of polymers constituting a block copolymer differ from each other by about 1 cal$^{0.5}$/cm$^{1.5}$, an optimum composition is shifted by about 5% toward the side of the polymer having a larger solubility parameter relative to the afore-mentioned composition. Further, when a block copolymer is brought into contact with a substrate, a polymer exhibiting a smaller surface energy difference tends to be segregated on the substrate side. For example, in the case of PS-PMMA type block copolymer, PMMA tends to be precipitated on the side of the substrate. On the contrary, in the case of PS-PB (polybutadiene) type block copolymer, PS tends to be precipitated on the side of the substrate.

In the case where a thin film of sea-island structure is to be formed, the composition ratio should desirably be set in the vicinity of the transition point between the sea-island structure and the worm-like structure. In this case, although an optimum composition ratio of the block copolymer cannot be determined in a general way because an interaction acts between the polymer and the substrate, the optimum composition ratio can be estimated in some measure. Namely, where the minority phase is a phase exhibiting smaller surface energy difference relative to the substrate, the minority phase tends to be segregated on the side of the substrate, and therefore it is necessary to set the composition of the minority phase larger. For example, since PMMA tends to be segregated on the surface of the substrate in the case of PS-PMMA, it is necessary to set the ratio of PMMA in the copolymer in which PMMA constitutes the minority phase than the ration of PS in the copolymer in which PS constitutes the minority phase. In addition, the size distribution of the spheres or cylinders becomes different due to the difference in surface tension between the two kinds of polymers. For that reason too, the optimum composition ratio for forming a phase-separated structure differs between a block copolymer that an A polymer constitutes the minority phase and a block copolymer that a B polymer constitutes the minority phase. For example, assuming that an optimum composition ratio that the A polymer having an affinity to a substrate forms dots on the substrate is A:B=20:80, there is a case where an optimum composition ratio that the B polymer forms dots on the surface becomes A:B=85:15. This is because, as a polymer tends to be adsorbed on the substrate, an extra volume of polymer is required in the bulk.

It is preferable to set the volume fraction of the two polymer phases constituting a block copolymer as follows. For example, where the sea-island structure is to be formed, the volume fraction of one phase is set to the range of 5 to 40%, preferably 10 to 35%, more preferably 15 to 30%. The density of islands governs the lower limit of the volume fraction, while the range where the sea-island structure can be maintained governs the upper limit. If the volume fraction exceeds the upper limit, another structure such as a cylindrical structure other than the sea-island structure is formed. Note that, where a thin film having a thickness of about several tens nanometers is to be formed, the influence of the interface becomes significant, the above optimum value should be made smaller by 2 to 5%. In order to adjust the volume fraction of the two phases, the copolymerization ratio of the block copolymer may be controlled; alternatively the molecular volume of the polymer chain may be controlled. The control the molecular volume can be achieved by various methods. For example, in the process of quaterize a polyvinyl pyridine chain, the molar volume of an alkyl group or a counter anion may be changed. Alternatively, a substance exhibits a high affinity to a specific phase may be mixed so as to adjust the volume ratio of the phase. In this case, a homopolymer of a constituent polymer chain of the block copolymer may be employed as the substance to be mixed.

In order to form a good three-dimensional bicontinuous structure, it is required to be incompatible with each other between an A polymer chain and a B polymer chain; an A polymer chain and a precursor of B polymer chain; a precursor of A polymer chain and a B polymer chain; or a precursor of A polymer chain and a precursor of B polymer chain. Where a precursor is employed, the phase-separated structure is formed, and then the precursor is subjected to a chemical reaction under a temperature condition lower than the glass transition temperature of the copolymer to transform into a desired polymer chain. In this case, the molecular weight of each block should preferably be 3,000 or more. In order to adjust the composition ratio, a small amount of homopolymer may be added, if desired, to a solution of the block copolymer having two polymer chains incompatible with each other.

Various additives may be added to a solution of a block copolymer. As for the additive, it is preferable to use one having a specifically high affinity to one of the polymer chains to be phase-separated to each other. In this case, the additive can be easily segregated on the polymer phase having a high affinity in the process of formation of the phase-separated structure. As a result, a phase containing the additive can be improved in etch resistance. In particular, when the additive is segregated on a heat resistant phase, more excellent patterning can be performed.

As for the additives, there may be used a metal salt of Cr, V, Nb, Ti, Al, Mo, Li, Lu, Rh, Pb, Pt, Au, Ru, etc., and an organic metal compound. A metal element produced by reducing such additives can be utilized as a nucleus for a magnetic film of a magnetic recording medium of an electrode material for an electrochemical cell. Examples of such additives include lithium 2,4-pentanedionate, lithium tetramethylpentanedionate, ruthenium 2,4-pentanedionate, magnesium 2,4-pentanedionate, magnesium hexafluoro-pentanedionate, magnesium trifluoropentanedionate, manganese(II) 2,4-pentanedionate, molybdenum(V) ethoxide, molybdenum (VI) oxide bis(2,4-pentanedionate), neodymium 6,6,7,7,8,8,8-heptafluoro-2,2-dimethyl-3,5-octanedionate, neodymium hexafluoropentanedionate, neodymium(III) 2,4-pentanedionate, nickel(II) 2,4-pentanedionate, niobium(V) n-butoxide, niobium(V) n-ethoxide, palladium hexafluoropentanedionate, palladium 2,4-pentanedionate, platinum hexafluoropentanedionate, platinum 2,4-pentanedionate, rhodium trifluoropentanedionate, ruthenium(III) 2,4-pentanedionate, tetrabutylammonium hexacholoroplatinate(IV), tetrabromoaurate(III) cetylpyridinium salt.

As an additive, metal fine particles having a size of several nanometers to 50 nm or less, which are surface-treated so as to enhance an affinity specifically to one polymer phase, can be employed. Japanese Laid-open Patent Publication No. 10-251,548 discloses a method of coating metal particles with a polymer. Japanese Laid-open Patent Publication No. 11-60,891 discloses a method of coating metal particles with a polymer. For example, metal particles coated with an A homopolymer are segregated on the A polymer chain in an A-B block copolymer, whereas metal particles coated with a B homopolymer are segregated on the B polymer chain in an A-B block copolymer. In this case, the metal particles are segregated on a polymer phase exhibiting a high affinity in the polymer chains constituting the A-B block copolymer. Further, metal particles coated with an A-B block copolymer are segregated at the interface between the A polymer chain and B polymer chain. By using such methods, the same type of metal element can be segregated freely on an arbitrary polymer chain.

An additive may be chemically bonded to the side chain or main chain of the block copolymer, instead of merely mixing with the block copolymer. In this case, by modifying only a specific polymer with a functional molecular structure, it becomes easily possible to segregate the additive on a specific phase. The additive may be introduced into a polymer chain by a method that a structure capable of easily bonding to the additive is introduced into the main chain or side chain of a specific polymer, and then a vapor or solution of the additive is brought into contact with the polymer before or after the formation of the phase-separated structure. For example, when chelate structures are introduced into a polymer chain, the polymer chain can be selectively doped with metal ions in a high concentration. The chelate structure may be introduced into the main chain of a copolymer, or introduced into the ester moiety of polyacrylate as a substituent group. When an ion-exchange resin structure having an ionic group such as a pyridinium salt structure is introduced into a copolymer, the polymer chain can be effectively doped with a metal ion by counter ion exchange.

The addition of a plasticizer to the pattern-forming material is preferable as it enables to form a structure having micro polymer phases by short time annealing. Although the addition amount of the plasticizer is not particularly restricted, the amount is set to 1 to 70 wt %, preferably 1 to 20 wt %, more preferably 2 to 10 wt % based on a block copolymer or a graft copolymer. If the amount of the plasticizer is too small, the effect of accelerating the formation of structure having micro polymer phases cannot be obtained sufficient, whereas if the content of plasticizer is excessive, the regularity of the structure having micro polymer phases may be disturbed.

Examples of the plasticizer include an aromatic ester and fatty acid ester. Specific examples of the ester are a phthalate-based plasticizer such as dimethyl phthalate, dibuthyl phthalate, di-2-ethylhexyl phthalate, dioctyl phthalate and diisononyl phthalate; a trimellitic acid-based plasticizer such as octyl trimellitate; a pyromellitic acid-based plasticizer such as octyl pyromellitate; and a adipic acid-based plasticizer such as dibutoxyethyl adipate, dimethoxyethyl adipate, dibutyldiglycol adipate and dialkyleneglycol adipate.

A polymerizable low-molecular weight compound can be added as a plasticizer. For example, the polymerizable low-molecular weight compound such as bismaleimide is added to a block copolymer or graft copolymer having a polymer chain having a relatively high glass transition temperature, such as a polyimide chain or a polyamic acid chain that is the precursor of the former. The polymerizable low-molecular weight compound serves as the plasticizer that enhances fluidity of the polymer chain and promotes formation of the phase-separated structure in heating process. In addition, since the polymerizable low-molecular weight compound is finally polymerized and cured to fix the structure having micro polymer phases, which makes it possible to strengthen the porous structure.

Examples of bismaleimide include bis(4-maleimidophenyl)methane, bis(4-maleimidophenyl)ether, 2,2'-bis[4-(paraminophenoxy)phenyl]propane, and 2,2-bis[4-(paraminophenoxy)phenyl]hexafluoropropane. The addition amount of the bismaleimide is set to 1 to 70 wt %, preferably 1 to 20 wt %, and more preferably 2 to 10 wt %. If the addition amount is too small, the cross-linkage density is decreased, whereas if the addition amount is too large, the structure having micro polymer phases is likely to be disturbed. In the case where reinforcement of the structure having micro polymer phases by the polymerized product of the bismaleimide is intended, it is preferable to increase the addition amount of the bismaleimide. Specifically, it is preferable to add the bismaleimide in the range of 10 to 50 wt % based on a polymer chain to be plasticized such as a polyamic acid chain.

Addition of a cross-linking agent or introduction of a cross-linkable group to copolymers enables the copolymers to be cross-linked tree-dimensionally with each other after the formation of the structure having micro polymer phases. Such a cross-linkage can improve thermal or mechanical strength of the structure having micro polymer phases more effectively and can enhance stability thereof. Taking heat resistance into consideration, it is preferable the respective polymer chains are essentially incompatible. However, even if the structure having micro polymer phases is constituted by phases not incompatible, the heat resistance thereof can be improved by cross-linking the polymer chains forming the phases with each other.

When a structure having micro polymer phases is formed from a block copolymer, it is general to anneal the copolymer above the glass transition temperature (and below the thermal decomposition temperature). However, if the annealing is performed under an oxygen-containing atmosphere, there is a possibility that the polymer is degenerated or degraded by an oxidation reaction, which makes it impossible to form a good structure having micro polymer phases, or the treatment time is prolonged, or desired etching selectivity cannot be obtained. In order to prevent such degradation of the copolymer, it is preferable to perform the annealing under an oxygen-free condition and preferably at a dark place where photo-degradation is hard to occur. However, the annealing under the oxygen-free condition requires strict control of the atmosphere, which is likely to bring about increase in manufacturing cost. Consequently, it is preferable to add an antioxidant or a light stabilizer to a block copolymer or graft copolymer. Although the antioxidant or light stabilizer is not particularly limited, it is preferable to employ a radical scavenger capable of trapping radical species generated through an oxidation reaction or photo-degradation reaction.

Specifically, it is possible to employ a phenol-based antioxidant such as 3,5-tert-butyl-4-hydroxytoluene; a phosphorus-based antioxidant; a sulfur-based antioxidant such as a sulfide derivative; a hindered amine light stabilizer (HALS) represented by a piperidine-based compound such as bis-(2, 2,6,6-tetramethylpiperidinyl-4) sebacate; or a metal complex-based light stabilizer such as copper and nickel.

Although the mixing amount of the antioxidant or light stabilizer is not particularly limited, the amount is set to 0.01 to 10 wt %, preferably 0.05 to 1 wt %, and more preferably 0.1 to 0.5 wt %. If the mixing amount is too small, antioxidant effect or light stabilizing effect becomes insufficient. If the mixing amount is excessive, there is a possibility to disturb the phase-separated structure of the copolymer.

The antioxidant or light stabilizer may disturb smooth thermal decomposition of a heat decomposable polymer chain on one hand. Therefore, it is preferable to employ those that can be evaporated or decomposed at a temperature not lower than the heat decomposition temperature of the heat decomposable polymer chain as the antioxidant or light stabilizer. In addition, in the case where heat-resistant polymer chain is made infusible by heating in air so as to improve heat resistance, the presence of such an antioxidant should better be avoided. In this case, it is preferable for the antioxidant not to be evaporated at a temperature at which a structure having micro polymer phases is formed but to be evaporated or decomposed at a temperature at which the polymer chain is made infusible. Therefore, it is preferable to employ a compound such as 3,5-di-tert-butyl-4-hydroxytoluene that has a low-molecular weight and is easily evaporated.

A method for forming a pattern according to the present invention will be described in more detail hereinafter.

The method for forming a pattern of the present invention comprises steps of: forming a film made of a pattern forming material on a substrate; forming a structure having micro polymer phases in the film; removing one polymer phase selectively from the structure having micro polymer phases formed in the film; and etching the substrate with using the remaining another polymer phase to transfer the pattern of the structure having micro polymer phases to the substrate.

This method can be applied to manufacturing of a fine particles-dispersed type magnetic recording medium and a field emission display. Since the positions of elements in the pattern may not be required so precise in these applications, this method is very effective.

First, a film made of a pattern forming material is formed on a substrate by spin coating or dip coating. Annealing is performed, if desired, at a temperature above the glass transition temperature of the pattern forming material. The thickness of the film is preferably set to a thickness similar to or slightly larger than the size of the domains in the structure having micro polymer phases to be formed. The size of the domain means a diameter of the islands in the case of sea-island structure, and a diameter of the cylinders in the case of cylindrical structure. Specifically, the film thickness is preferably set to 0.5 to 2.5 times, and more preferably 0.8 to 1.5 times relative to the domain size.

In the case where employed as the pattern forming material is a block copolymer comprising two polymer chains whose ratio between $N/(Nc-No)$ values of respective monomer units is 1.4 or more, where $N$ represents total number of atoms in the monomer unit, $Nc$ represents the number of carbon atoms in the monomer unit, $No$ represents the number of oxygen atoms in the monomer unit, or a block copolymer comprising a polysilane chain and a carbon-based organic polymer chain, the film is dry-etched to remove selectively one phase from the structure having micro polymer phases. For example, in a block copolymer comprising a polymer chain containing an aromatic ring and an acrylic polymer chain, the acrylic polymer phase is selectively dry-etched. Further, in a block copolymer comprising a polysilane chain and a carbon-based organic polymer chain, the acrylic polymer phase is selectively dry-etched.

In the case where employed as the pattern forming material is a block copolymer comprising a polymer chain whose main chain is cut by irradiation with an energy beam and an indecomposable polymer chain against irradiation with an energy beam, the film is irradiated with an energy beam so as to cut the main chain of one polymer phase, and then the polymer phase is evaporated by heating or the polymer phase is wet-etched, thereby removing selectively the polymer phase. For example, when PS-PMMA having micro polymer phases is irradiated with an electron beam and then developed with a developer, a PMMA phase is selectively removed.

In the case where employed, as the pattern forming material is a block copolymer comprising a thermally decomposable polymer chain and a heat resistant polymer chain, heating the film above the thermal decomposition film enables to evaporate the thermally decomposable polymer phase constituting the structure having micro polymer phases and to remove selectively the polymer phase.

These methods make it possible to the film porous. The substrate is dry-etched or wet-etched using the resultant porous film as a mask, thereby transferring the pattern corresponding to the structure having micro polymer phases.

The method using an energy beam has an advantage that it can form a mask by wet etching without using a dry-etching process.

The thermal decomposition method makes it possible to form a mask by only heat treatment. Further, since the surface of the substrate exposed at the holes of the mask is likely to be etched very easily, it can provide a high contrast relative to the surface of the substrate covered with the mask. Since not only dry etching but also wet etching can be employed for etching of the substrate, the range of selection of the substrate material that can be processed is made wide. When the wet etching is employed, process cost can be reduced.

In a conventional method for forming a mask in which a film having micro polymer phases is made porous by decomposing with ozone, it takes a long time for decomposition with ozone. The method of the present invention can be carried out in shorter time compared to the conventional method. In particular, the thermal decomposition method makes it possible to form a good porous pattern in very short time, because it suffices to carry out heat treatment.

An example of application of the aforementioned pattern forming method to manufacturing of the magnetic recording medium will be described. This method comprises the following steps. (a) A nonmagnetic substrate is coated with a block copolymer comprising two kinds of polymer chains whose etching resistivity differs with each other. (b) The block copolymer layer is allowed to form a sea-island structure having micro polymer phases. (c) A polymer phase poor in dry-etching resistivity is dry-etched, and further the nonmagnetic substrate is dry-etched using the remaining dry-etching resistant polymer phase as a mask. (d) A magnetic layer is deposited in an etched region of the nonmagnetic substrate. (e) The remaining polymer and the magnetic layer thereon is lifted off. Hereinafter, each of the steps will be described in more detail.

(a) As a block copolymer comprising two kinds of polymer chains whose etching resistivity differs with each other, used is, for example, one comprising dry-etching resistant PS and PMMA that is a polymer poor in dry-etching resistivity in a ratio of about 8:2 or 2:8, where PMMA having a molecular weight of 50,000 or less and molecular weight dispersion of 1.1 or less. A solution in which the block copolymer is dissolved in, for example, a cellosolve-based solvent is applied to a substrate by spin coating or the like.

(b) Annealing is performed to allow the block copolymer to form a structure having micro polymer phases, thereby forming a sea-island structure. An example of the sea-island structure includes a structure in which islands of PMMA having an average size of about 10 nm are dispersed in sea of PS. In the block copolymer, the etching selectivity by reactive ion etching (RIE) using $CF_4$ becomes to PS:PMMA=1:4 or more, and thus the etch rate of the islands is made larger.

(c) By performing RIE using $CF_4$, only the islands or sea of PMMA having a higher etch rate in the block copolymer of the sea-island structure are etch-removed, and the sea or islands of PS are left remained. Subsequently, the non-magnetic substrate is etched using the remaining PS phase as a mask, thereby forming holes corresponding to portions of the islands or sea. Note that the (d) step may be preformed without etching the nonmagnetic substrate.

(d) A magnetic material is sputtered such that a magnetic layer is deposited on the etched regions in the nonmagnetic substrate and on the remaining PS phase. Note that, an underlayer may be deposited prior to deposition of the magnetic layer.

(e) The remaining PS phase and the magnetic layer thereon are lifted off using a solvent. Further, the remaining organic substance is finally removed by ashing or the like.

With using the above steps of (a) to (e), a magnetic layer can be formed in the nonmagnetic substrate or on the nonmagnetic substrate in accordance with the pattern of the sea-island structure in the block copolymer layer. Since the method needs no mask-forming process, it is clearly understood that the method is inexpensive compared to the method that forms a mask by electron-beam writing. In addition, since a plurality of media can be annealed simultaneously, the method can maintain high throughput.

An example of application of another pattern forming method according to the present invention to manufacturing of the magnetic recording medium will be described with reference to FIGS. 4A to 4C. The method uses a block copolymer and a polymer including metal fine particles as a pattern forming material, which method makes it possible to arrange the metal fine particles at specific positions on a substrate without a lift-off process.

First, a solution of a blend of an A-B block copolymer and an A homopolymer including metal fine particles is prepared, and the solution is applied to the substrate 1 to form a film. As the A-B block copolymer, one having an acrylic polymer chain and aromatic-based polymer chain is employed, for example. In addition, as a polymer covering the metal fine particles, a polymer other than the A polymer can be employed as long as the polymer has a similar molecular structure to the A polymer and is incompatible with the B polymer. Annealing the film at a temperature above the glass transition temperature forms a structure having micro polymer phases in which the islands of the A polymer phase 4 are present in the sea of the B polymer phase 3. In this process, the metal fine particles covered with the A homopolymer are segregated on the A polymer chain 4 constituting the structure having micro polymer phases, and thus the metal fine particles 5 are positioned at the central portions of the A polymer phases 4. In such a manner, a structure in which the metal particles are positioned at the central portions in the island-like polymer phases can be formed with only performing annealing of the film of pattern forming material (FIG. 4A). Incidentally, when metal fine particles covered with an A-B block copolymer instead of the A homopolymer are used, the metal fine particles are segregated at the interface between the A polymer phase and B polymer phase.

Then, with performing RIE, only the A polymer phases 4 (here, the acrylic polymer phases) constituting the structure having micro polymer phases are selectively etched. In this case, the metal fine particles 5 are left remained in the holes 6 being formed without being etched (FIG. 4B).

Further, when etching is continued using the remaining B polymer phase 3 as a mask, the holes 7 are formed in the substrate 1, and the metal fine particles 5 are left remained at the bottom of the holes 7 in the substrate 1. Thereafter, the remaining B polymer phase 3 is subjected to ashing with oxygen plasma (FIG. 4C). By depositing magnetic material using the metal fine particles 5 present at the bottom of the holes 7 as seeds, a magnetic recording medium is formed.

The above method makes it possible to arrange the metal fine particles at specific positions in the substrate without a lift-off process. Depositing a conductor or semiconductor on the metal fine particles makes it also possible to apply the method for forming an emitter of a field emission display.

Incidentally, it is preferable to select a pattern forming material to be used appropriately. In order to form holes by etching a gate electrode of a field emission array, in which holes emitter electrodes are formed, it is preferable to use such a pattern forming material as follows. For example, the pattern forming material consists of a block copolymer or graft copolymer comprising an aromatic ring-containing polymer chain and an acrylic polymer chain having a molecular weight of 50,000 or more and molecular weight distribution (Mw/Mn) of 1.15 or less in which the molecular weight ratio between the aromatic ring-containing polymer chain and acrylic polymer chain ranges from 75:25 to 90:10.

In order to manufacture a magnetic recording medium of fine particle-dispersed structure, it is preferable to use such a pattern forming material as follows. For example, the pattern forming material consists of a block copolymer or graft copolymer comprising an aromatic ring-containing polymer chain and an acrylic polymer chain having a molecular weight of the acrylic polymer chain of 100,000 or less and molecular weight distribution (Mw/Mn) of 1.20 or less in which the molecular weight ratio between the aromatic ring-containing polymer chain and acrylic polymer chain ranges from 75:25 to 90:10.

In either pattern forming material, a minority phase (here, the acrylic polymer phase) is removed by dry etching or by irradiation with an energy beam. The size of the pattern in the structure having micro polymer phases is uniquely determined by the molecular weight of the minority polymer phase to be removed. Therefore, it is preferable to set the molecular weight of the minority polymer to 100,000 or less. When the polymer meets the condition; a dot pattern of a diameter ranging from 100 to 200 nm can be provided independently of the polymer type. In the case where a dot pattern of about 40 nm is to be formed, it is preferable to set the molecular weight of the minority polymer to about 10,000. If the molecular weight of the minority polymer becomes lower than 3,000, however, sufficient repulsive force between segments, which is necessary for microphase-separation, cannot be provided, and thus there is a possibility of disturbing distinct pattern formation.

A phase-separated structure of a pattern forming film can be oriented by an electric field. When an electric field of 1 to 10 V/μm is applied during formation of the structure having micro polymer phases in the pattern forming film by annealing, the structure having micro polymer phases is oriented. In the case of a cylindrical structure, for example, the cylinder phases are oriented along electric flux lines. When a voltage is applied to the pattern forming film along the direction parallel to the substrate, the cylinder phases are oriented along the direction parallel to the substrate. Etching the substrate using the oriented pattern forming film as a mask makes it possible to form a linear pattern in the substrate. On the other hand, when a voltage is applied to the pattern forming film with providing parallel plate electrodes above and below the pattern forming film, the cylinder phases are oriented along the thickness direction. With heat-treating the pattern forming film to make porous, a porous film having a high aspect ratio in the depth direction. Etching the substrate using the oriented pattern forming film as a mask makes it possible to form holes having a very high aspect ratio in the substrate.

According to the present invention, it is also possible by utilizing a pattern transfer technique to transfer a structure having micro polymer phases pattern of a pattern forming material to a pattern transfer film and further to a substrate, thereby enabling to form holes having a high aspect ratio in the substrate. Note that, a lower pattern transfer film may be provided between the substrate and the pattern transfer film. The pattern forming film, the pattern transfer film and the lower pattern transfer film will be described below.

1. Pattern Forming Film

As for a pattern-forming film, a block copolymer comprising two kinds of polymer chains whose dry etch rate ratio is 1.3 or more; a block copolymer having a polymer chain whose main chain is cut by irradiation with an energy beam and an indecomposable polymer chain against irradiation with an energy beam; or a block copolymer having a thermally decomposable polymer chain and a heat resistant polymer chain, which contains one transformed form a precursor, can be employed. Such a block copolymer is applied by spin coating or dip coating to form a pattern forming film. In this case, a pattern forming film in which cylinder phases are oriented by orientation with an electric field.

2. Pattern Transfer Films

The pattern transfer film is a layer to which a pattern formed in the pattern forming film is to be transferred, the film being provided under the pattern forming film. After one polymer phase constituting the pattern forming film is selectively removed, the pattern transfer film is subsequently etched. In order to remove one polymer phase in the pattern forming film, dry etching, electron-beam irradiation and wet etching, or thermal decomposition is employed in accordance with the above pattern forming material.

The thickness and etch rate of the pattern transfer film is set so that the etching of the pattern transfer film can be accomplished before a phase having a higher etch resistance in the copolymer of the pattern forming film is etched. Specifically, it is preferable that the pattern transfer film has a dry etch rate ratio of 0.1 or more, more preferably 1 or more, still more preferably 2 or more compared to the polymer chain exhibiting lowest dry etch rate among the polymer chains constituting the block copolymer constituting the pattern-forming film. As for the pattern transfer film, a metal thin film formed of Au, Al, Cr, etc.; polysilane; or a polymer having N/(Nc−No) value of 3 or more that is easily etched.

The polysilane as a pattern transfer film is not particularly restricted as long as it contains a repeating unit represented by the following chemical formulas.

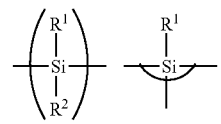

where $R^1$ and $R^2$ represent a substituted or unsubstituted alkyl, aryl or aralkyl group having 1 to 20 carbon atoms, respectively.

Examples of the polysilane include poly(methylphenylsilane), poly(diphenylsilane) and poly(methylchloromethylphenylsilane). Further, the polysilane may be a homopolymer or a copolymer, or may be one having a structure that two or more kinds of polysilane are bonded with each other via an oxygen atom, a nitrogen atom, an aliphatic group or an aromatic group. An organosilicon polymer in which a polysilane and a carbon-based polymer are copolymerized can also be employed. Although the molecular weight of the polysilane is not particular restricted, a preferable range of the molecular weight is Mw=2,000 to 1,000,000, more preferably Mw=3,000 to 100,000. If the molecular weight is too small, the coating property and etch resistance of the polysilane will be deteriorated. In addition, if the molecular weight is too small, the polysilane film is dissolved when the pattern forming film is applied, thereby giving rise to mixing between the both films. On the other hand, if the molecular weight is too large, solubility of the polysilane to a coating solvent will be deteriorated.

Incidentally, since polysilane is liable to be oxidized and its etching property is liable to be changed, it is preferable to add the aforementioned antioxidant or light stabilizer. Although the addition amount of the additives is not particularly restricted, it is preferable to be 0.01 to 10 wt %, more preferably 0.05 to 2 wt %. If the addition amount is too small, effect by addition cannot be obtained, on the other hand, if the addition amount is too excessive, there is a possibility that the etching property of polysilane is deteriorated.

3. Lower Pattern Transfer Film

Provision of the lower pattern transfer film, although the lower pattern transfer film may not necessarily be provided, enables to obtain a pattern having a high aspect ratio as well as to widen selection ranges of substrate materials to be processed. Since the lower pattern transfer film is etched using the pattern transfer film as a mask, to which the structure having micro polymer phases has been transferred, the etching selectivity of the lower pattern transfer film relative to the pattern transfer film is preferably set to 2 or more, more preferably 5 or more, still more preferably 10 or more. In order to give high etching selectivity, it is preferable to use an inorganic thin film made of metal or metal oxide as a pattern transfer film for a patter forming film made of an organic polymer, and to use an organic polymer film as a lower pattern transfer film. In this case, etching the lower pattern transfer film with $O_2$ gas using the pattern transfer film as a mask enables to form very deep holes. Etching the substrate using these films as masks makes it possible to form deep holes having a high aspect ratio in the substrate. In order to give a high aspect ratio in the depth direction, it is preferable to etch the lower pattern transfer film by anisotropy etching. Incidentally, when etching selectivity between the pattern transfer film and lower pattern transfer film is sufficiently high, the pattern transfer film may be made thin, and thus the pattern transfer film may be etched by isotropy etching such as wet etching.

In the case where the lower pattern transfer film is used, it is preferable to use, as the pattern transfer film, a metal such as Al, Au Ag and Pt or a metal oxide such as silica, titanium oxide and tungsten oxide. In particular, aluminum is preferred because it has a good deposition property and can be etched by both etching processes of wet etching and dry etching. Although an organic polymer used for the lower pattern transfer film is not particularly restricted, preferred is a polymer having high dry etch resistance against a freon type gas such as $CF_4$, for example, polystyrene or a derivative thereof such as polyhydroxystyrene, polyvinylnaphthalene or a derivative thereof, and novolak resin. The lower pattern transfer film may not necessarily be formed of a block polymer as well as may not necessarily be uniform in molecular weight, so that it is possible to use an organic polymer that can be mass-produced industrially by means of radical polymerization or the like and is relatively inexpensive.

A method for forming a pattern in which lower and upper pattern transfer films and a pattern forming film are formed on a substrate and etching processes are performed thrice will be described.

First, a film made of a polymer as described above is formed as a lower pattern transfer film on a substrate by means of spin coating or dipping. The thickness of the lower pattern transfer film should desirably be equal to or larger than the depth of holes to be transferred. A film formed of an inorganic material such as a metal or SiO is formed as an upper pattern transfer film on the lower pattern transfer film by means of vacuum evaporation or plating. The thickness of the upper pattern transfer film should desirably be less than the thickness of a pattern forming film to be formed thereon.

Any pattern forming film as described above is formed on the upper pattern transfer film. The thickness of the pattern forming film should desirably be almost the same as the size of a structure to be formed. For example, in the case where a sea-island structure comprising islands having a size of about 10 nm is to be obtained, the thickness of the film should preferably be about 10 nm.

The dry etch rate of the upper pattern transfer film should preferably be higher than that of the pattern forming film that is made porous. Specifically, it is preferably that the upper pattern transfer film is etched in a rate of at least 1.3 times, more preferably twice or more the rate for the pattern forming film. However, in the case where a polymer film is provided as a lower pattern transfer film under the upper pattern transfer film, the above etch rate ratio may not necessarily be met. Namely, after the upper pattern transfer film is etched, the lower pattern transfer film is etched with oxygen plasma. On this occasion, when the upper pattern transfer film has high resistance against oxygen plasma, the lower pattern transfer film can be easily etched with oxygen plasma. In this case, the dry etch rate of the upper pattern transfer film may be 0.1 or so compared to that of the pattern forming film.

After these films are formed as mentioned above, annealing is performed, if desired, thus a structure having micro polymer phases is formed in the pattern-forming film. RIE with a fluorine-based gas, electron-beam irradiation and wet etching, or thermal decomposition is performed, thereby removing one polymer phase selectively in the structure having micro polymer phases formed in the film and leaving another polymer phase. The upper pattern transfer film (for example, a metal) is etched to transfer the structure having micro polymer phases (for example, a sea-island structure) to the film. Then, RIE with oxygen plasma is performed using the remaining upper pattern transfer film as a mask, thereby etching the lower pattern transfer film (for example, a polymer). Since oxygen RIE does not etch the upper pattern transfer film formed of a metal, but etches only the lower pattern transfer film formed of an organic polymer, it is possible to form a structure having a very high aspect ratio. Simultaneously, the pattern forming film formed of an organic copolymer is subjected to ashing. RIE with a fluorine-based gas is performed again using the remaining lower pattern transfer film as a mask, thereby etching the substrate. As a result, holes of the order of nanometers and having a very high aspect ratio can be formed in the substrate. Although wet etching can be employed in place of RIE in the above processes, the shape of the pattern is likely to be deformed during the pattern transfer process.

A method for manufacturing various porous structures using a pattern forming material of the present invention will be described.

A method for manufacturing a porous structure of the present invention comprises the steps of: forming a molded product made of a pattern forming material comprising a block copolymer or graft copolymer; forming a structure having micro polymer phases in the molded product; and dry-etching the molded product to remove selectively a polymer phase from the structure having micro polymer phases, thereby forming a porous structure.

The structure having micro polymer phases formed in the bulk molded product of a block copolymer or graft copolymer is preferred to be a continuous phase structure such as a cylindrical structure, a lamella structure and a bicontinuous structure, and particularly preferred is the bicontinuous structure. The bicontinuous structure includes morphology such as an OBDD structure, a Gyroid structure, a T-surface structure and a lamella catenoid structure.

In the case where used as the pattern forming material is a block copolymer comprising two polymer chains whose ratio between N/(Nc−No) values of respective monomer units is 1.4 or more (where N represents total number of atoms in the monomer unit, Nc represents the number of carbon atoms in the monomer unit, No represents the number of oxygen atoms in the monomer unit), or a block copolymer comprising a polysilane chain and a carbon-based organic polymer chain, the film is dry-etched to remove selectively one polymer phase from the structure having micro polymer phases.

In the case where used as the pattern forming material is a block copolymer comprising a polymer chain whose main chain is cut by irradiation with an energy beam and an indecomposable polymer chain against irradiation with an energy beam, the film is irradiated with an electron beam to cut the main chain of one polymer phase constituting the structure having micro polymer phases, followed by wet-etching, thereby removing the polymer phase selectively.

In the case where used as the pattern forming material is a block copolymer comprising a thermally decomposable polymer chain and a heat resistant polymer chain, which contains one transformed form a precursor, the film is heated to a temperature above the thermal decomposition temperature to evaporate the thermally decomposable polymer phase constituting the structure having micro polymer phases, thereby removing the polymer phase selectively.

Among these methods, the method of performing energy beam irradiation and wet etching and the thermal decomposition method are preferred because the steps are made simple, the cost is lowered, and a relatively thick porous structure can be manufactured.

For example, used is a block copolymer having an indecomposable polymer chain constitutes the porous structure and a polymer chain to be removed by energy beam irradiation and wet etching. As for the energy beam to be irradiated, an electron beam (β ray), X-ray and γ-ray are preferable because they have higher penetration property into a molded product. In particular, the electron beam is most preferred because it has high selectivity in decomposition reaction, has high decomposition efficiency and can be applied at a low cost.

Examples of the indecomposable polymer chain constituting the porous structure include polystyrene; polystyrene derivatives such as polyhydrostyrene; novolak resin; polyimide; acrylonitrile-based resin such as acrylonitrile homopolymer and a copolymer of acrylonitrile and another vinyl polymer; polyacrylic acid, and polyacrylate such as polymethyl acrylate and polytrifluoroethyl-α-chloroacrylate; vinylidene fluoride-based resin such as vinylidene fluoride homopolymer and a copolymer of vinylidene fluoride and hexafluoropropylene; vinyl chloride-based resin; vinylidene chloride-based resin; aromatic ketone resin such as polyether ketone and polyether ether ketone; polysulfone; and polyether sulfone. In particular, acrylonitrile-based resin and vinylidene fluoride-based resin are preferred in view of durability.

Examples of a polymer chain that is cut in the main chain and removed by energy beam irradiation include polyolefin such as polypropylene and polyisobutylene; poly-α-methylstyrene; polymethacrylic acid and polymethacrylate such as polymethyl methacrylate and polytrichloroethylmethacrylate; polymethacrylamide; polyolefin sulfone such as polybutene-1-sulfone, polystyrenesulfone, poly-2-butylenesulfone; and polymethyl isopropenyl ketone. In particular, preferred are polyhexafluorobutyl methacrylate and polytetrafluoropropyl methacrylate that are polymethacrylate in which fluorine is introduced, and polytrifluoroethyl-α-chloroacrylate that is polymethacrylate in which the α-methyl group is substituted by chlorine.

In the case where the method of applying electron-beam is employed, it is particularly preferable to use, as a polymer chain constitutes the porous structure, a polymer having double bonds such as 1,2-polybutadiene in which cross-linking reaction can be advanced by electron beam irradiation, derivatives of polynorbornen or polycyclohexane, and vinylidene fluoride-based resins such as a copolymer of vinylidene fluoride and hexafluoropropylene.

As the block copolymer having a thermally decomposable polymer chain and a heat resistant polymer chain, various block copolymers that have been already described can be employed. Further, after the porous structure made of a polymer is formed, the structure is fired and carbonized, and thus a porous carbon structure can also be manufactured.

The manufactured porous structure can be applied to various uses. Specific uses include a separator of an electrochemical cell, a filter such as a hollow fiber filter, ultra-fine fiber and porous fiber.

In another method of manufacturing a porous structure of the present invention, a porous structure is formed from a molded product of a pattern forming material containing a block copolymer by such methods as described above, and then the pores in the porous structure are filled with an inorganic substance. This is a method for manufacturing a structure of the inorganic substance using the pores, which are formed by transferring the structure having micro polymer phases of the block copolymer or graft copolymer, as a template.

For example, a molded product is formed by casting or melting with using a pattern forming material containing a block copolymer comprising a thermally decomposable polymer chain and a heat resistant polymer chain. Next, annealing is performed, if desired, thus a structure having micro polymer phases is formed. Then, the structure is heated to a temperature above the thermal decomposition temperature of the thermally decomposable polymer chain to remove selectively the thermally decomposable polymer chain, thereby forming a porous structure retaining the structure having micro polymer phases. The pores of the porous structure are filled with, for example, a metal, an inorganic compound such as a metal oxide and a carbon material such as diamond by plating or CVD. Thereafter, the heat resistant polymer phase is selectively removed by $O_2$ ashing, if desired, and thus a structure of inorganic substance is formed. Further, transfer processes may be repeated using the resultant structure of inorganic substance as a template to form another structure of organic substance or inorganic substance. A porous structure consisting of a heat resistant polymer phase is particularly excellent because it is hard to be thermally deformed, and besides, it can be easily removed by $O_2$ ashing or the like.

In this method, the pores of the porous structure are filled with an inorganic substance by plating or CVD. Therefore, it is preferable that openings are present on the surface of the porous structure and continuous pores are present in the porous structure. As a structure having micro polymer phases capable of forming pores as above, a cylindrical structure, a bicontinuous structure or a lamella structure is preferred. In particular, the cylindrical structure and bicontinuous structure are excellent because they can easily retain the shape of the pores in the porous structure. The OBDD structure and Gyroid structure included in the bicontinuous structure are particularly preferred because they are easily filled with a metal.

In the case where the porous structure is a thin film having a thickness nearly equal to the domain size of the structure having micro polymer phases, a sea-island structure may be formed. When the porous structure of the sea-island structure is used as a template, a dot pattern of an inorganic substance can be formed. For example, a porous film exhibiting a sea-island structure is formed on a conductive substrate consisting of, for example, a metal. At that time, the conductive substrate is exposed to outside at the bottom of holes. When the substrate is not exposed to outside, the substrate is made exposed to outside by lightly etching the porous film with oxygen plasma. Plating by passing an electric current through the conductive substrate can form a dot-like metal pattern.

Alternatively, a porous film exhibiting a sea-island structure is formed on a hydrophilic glass substrate to make the glass substrate exposed to outside at the bottom of the holes. Then, electroless plating is performed by adding a catalyst to deposit a metal on the bottom of holes, thereby making it possible to a dot-like metal pattern.

In order to fill the porous structure with a metal, an inorganic compound or carbon, used is a liquid phase process such as plating or a vapor phase process such as CVD.

In the case of metal filling, electroplating or electroless plating is employed. The electroplating is performed with connecting an electrode to the porous structure. For example, a pattern forming film is formed on an electrode, and the film is made porous. The electrode is immersed in a plating bath, and then a current is passed through the electrode, thereby depositing a metal in the porous structure. In this case, it is preferable to perform treatment to make the inner surface facing to the holes hydrophilic by plasma treatment, for example, so that the plating solution can easily penetrate inside the holes in the porous structure.

After the porous structure is filled with a precursor of metal or metal oxide such as an organic metal compound, the porous structure may be fired so as to be evaporated as well as the precursor may be converted into a metal or metal oxide. As the precursor of metal, an organic metal salt, silsesquioxane, etc., can be employed. As a method for filling with these precursors, electrodeposition, spin coating, evaporation, sputtering, impregnation, etc., can be employed.

Also in the case of manufacturing a porous structure, a phase-separated structure of a molded product made of a pattern forming material may be oriented by an electric field in the same manner as described in relation to the method for forming a planar pattern. For example, when a film of a pattern forming material is formed on a substrate and then a voltage is applied to the film in the direction parallel to the substrate, cylinder phases are oriented in the direction parallel to the substrate. Thereafter, when the cylinder phases are removed by, for example, dry etching or thermal decomposition, the surface of the substrate is made exposed. Deposition of a metal on the exposed portions of the surface of the substrate by plating or CVD can form striped metal pattern, which can be used as fine metal wires.

For example, on an insulating wafer made of, for example, silicon nitride, two electrodes are formed with leaving a space of about 5 μm. The wafer is spin-coated with a PGMEA solution of PS-PMMA diblock copolymer to form a thin film having a thickness of about 10 nm to 1 μm. Annealing is performed at 230° C. for 40 hours with applying a voltage of 10 V between the two electrodes. During the operation, microphase separation of the diblock copolymer is caused, and a cylindrical structure, which is perpendicularly oriented to the electrodes, is formed. The PMMA phases in the structure having micro polymer phases are removed by reactive ion etching or energy beam irradiation. As a result, a pattern of the order of nanometers perpendicular to the electrodes is formed. When the pattern as a template is filled with a metal by electroplating or sputtering, ultrafine metal wires can be formed.

When parallel plate electrodes are provided above and below a pattern forming film to apply a voltage, cylinder phases are oriented to the thickness direction. Removal of the cylinder phases can form a porous film in which narrow holes having a high aspect ratio are oriented in the thickness direction. When one electrode is removed and the film is immersed in a plating solution to perform electroplating by passing a current through the remaining electrode, a pinholder-like structure, in which fine metal wires having a diameter of 10 to 100 nm are oriented in the direction perpendicular to the electrode, can be formed. It is also possible to use such a method that a metal such as palladium use as a plating nucleus is deposited on a substrate, a porous film is formed on the metal using a similar procedure as above, and then holes are filled with a metal by electroless plating. In this case, when the porous film is made appropriately swelled using a solvent, it is possible to decrease the diameter of holes. When the porous film having narrowed holes is used as a template, a pin holder-like structure, in which very fine metal wires having a diameter of several nanometers are oriented in the direction perpendicular to the electrode, can be formed. Fine wires of a metal oxide and various ceramic materials or the like can be formed in a similar method. This structure can be suitably employed as emitters in a field emission display (FED). In the application to the emitter, it is preferable to form the metal wires using gold, chromium, iridium or the like, in that iridium is particularly preferable in view of heat resistance. In the case of forming emitters in FED, it is preferable that the thickness of the porous film is larger than the length of the metal wires to be formed; specifically, the thickness is preferred to be 1.5 times or more, more preferably 2 times or more the average length of the metal wires. This is because if a metal is deposited not only in the holes but also on the surface of the porous film, it is difficult to form emitters of a pin holder-like structure. The aspect ratio of the emitters (length/diameter of the metal wires) should preferably be not less than 10, more preferably not less than 50 to provide excellent field emission characteristics. For example, when emitters having a diameter of 3 nm and an aspect ratio of 10 or more are to be formed, the porous film is preferred to have a thickness of 45 nm or more.

In the application to the emitters in FED, the porous film should preferably be removed by ashing or the like because remaining porous film becomes a cause of gas generation. However, when a polymer chain constituting a porous film is made of a material such as polysilsesquioxane that can be converted into an inorganic material, it is preferable to leave the porous film because the film can retain the pin holder-like structure.

It is also possible to use a method that metal wires manufactured as described above are once removed from the electrode and then they are adhered as emitters to another electrode, which is separately prepared. In this case, since emitters can be formed with only using an adhesion step, the manufacturing process can be simplified. However, since the metal wires are not oriented in many cases, field emission efficiency tends to be lowered.

When employed is a block copolymer having a polymer chain whose main chain is cut by irradiation with an energy beam and an indecomposable polymer chain against irradiation with an energy beam, various combinations of polymer chains as described above may be applied. However, from the viewpoint of orientation characteristics and etching contrast, preferred is a diblock copolymer having a decomposable polymer chain selected from poly(meth)acrylate such as polymethyl methacrylate, polymethyl acrylate, polytrifluoromethyl-α-chloroacrylate and polytrichloroethyl methacrylate and a indecomposable polymer chain selected from polystyrene, polyhydroxystyrene, polyvinylnaphthalene and derivatives thereof.

To form a highly oriented cylindrical structure, it is desirable to set the molecular weight ratio between the decomposable polymer and the indecomposable polymer to the ranges of 75:25 to 67:34 and 34:67 to 25:75. In the range of between 67:34 and 34:67, cylinders may possibly coalesce with each other. If the composition is more weighted compared to 75:25 or 25:75, it is difficult to give continuous cylindrical structure.

Intervals in the pattern can be set to the range of about 10 nm to about 1 μm, depending on the molecular weight of the block copolymer. A block copolymer having a molecular weight of about 10,000 is employed where a pattern of a size of about 10 nm is to be formed, and a block copolymer having a molecular weight of about 100,000 for a pattern of a size of about 100 nm. If the molecular weight is lower than 3,000, a structure having micro polymer phases is hard to be formed, whereas, if the molecular weight exceeds 1,000,000, there is a possibility that regularity of a structure having micro polymer phases is impaired.

Figure 5:
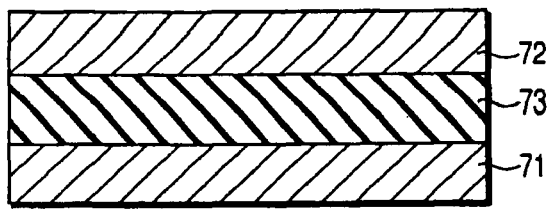
FIG. 5 is a cross-sectional view of an electrochemical cell according to the present invention.

Next, application of the porous structure of the present invention to an electrochemical cell such as a lithium ion secondary battery or an electrochromic device will be described. FIG. 5 shows a conceptual diagram of an electrochemical cell. The electrochemical cell has a structure in which provided are the positive electrode 71 and the negative electrode 72, each of which is provided with a collector, and the separator 73 impregnated with an electrolyte and interposed between the electrodes.

In the electrochemical cell of the present invention, used as the separator 73, for example, is a porous structure formed by removing one polymer phase selectively from a block copolymer having a structure having micro polymer phases. The separator can be manufactured by using a pattern forming material comprising a block copolymer having, for example, a polymer chain decomposable by irradiation with an energy beam and an indecomposable polymer chain, as described below. First, a sheet of a pattern forming material is formed, followed by allowing the sheet to form a structure having micro polymer phases. The sheet is irradiated with an energy beam to decompose the main chain of one polymer phase. Next, the sheet is placed between the negative electrode and the positive electrode via a roll-to-roll process, and then they are hot-pressed. The laminate of pressed electrodes and separator is rinsed with a solvent to remove the polymer phase whose main chain has been decomposed, thereby making the separator sheet porous. Here, the polymer phase whose main chain has been decomposed may be evaporated and removed by reducing pressure or heating. After being sufficiently dried, the laminate is immersed in a bath of an electrolytic solution containing a supporting electrolyte, etc., thereby allowing the laminate to be impregnated with the electrolytic solution. Lead wires, etc., are connected to the resultant laminate, followed by sealing the laminate with an aluminum laminate film, for example, thus manufacturing an electrochemical cell.

When an accelerating voltage for electron beam is sufficiently raised, the separator sheet is irradiated with an electron beam passed through a collector formed of a metal mesh and an active material for electrode. Therefore, the polymer main chain can also be decomposed by irradiation with an electron beam after the separator and electrodes are pressed. This method is preferable because the possibility that the phase-separated structure by pressing is minimized.

It is preferable to mix a spacer consisting of metal oxide particles (such as silica particles) with the pattern forming composition so as to secure a clearance between electrodes when two electrodes and a separator are pressed. The size of the metal oxide particles should preferably be set to about 20 to 90% relative to the clearance between the electrodes.

Figure 6:
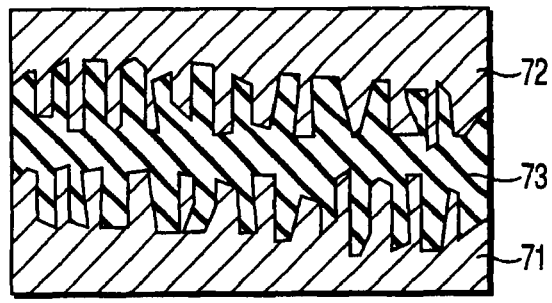
FIG. 6 is a cross-sectional view of another electrochemical cell according to the present invention.

In order to make it easy for a washing solution and electrolyte solution to pass through the electrodes to the separator, the positive electrode 71 and the negative electrode 72 should preferably be formed into an intricate structure such as aggregated particles or a porous structure as shown in FIG. 6. In this case, the separator 73 formed of a porous structure is in a state of intruding in pores of these electrodes. The electrodes of intricate structure can be manufactured by a method that an active material for electrode is mixed with a binder comprising a pattern forming material, followed by being applied to the collector. Employment of such electrodes makes it possible to prevent contact resistance with an electrolyte from being increased, and at the same time, to prevent liquid leakage.

The porous structure constituting the separator should preferably have an aggregated structure of domains having a radius of gyration of 50 μm or less in which unit cells having radius of gyration of 10 to 500 nm are periodically arranged. Such a separator has a good property of retaining electrolyte solution and is hard to bring about liquid leakage because of pores having a size of the order of nanometers as well as is excellent in ion conductivity because of less structural traps (such as dead-end pores). Particularly preferred is a porous structure having continuous pores to which a bicontinuous phase-separated structure is transferred. Among bicontinuous structures, an OBDD structure and Gyroid structure are particularly preferred because they exhibit high ion conductivity, which is attributed to the fact that ions are hard to be trapped in these structures, and are also excellent in film strength. The pore size is preferably set to 5 to 200 nm, more preferably 10 to 100 nm, although it is not particularly limited. If the pore size is too small, ion conduction will be inhibited. If the pore size is too large on the contrary, retention capacity for electrolyte solution will be lowered.

The electrolyte solution to be impregnated into the separator may be one that an inorganic salt or organic salt is dissolved in water or a polar solvent, or may be a room-temperature molten-salt. In the case of a lithium ion secondary battery, an electrolyte solution that a lithium salt is dissolved in a polar solvent or in room-temperature molten-salt is employed. As the lithium salt, employed is $LiPF_6$, $LiBF_4$, $LiClO_4$, $LiSCN$, $Li_2B_{10}Cl_{10}$, $LiCF_3CO_2$, lithium triflate, or the like. As the polar solvent, employed is a carbonate-based solvent such as ethylene carbonate, propylene carbonate and diethyl carbonate; a lactone-based solvent such as γ-butyrolactone; sulfolane-based solvent such as sulfolane and 3-methylsufolane; and ether-based solvent such as 1,2-dimethoxyethane and methyldiglyme. As the room temperature moltensalt, employed is an imidazolium salt such as 1-methyl-3-ethylimidazolium triflate and a pyridinium salt such as N-butylpyridinium triflate.

As the negative electrode, employed is a copper mesh coated with a mixture comprising an active material for negative electrode such as graphite and hard carbon, conductive graphite and a binder polymer, preferably a pattern forming material. As the positive electrode, employed is an aluminum mesh coated with a mixture comprising an active material for positive electrode such as lithium cobaltate, conductive graphite and a binder polymer, preferably a pattern forming material.

In an electrochemical cell of the present invention, electrodes may consist of a porous structure formed by selectively removing a polymer phase from a block copolymer having a structure having micro polymer phases.

Such a porous structure can be formed by, for example, a method that a structure having micro polymer phases is formed in a molded product consisting of a block copolymer having a thermally decomposable polymer chain and a heat-resistant polymer chain and then the thermally decomposable polymer is decomposed and evaporated to form pores, thereby making the molded product porous. As the method for making the molded product porous, it is possible to employ a method of decomposing and removing a specific polymer phase by irradiation with an electron beam and a method of removing a specific polymer phase by dry etching.

It is particularly preferable to form a porous carbon electrode using a carbon precursor polymer as a heat-resistant polymer phase and firing the heat-resistant polymer phase made porous. Examples of carbon precursor polymer include polyacrylonitrile, polymethacrylonitrile, polyimide derivatives, polyaniline derivatives, polypyrrole derivatives, polythiophene derivatives, polyparaphenylenevinylene derivatives, and polycyclohexadiene derivatives.

Annealing a molded product of a block copolymer having a carbon precursor polymer and a thermally decomposable polymer is performed to form a structure having micro polymer phases. The thermally decomposable polymer is decomposed to remove by heating, thereby forming a porous structure consisting of the remaining carbon precursor polymer. Firing the porous structure makes it possible to provide a porous carbon electrode to which the structure having micro polymer phases is transferred. When the structure having micro polymer phases is a cylindrical structure, lamella structure or bicontinuous structure, a porous carbon electrode containing continuous pores is given. Such a porous carbon electrode can be suitably used for a carbon negative electrode for a lithium ion secondary battery, an electrode for a fuel cell, an electrode for an electric double layer capacitor, etc. In particular, a porous carbon electrode that retains a bicontinuous structure is excellent in interfacial area and morphology retention. Among bicontinuous structures, preferred is an OBDD structure or Gyroid structure.

A porous structure, to which a structure having micro polymer phases is transferred, can be formed using a blend of a block copolymer and a carbon precursor, the block copolymer comprising a thermally decomposable polymer chain and a polymer chain having high affinity with the carbon precursor. It is preferable to applying an energy beam such as an electron beam to cross-link the carbon precursor polymer chains. In this case, the structure having micro polymer phases is hard to be collapsed when the porous structure is fired. Alternatively, the carbon precursor polymer chains may be oxidatively cross-linked by heat treatment in air.

The firing temperature is set to 500 to 1500° C. for the negative electrode for use in a lithium ion secondary battery, and to 800 to 3000° C. for the electrode for use in a fuel cell or the electrode for use in a electric double layer capacitor. In order to improve conductivity of the porous carbon, it is preferable to perform firing from 2000 to 3000° C. to advance graphitization.

A porous carbon electrode can be manufactured from a block copolymer consisting of a carbon precursor polymer chain and a polymer chain capable of forming a SiO analogue. The polymer chain capable of forming the SiO analogue includes polysilanes having a Si—H group or alkoxyl group in the side chains; polysiloxanes such as a polysiloxane having an alkoxyl group in the side chains such as polydialkoxysiloxane; silsesquioxanes; a polymer chain having a siloxane cluster such as POSS (Polyhedral Oligomeric Silsesquioxane: polysiloxane $T_8$-cube).

When such a porous carbon forming material is fired, formed is a nanocomposite consisting of a carbon phase, in which a structure having micro polymer phases is retained, and a phase of a SiO analogue material. When the nanocomposite is subjected to acid or alkali treatment so that the SiO phase is selectively decomposed and removed, a porous carbon used for a carbon electrode can be provided. This forming method can prevent the nanopores from being collapsed through thermal deformation during firing.

The carbon electrode formed in such a manner and having regularly arranged nanopores can be used well for the carbon electrode for an electrochemical cell such as a lithium ion secondary battery, an electric double layer capacitor and a fuel cell because an electrolyte solution penetrates well into the electrode, bringing good liquid communication. In addition, since the pores have a uniform and fine size, a local defective structure such as a large pore may not be produced even if the thickness of the electrode is made thin. This is advantageous for making a fuel cell or the like thinner.

In order to manufacture a porous carbon electrode having a bicontinuous structure such as an OBDD structure or Gyroid structure, the volume fraction of one polymer phase in a block copolymer should be set to 20 to 80%, more preferably 45 to 75%, more preferably 55 to 75%, and still more preferably 60 to 70%. In particular, it is preferable that the volume fraction of one polymer phase be set to 62 to 67% in the case of OBDD structure. An OTDD structure has a third continuous phase formed at the interface of the OBDD structure. The OTDD structure can be formed from a triblock copolymer consisting of three kinds of polymer chains. In the case where the OTDD structure is formed, the volume fraction of the third phase should be set to 40 to 70%, more preferably 45 to 55%. At the same time, (the volume fraction of the A phase)/(the volume fraction of the B phase) should be set to 0.7 to 1.3, preferably 0.9 to 1.1, more preferably 1.

The porous carbon electrode manufactured from a block copolymer having a structure having micro polymer phases has a three-dimensional network structure different from that of the conventional porous structure manufactured by sintering fine particles. A three-dimensional network structure manufactured from a structure having micro polymer phases has correlation distances at both 2 N times and 4 times a radius of gyration of cross section of constituent microdomains. The correlation distance can be measured by, for example, X-ray small-angle scattering measurement, neutron scattering measurement and light scattering measurement or the like. A primary scattering peak between microdomains appears at the position where the radius of gyration of cross section of constituent microdomains is doubled. In the case of the three-dimensional network structure shown in a conventional fine particle sintered body, scattering peaks of high order between particles appear at the positions of $\sqrt{2}$ times and $\sqrt{3}$ times with respect to the double the radius of gyration of cross section. On the other hand, in the case of the three-dimensional network structure of the present invention, scattering peaks of high order appear at the positions of $\sqrt{3}$ times and 2 times.

The three-dimensional network structure manufactured from a structure having micro polymer phases is more regular and has less structural defects compared to the three-dimensional network structure shown in a conventional fine particle sintered body. When such a porous electrode exhibits a regular three-dimensional network structure is used in a secondary battery and capacitor, excellent charge-and-discharge characteristics and repeating characteristics can be given. Even when the electrode is used in a fuel cell, good output characteristics can be given. Incidentally, change in molecular weight of a block copolymer or graft copolymer can freely control the pore size of a porous molded product, making it possible to manufacture a porous electrode adequate for the purpose.

A porous structure constituted by a hole-conductive or electron-conductive polymer, such as polyaniline, polyparaphenylene, polythiophen and polypyrrole, can be used as an electrode for an electrochemical element such as an electrochromic element. These porous structures can also be used as an electrode for a lithium ion secondary battery, an electric double layer capacitor and a fuel cell.

An example in which a porous carbon electrode of the present invention is applied to a direct methanol fuel cell will be described. The direct methanol fuel cell uses a carbon electrode having a three-layered structure of a methanol-permeating layer, a methanol-evaporating layer and a catalytic layer, in which optimum pore sizes are different for carbon electrode in each layer. It is difficult to form a multi-layered carbon electrode, in which pore sizes are precisely controlled in each layer, with a conventional carbon cloth or carbon particle-coating film. On the other hand, with the porous carbon electrode formed from a block copolymer having a thermally decomposable polymer and a carbon precursor polymer, adjusting the molecular weights of the polymers can control pore sizes precisely as already described. In addition, such a carbon electrode has very uniform pores and hardly has defects such as larger pores, so that the electrode can be made thinner, which enables to make the entire thickness of the cell thinner.

Figure 7:
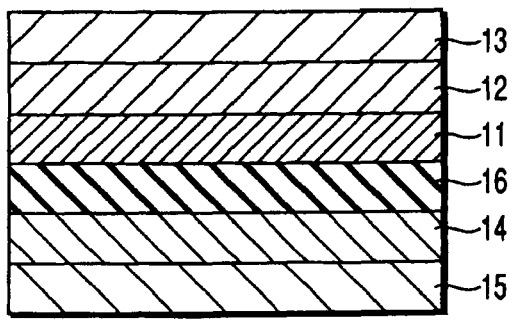
FIG. 7 is a cross-sectional view of a direct methanol fuel cell according to the present invention.

FIG. 7 shows a conceptual diagram of a direct methanol fuel cell. As shown in FIG. 7, formed on the anode (fuel gas) side of the cell is a multilayered-structure of the anode catalytic electrode 11, the fuel-evaporating layer 12 and the fuel-permeating layer 13, each of which is porous, and formed on the cathode (liquid fuel) side of the cell is a laminate of the cathode catalytic electrode 14 and the water-holding gas channel 15, each of which is porous, and further the electrolyte film 16 made of a proton conductor is interposed between the anode catalytic electrode 11 and cathode catalytic electrode 14.

It is preferable to set the pore size of the outermost fuel-permeating layer 13 and water-holding gas channel 15 to 0.1 μm to 10 μm. If the pore size is too small, permeability or penetrating property is deteriorated, whereas, if the pore size is too large, it is impossible to make the cell thinner. It is preferable to set the pore size of the fuel-evaporating layer 12 to 50 nm to 200 nm, and those of the anode catalytic electrode 11 and the cathode catalytic electrode 14 to 10 to 100 nm. In any member, if the pore size is too large, the liquid fuel is likely to soak into the member, whereas, if the pore size is too small, penetrating property of the fuel gas is deteriorated. In any layers, 60% or more, more preferably 70% or more of pore content is preferred. It is preferable to set the thickness of the fuel-evaporating layer 12, anode catalytic electrode 11 and cathode catalytic electrode 14 to 1 to 10 μm. If the thickness is too small, crossover of the fuel gas is increased, which lowers efficiency. If the thickness is too large, mass transfer in the cell is inhibited, so that high output current density cannot be given. As the electrolyte film 16, fluoropolymer having a general sulfonic group, polybenzimidazole, a metal oxide or the like can be employed.

Noble metal particles are loaded in the electrodes: Pt particles or the like for the anode catalytic electrode 11, and Ru particles or the like for the cathode catalytic electrode 14. Such a particle-loaded porous electrode can be manufactured as follows. For example, a salt or complex of a noble metal is mixed with a block copolymer, followed by forming a structure having micro polymer phases, and then the block copolymer is made porous, during which the block copolymer is affected with formalin or fired in hydrogen or inert gas atmosphere, thereby producing noble metal particles.

It is also possible to use a method in which a film made of a blend of an A-B block copolymer including a metal particle and an A-B block copolymer is formed, followed by forming a structure having micro polymer phases, and then the film is made porous. The method makes it possible to segregate the metal particles covered with polymer on the interface between the A polymer phase and B polymer phase on the occasion of formation of the structure having micro polymer phases. When the structure is made porous, the metal particles can be locally distributed on the surface of the remained polymer phase. Such a catalyst electrode can exhibit high catalytic ability, since it has a high specific surface area and a high catalyst density with even distribution.

In the present invention, a porous carbon structure can also be manufactured by the following method. This method comprises steps of: mixing a precursor of thermosetting resin, a surfactant, water and oil, thereby preparing a microemulsion; curing the precursor of thermosetting resin in colloidal particles dispersed in the microemulsion; removing the surfactant, water and oil from the colloidal particles, thereby forming porous structures of cured thermosetting resin; and carbonizing the porous structures to form porous carbon structures.

As the precursor of thermosetting resin, phenol derivatives, resorcinol derivatives, furfuryl alcohol or the like can be employed. A cross-linking agent such as titanium trichloride, boric acid or the like may be added, if desired. As the oil, a hydrophobic solvent such as isooctane, hexane, petroleum ether or the like can be employed.

Examples of the surfactant include: a block copolymer or graft copolymer consisting of a hydrophilic polymer chain and hydrophobic polymer chain such as a block copolymer of polypropylene oxide and polyethylene oxide; polyethylene oxide to which terminal a long-chain alkyl group is introduced such as polyoxyethylene lauryl ether; an anionic surfactant comprising a long-chain alkyl group to which terminal a sulfonate, phosphate or carboxylate is introduced such as sodium dodecylbenzenesulfonate; a cationic surfactant such as a long-chain ammonium salt, a long-chain pyridinium salt or a long-chain imidazolium salt, for example, cetyltrimethylammonium chloride, cetyldimethybenzyl-ammonium chloride and cetylpyridinium bromide; a fluorine-based surfactant.

In the colloidal particles dispersed in the microemulsion, a structure having micro polymer phases comprising the precursor of thermosetting resin and the surfactant is formed. The structure having micro polymer phases has a relatively large size of several tens of nanometers to several tens of micrometers, and can be formed into a structure of dot, lamella, cylinder or three-dimensional network or a mixed structure thereof. Therefore, when the precursor of thermosetting resin in the colloidal particles is cured, then the surfactant, water and oil are removed from the colloidal particles to form porous structures of cured thermosetting resin, and then the porous structures are carbonized, a porous carbon structures having relatively large pores can be manufactured.

In addition, when the structure having micro polymer phases relatively large in size which is formed using a surfactant and the structure having micro polymer phases of the order of sub-nanometer or so are combined, it is possible to form a porous carbon structure whose structure is controlled hierarchically in the range of sub-nanometer to several tens of micrometers. Typically, it is possible to provide a porous carbon structure of a spherical particle of several tens of micrometers in which pores of several micrometers are formed and further pores of several tens of nanometers or less are contained. When such a porous carbon structure is applied to a lithium ion secondary battery or an electric double layer capacitor, the nanopores of sub-nanometer serve as occlusion sites for lithium and absorption sites for ions, and the pores having a larger size serve to permeate an electrolyte solution well. Therefore, it makes possible to improve charge-and-discharge repeating characteristics and output current density.

In the above method, when a microemulsion is prepared using a carbon precursor as a surfactant along with adding a metal oxide gel, a composite of the surfactant and metal oxide gel is formed by removing the solvent, and then the composite is fired, a composite consisting of carbon and metal oxide gel can be formed. This method has an advantage that nanopores in the carbon are retained well by the metal oxide gel. If desired, the metal oxide gel may be removed by means of acid or alkali.

When a low-molecular weight surfactant having a hydrophobic group consisting of a long-chain alkyl group is used as a surfactant in the above method, it is possible to manufacture a porous carbon structure in which cylindrical nanopores of uniform pore size, in the range of sub-nanometer to several nanometers or so, are arranged in a honeycomb configuration. An average pore size of the pores is preferred to be 0.1 to 10 nm, more preferably 0.3 to 5 nm. Examples of the low-molecular weight surfactant include: an anionic surfactant comprising a long-chain alkyl group to which terminal a sulfonate, phosphate or carboxylate is introduced such as sodium dodecylbenzenesulfonate; and a cationic surfactant such as a long-chain ammonium salt, a long-chain pyridinium salt or a long-chain imidazolium salt, for example, cetyltrimethylammonium chloride, cetyldimethybenzyl-ammonium chloride and cetylpyridinium bromide; a fluorine-based surfactant. When the honeycomb porous carbon is employed as the carbon negative electrode of a lithium ion secondary battery, nanopores is efficiently occluded by lithium, making it possible to achieve high capacity. When the honeycomb porous carbon is employed as the carbon electrode of an electric double layer capacitor, it is possible to increase capacity if the size of nanopores is formed as small as the ionic radius of electrolyte. The honeycomb porous carbon also has high absorption ability for a gas such as hydrogen.

In the above method, when a surfactant having two or more long-chain alkyl groups is employed, a fibrous or acicular carbon structure can be manufactured. Such a carbon structure can be employed as a gas absorption material, or filler for imparting conductivity or reinforcing. The acicular carbon can suitably used for the emitter of FED.

When a perylene derivative is used as a carbon precursor in the above method, acicular carbon or honeycomb porous carbon can be manufactured. An example of the perylene derivative includes 9,10-dosubstituted peryleneimide in which a long-chain alkyl group having an ionic group or hydrophilic group such as a hydroxyl group, carboxyl group, sulfonic acid group at a terminal, or a polyether group such as oligoethylene oxide group is introduced. When the perylene derivative is employed, formed is a structure in which columns formed by the perylene skeletons and columns of substituents such as a long-chain alkyl group or polyether group are alternately arranged. When the structure is fired, columns of substituents are selectively evaporated, thus acicular carbon or honeycomb porous carbon can be provided. In this method, a metal oxide gel such as a silica sol may be used together. In the case where a nanostructure of a carbon precursor in the presence of a surfactant in a liquid phase, performing supercritical drying is preferred because the nanostructure is not destroyed during drying.

A case where a porous structure of the present invention is applied to a precise filter in a sheet form or hollow fiber form will be described. Such a filter can be manufactured in the following manner. First, using a pattern forming material comprising a block copolymer containing a polymer chain that can be decomposed by energy beam irradiation, a sheet or a hollow fiber is manufactured by casting or melt extrusion using a mouthpiece. Alternatively, the pattern forming material may be applied by dip coating to the surface of a tube comprising a homopolymer that can be decomposed by energy beam irradiation. Then, if required, annealing is performed to form a phase-separated structure in the film. The phase-separated structure is preferred to have a continuous phase structure such as a cylindrical structure, bicontinuous structure, etc., in which the bicontinuous structure is particularly preferable in view of film strength. Bicontinuous structure includes an OBDD structure, a Gyroid structure, a T-surface structure, lamella catenoid structure, or the like. The OBDD structure or Gyroid structure is particularly preferable because of low flow resistance. The sheet or hollow fiber, in which the phase-separated structure is formed in such a manner, is irradiated with an electron beam, thereby decomposing one polymer phase in the phase-separated structure. Thereafter, the sheet or hollow fiber is etched to manufacture a filter in a sheet form or hollow fiber form.

The porous structure constituting the filter formed of a pattern forming material of the present invention is preferred to have an aggregated structure of domains each having a radius of gyration of 50 μm or less having a periodical porous structure comprising unit cells each having a radius of gyration of 10 to 500 nm. Among periodical porous structures, preferred is one having continuous pores formed by removing at least one phase in a bicontinuous phase-separated structure, and particularly preferred is a porous structure formed by removing at least one phase in a OBDD structure or Gyroid structure. Although there is not any particular limitation with respect to the pore size, it should preferably be in the range of 5 to 200 nm, more preferably 10 to 50 nm. If the pore size is too small, flow resistance will be increased, which makes it impossible to use the filter practically. If the pore size is too large, dispersion of pore size distribution will be increased, which makes it also impossible to use the filter practically.

The filter according to the present invention is more preferred to have an asymmetrical structure. Specifically, preferred is an asymmetrical film in which a thin filter layer consisting of a pattern forming material of the present invention is formed on a relatively thick, porous film having pores large in size. Such an asymmetrical structure can improve mechanical strength as well as reduce flow resistance. The thick, porous film having large-size pores can be manufactured as follows. For example, using a blend of homopolymers each having the same structure as each polymer chain constituting the pattern forming material of the present invention, a sheet or a hollow fiber is manufactured, and then at least one homopolymer is removed to form a porous film. In order to remove the homopolymer, it is possible to use methods of: simple extraction with a solvent; selective etching by RIE; irradiation with an energy beam such as an electron beam and subsequent extraction with a solvent or thermal decomposition/evaporation. Then, a pattern forming material according to the present invention is formed on the porous film by dip coating. Thereafter, using a similar method to that described above, a filter in a sheet form or hollow fiber form having an asymmetrical structure is manufactured.

Another method may be used in which a pattern forming material is formed on a tube consisting of a blend of homopolymers by dip coating, and then the tube is irradiated with energy beam and etched, thereby forming simultaneously a relatively thick porous film having large pore size of 0.5 to 5 µm or so and a thin filter layer to provide an asymmetrical structure, which is very effective in improving a permeation rate.

The filter of the present invention can be suitably used as a filtration membrane, a dialysis membrane, a gas separation membrane, a reverse osmosis membrane, an ultrafiltration membrane, a microfiltration membrane or a blood purification membrane. In most of these applications, the filter is used in the form of filter module.

A case where a porous structure of the present invention is applied to an ultrafine fiber of the order of nanometers having a thickness of 10 to 100 nm, or to a porous fiber having pores of the order of nanometers will be described. These ultrafine fiber and porous fiber can be manufactured, for example, in the following manner. First, using a pattern forming material comprising a block copolymer having a polymer chain that can be decomposed by energy beam irradiation, a precursor fiber having a diameter of 10 to 100 µm is manufactured by melt extrusion using a mouthpiece. The precursor fiber may be woven into a fabric. Then, if required, annealing is performed to form a phase-separated structure in the fiber. The phase-separated structure is preferred to have a continuous phase structure such as a sea-island structure, a cylindrical structure, a lamella structure or a bicontinuous structure. The precursor fiber or fabric in which the phase-separated structure is formed in such a manner is irradiated with an energy beam selected especially from an electron beam, γ-ray or X-ray so as to decompose one phase in the phase-separated structure, followed by etching, thus an ultrafine fiber or porous fiber is provided.

The relationship between the phase-separated structure of the pattern forming material and the ultrafine fiber or porous fiber to be manufactured is as follows. In the case of the sea-island structure, a porous fiber having closed cells is formed. In the case of the cylindrical structure, an ultrafine fiber having a thickness of the order of nanometers having a diameter of 10 to 200 nm is formed. In the case of the lamella structure, an ultrafine fiber in a form of thin piece having a thickness of 10-200 nm is formed. In the case of the bicontinuous structure, a porous fiber in which unit cells of 10 to 200 nm in size are periodically arrayed is formed.

These ultrafine fiber and porous fiber may contain, as already described, a plasticizer, an antioxidant, a light stabilizer, a coloring agent (dye or pigment), an antistatic agent, a conductive agent, a lubricant, a release agent, a flame retardant, an auxiliary flame retardant, etc.

The ultrafine fiber and porous fiber as well as a fabric prepared from these fibers has a large surface area, so that they can be used for various filters, a carrier medium for bacteria, a deodorant, an absorption material, a wiping material, a water-repellent, etc. In addition, the fabric manufactured from the fiber of the present invention has texture and pleasant feeling that cannot be found in the conventional fabric.

In the present invention, a capacitor having a high capacity can be manufactured. The method comprises the steps of: forming a film made of a blend of a polymer including a metal particle and a block copolymer or graft copolymer; allowing the film to form a lamella structure having micro polymer phases and segregating the metal particles covered with the polymer in a central portion of each polymer phase in the lamella structure; and aggregating the metal particles to form a metal layer in the central portion of each polymer phase in the lamella structure.

Figure 8A:
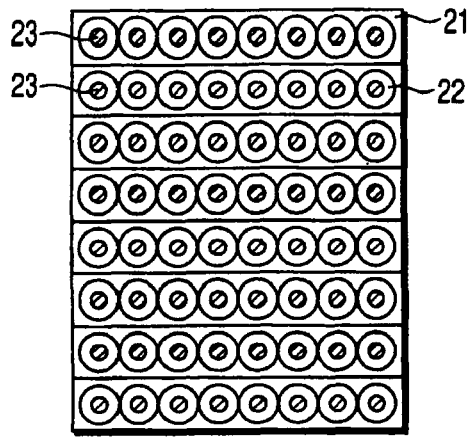
FIG. 8A is a schematic view showing a method of manufacturing a capacitor according to the present invention.
Figure 8B:
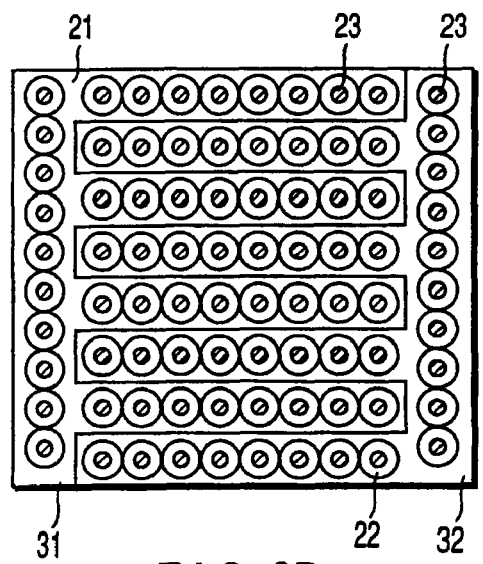
FIG. 8B is a schematic view showing a method of manufacturing a capacitor according to the present invention.
Figure 8C:
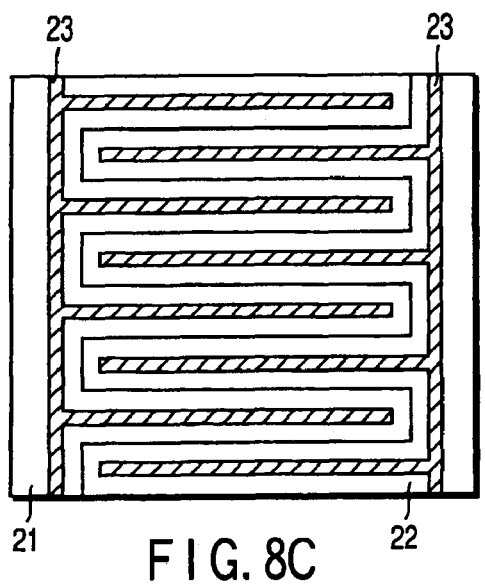
FIG. 8C is a schematic view showing a method of manufacturing a capacitor according to the present invention.

The method will be described with reference to FIGS. 8A to 8C. In these figures, the numeral 21 represents the A-B block copolymer, the numeral 22 represents the A or B homopolymer, and the numeral 22 represents the metal particle. First, the A-B block copolymer, A polymer including the metal particle and B polymer including the metal particle are blended. Use is a block copolymer having a composition ratio in the range of 70:30 to 30:70, preferably 55:45 to 45:55, so that it forms a lamella structure. The material is dissolved in a solvent, followed by casting slowly. Preferred solvent is one having a low boiling point such as THF, acetone, and toluene. The surface of the cast film is planarized, and then the film is extended with a roller so as to give a thickness of 0.1 to 1 mm or so. The film is referred to as a first film.

Further, the blend of the A homopolymer and A homopolymer including a metal particle is dissolved in a solvent to manufacture a cast film. The film is referred to as a second film. Likewise, the blend of the B homopolymer and B homopolymer including a metal particle is dissolved in a solvent to manufacture a cast film. The film is referred to as a third film.

The second film, the first film and the third film are laminated in this order, followed by annealing in an oven. A lamella structure is formed through microphase separation, thus the metal particle covered with the A homopolymer is segregated on the A phase, and the metal particle covered with the B homopolymer is segregated on the B phase, respectively, in which the metal particles are present in the central portion of each polymer phase in the lamella structure. Next, when the temperature is raised, the main chain of the polymer covering the metal particle is broken, thus the metal particles are aggregated to form a continuous metal film. In practice, it is assumed that migration and aggregation of two metal particles take place simultaneously during the annealing. Metal thin films are formed on the both surfaces of the manufactured film by sputtering to form electrodes, and then the film is cut into an arbitrary size.

The method can easily form a lamellar structure having uniform intervals. Since the microphase separation of the block copolymer is utilized, a lamella structure in which a number of layers are alternately laminated can be manufactured by only annealing. At that time, the metal can be arranged in the center portion of the layers formed via microphase separation. In addition, the lamellar structure may not cause short-circuit between metal layers. The method can make the distance between the opposite electrodes in capacitor very short as well as hold the electrodes in an even spacing. Therefore, the capacitor can accumulate many charges in a small volume, thus it exhibits very high performance compared to the conventional capacitor.

EXAMPLES

Hereinafter, the present invention will be specifically described based on examples. It should be noted that the present invention is not limited to these examples.

Synthesis Example

A diblock copolymer (1) of polystyrene (PS) and polymethyl methacrylate (PMMA) is synthesized by living anion polymerization. Molecular sieves and activated alumina are added to polystyrene monomer and polymethyl methacrylate monomer, respectively, followed by leaving to stand for two days to remove water and an inhibitor. These monomers are distilled under reduced pressure, and then the atmosphere is replaced with argon gas. Dehydrated THF (Wako Junyaku Co., Ltd.) is prepared as a reaction solvent to which metallic sodium is added as a dehydrating agent, and then reflux is performed for two days. As a polymerization initiator, sec-butyl lithium (Kanto Kagaku Co., Ltd.) is employed.

As a polymerization apparatus, a pressure reactor (Taiatsu Glass Co., Ltd.) is employed. The reaction is carefully performed under a pressurized argon atmosphere of 4 atm so as to prevent outside air from entering the reaction system. While flowing argon, the dehydrated THF and polymerization initiator are added. Then, the reaction system is cooled to −78° C. with dry ice/ethanol. A small quantity of styrene monomer is added to the reaction system. After confirming that the reaction solution turned into orange color, the reaction is continued for 30 minutes. A small quantity of the reaction solution is taken out to measure a molecular weight by gel permeation chromatography (GPC), and on the basis of the molecular weight measured, the quantity of styrene monomer to be added for obtaining a polystyrene block having a desired molecular weight is calculated. Based on the calculation, a styrene monomer is added to the reaction system and the reaction is performed for 30 minutes. A small quantity of the reaction solution is taken out, and it is confirmed by GPC that a desired molecular weight is obtained. Thereafter, a small quantity of 1,1'-diphenylethylene is added, and then a requisite quantity of methyl methacrylate monomer to obtain a polymethyl methacrylate block having a desired molecular weight is added dropwise to the reaction system and the reaction is performed for 30 minutes. A small quantity of the reaction solution is taken out, and it is confirmed by GPC that a desired molecular weight is obtained. After a small quantity of methanol is added dropwise to terminate the reaction, the reactor is opened. The reaction solution is dropped to methanol for reprecipitation, followed by filtration and drying, thereby to obtain the diblock copolymer (1).

The molecular weight of each block constituting the diblock copolymer (1) is 65,000 for polystyrene, and 13,200 for polymethyl methacrylate. Further, the molecular weight distribution (Mw/Mn) is 1.04.

In the following examples, there are some cases that a diblock copolymer of PS-PMMA other than the diblock copolymer (1) may be employed. Also, each diblock copolymer is synthesized by living anion polymerization in the same manner as the aforementioned synthesis example except that the quantities of styrene monomer and methyl methacrylate monomer are changed.

Example 1

Two wt % of the diblock copolymer (1) is dissolved in propylene glycol monoethyl ether acetate (PGMEA), followed by filtering the solution, and then an SiO substrate is spin-coated with the solution at 2,500 rpm. The substrate is heated to 110° C. for 90 seconds to evaporate the solvent. Thereafter, the substrate is placed in an oven, and annealing is performed in a nitrogen atmosphere at 210° C. for 10 minutes, subsequently at 135° C. for 10 hours. Since the temperature of 210° C. is just below a temperature that decomposition of the acrylic block takes place, the short time annealing enables to flatten the film with dissipating hysteresis after spin-coating. Further, the annealing at the temperature of about 135° C. enables to promote microphase separation of the diblock copolymer efficiently, so that a film having micro polymer phases is formed.

Reactive ion etching (RIE) is performed to the sample under the conditions of $CF_4$, 0.01 Torr, 150 W of progressive wave, and 30 W of reflected wave. Under the etching conditions, since the ratio of etch rates between PS and PMMA constituting the film having micro polymer phases is 1:4 or more, PMMA is selectively etched and further the exposed underlayer is etched by use of the remaining PS pattern as a mask. Thereafter, ashing is performed to the sample under the conditions of $O_2$, 0.01 Torr, 150 W of progressive wave, and 30 W of reflected wave to remove the organic substance (the mask formed of PS).

As a result, holes having a diameter of 12 nm and a depth of 15 nm are formed over the entire surface of the SiO substrate having a diameter of 3 inches at a density of about 700 $\mu m^2$ and at approximately regular intervals. The substrate can be used as a substrate for a hard disk.

In addition, a film having micro polymer phases is formed in the same manner as described above except that 10 wt % of dioctyl phthalate as a plasticizer is added to the diblock copolymer (1) and the heat treatment conditions are changed to at 210° C. for 10 minutes, subsequently at 135° C. for one hour, and RIE is performed under the same conditions as described above. As a result, a pattern of holes can be formed on the substrate similar to those described above. Thus, it is possible to greatly shorten the heat treatment time by adding the plasticizer to the diblock copolymer.

Example 2

A film having micro polymer phases is formed on a glass substrate in the same manner as described in Example 1. The film having micro polymer phases is irradiated with an electron beam over the entire surface under the conditions of an accelerating voltage of 50 kV and an exposure dose of 100 $\mu C/cm^2$, thus the main chain of the PMMA is cut. The film having micro polymer phases is developed with a developer (3:7 mixed solution of MIBK and IPA) for an electron beam resist for 60 seconds, followed by rinsing with IPA, thus the PMMA whose main chain is cut by electron beam is removed. Then, using a pattern mainly consisting of remaining PS as a mask, the substrate is etched with hydrofluoric acid for one minute. Thereafter, the substrate is subjected to an ultrasonic washing in acetone, thus the remaining mask is removed.

As a result, holes having a diameter of 15 nm and a depth of 12 nm are formed over the entire surface of the glass substrate at a density of about 700 $\mu m^2$ and at approximately regular intervals. By making use of this method, the whole steps can be performed by wet processes. As in the case of Example 1, the substrate can be used as a substrate for a hard disk.

When the pattern formation is performed in the same manner as described above except that the substrate is irradiated with X-ray having a wavelength of 0.154 nm under an exposure dose of 1 $J/cm^2$ in place of the electron beam irradiation, holes having a diameter of 15 nm and a depth of 12 nm are formed over the entire surface of the glass substrate at a density of about 700/μm² and at approximately regular intervals.

Example 3

Using a diblock copolymer (2) (polystyrene: Mw=10,600, polymethyl methacrylate: Mw=35,800; Mw/Mn=1.07), a film having micro polymer phases is formed on a magnetic film formed on a substrate having a diameter of 3 inches in the same manner as described in Example 1. The film having micro polymer phases is irradiated with an electron beam to cut the main chain of PMMA. The film having micro polymer phases is developed with a developer for electron beam resist, thus PMMA whose main chain is cut by electron beam is removed. Then, using a pattern mainly consisting of remaining PS as a mask, the substrate is etched with hydrochloric acid for one minute. Thereafter, the substrate is subjected to an ultrasonic washing in acetone, thus the remaining mask is removed.

As a result, projections of magnetic film having a diameter of 15 nm and a height of 12 nm are formed over the entire surface of the substrate at a density of about 650/μm² and at approximately regular intervals. By making use of this method, a magnetic film can be left remained in an island configuration by directly processing the film in wet processes.

Example 4

A quartz substrate is spin-coated with a polystyrene film having a thickness of 500 nm as a lower pattern transfer film, on which an aluminum film having a thickness of 10 nm is deposited as an upper pattern transfer film. The aluminum film is spin-coated with diblock copolymer (3) (polystyrene: Mw=144,600, polymethyl methacrylate: Mw=70,700; Mw/Mn=1.07) having a thickness of 80 nm. Then, annealing is performed in the same manner as in Example 1 to form a film having micro polymer phases.

RIE is performed to the sample under the conditions of $CF_4$, 0.01 Torr, 150 W of progressive wave, and 30 W of reflected wave, thus PMMA in the film having micro polymer phases is etched selectively and further the aluminum film is etched by use of remaining PS pattern as a mask. Thereafter, ashing is performed to the sample under the conditions of $O_2$, 0.01 Torr, 150 W of progressive wave, and 30 W of reflected wave to remove the mask consisting of remaining PS and the polystyrene film exposed at the portions where the aluminum film has been etched. RIE is performed again to the sample under the conditions of $CF_4$, 0.01 Torr, 150 W of progressive wave, and 30 W of reflected wave, thus the upper aluminum film and the exposed portions of the quartz substrate is etched. Ashing is performed again to the sample under the conditions of $O_2$, 0.01 Torr, 150 W of progressive wave, and 30 W of reflected wave to etch the remaining polystyrene.

As a result, holes having a very high aspect ratio, i.e., a diameter of 110 nm and a depth of 1200 nm are formed over the entire surface of the quartz substrate at a density of 35/μm².

Example 5

An $SiO_2$ film having a thickness of 500 nm is formed on a silicon wafer, and then the $SiO_2$ film is coated with a toluene solution of polysilane (Mw=12000, x=0.4) represented by the following chemical formula, followed by baking to form a pattern transfer film consisting of polysilane having a thickness of 100 nm.

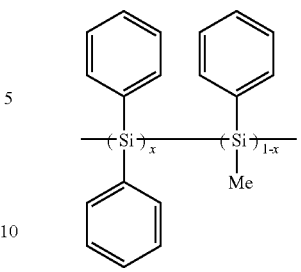

The pattern transfer film is coated with a diblock copolymer (4) (polystyrene: Mw=12,000, polymethyl methacrylate: Mw=28000), followed by baking at 90° C. for two minutes to form a 40 nm-thick film having micro polymer phases.

RIE is performed to the sample under the conditions of $CF_4$, 0.01 Torr, 150 W of progressive wave, and 30 W of reflected wave, thus PMMA in the film having micro polymer phases is etched selectively. Then, the polysilane film is etched by use of the remaining PS pattern as a mask under the conditions of HBr flow rate of 50 sccm, vacuum degree of 80 mTorr and excitation power of 200 W to transfer the pattern. Since the mask consisting of PS is left remained on the remaining polysilane film, it is found that there is a sufficient etch rate ratio between them. Then, by use of the pattern of polysilane film as a mask, the $SiO_2$ film is etched under the conditions of $C_4F_8$ flow rate of 50 sccm, CO flow rate of 10 sccm, Ar flow rate of 100 sccm, $O_2$ flow rate of 3 sccm, vacuum degree of 10 mTorr, and excitation power of 200 W to transfer the pattern. Since the polysilane film is left remained on the remaining $SiO_2$ film, it is found that the polysilane film is sufficient etch resistance. The remaining polysilane film can be easily removed with an aqueous organoalkali solution or a diluted hydrofluoric acid solution.

Example 6

A gold electrode is deposited on 10-inch glass substrate used for a substrate of a field emission display, an $SiO_2$ film as a lower pattern transfer film is applied to the entire surface of the gold electrode, and further an aluminum film having a thickness of 20 nm as an upper pattern transfer film is deposited on the lower pattern transfer film. Then, a diblock copolymer (5) (polystyrene: Mw=127,700, polymethyl methacrylate: Mw=1,103,000; Mw/Mn=1.30) and polystyrene homopolymer (Mw=45000, Mw/Mn=1.07) are blended together at a weight ratio of 21:79, then the blend is dissolved in ethylcellosolve acetate (ECA) at a solid content of 5 wt %, followed by filtration. The aluminum film is spin-coated with the solution, followed by drying at 110° C. to form a polymer film having a thickness of 970 nm. In the same manner as in Example 1, the substrate is placed in an oven, and annealing is performed in a nitrogen atmosphere at 210° C. for 10 minutes, subsequently at 135% for 10 hours to form a film having micro polymer phases.

RIE is performed to the sample under the conditions of $CF_4$, 0.01 Torr, 150 W of progressive wave, and 30 W of reflected wave, thus PMMA in the film having micro polymer phases is etched selectively and further the aluminum film is etched using the remaining PS pattern as a mask to transfer the pattern. Using the pattern of PS and the pattern of aluminum film as a mask, exposed portions of the SiO film are etched with hydrofluoric acid to transfer the pattern. Since the pattern of aluminum film is covered with a pattern of PS, it is not damaged. Thereafter, ashing is performed with an $O_2$ asher to remove the remaining PS pattern.

As a result, holes having a diameter of about 840 nm can be formed at a density of about 23000 per pixel of 300 μm×100 μm. Distribution of hole size is found uniform within the range of ±10%. This is attributed to the uniformity in molecular weight of the diblock copolymer. Since the diblock copolymer exists in the sea of styrene homopolymer in the polymer film employed as a mask, the arrangement of formed holes is found random. Therefore, it is advantageous in application to a display to prevent an interference fringe due to regular arrangement of electrodes.

The structure formed by the method in this example can be applied to a field emission display (FED) as well as a gate electrode of a porous gate transistor display, etc.

In addition, a film having micro polymer phases is formed in the same manner as described above except that 10 wt % of dioctyl phthalate is added as a plasticizer to the blend of diblock copolymer and polystyrene homopolymer and the heat treatment conditions are changed to at 210° C. for 10 minutes, subsequently at 135° C. for one hour, and RIE is performed under the same conditions as described above. As a result, a pattern of holes can be formed on the substrate similar to those described above. Thus, it is possible to greatly shorten the heat treatment time by addition of the plasticizer.

Example 7

A 10 wt % solution of a diblock copolymer (6) (polystyrene: Mw=135,000, PMMA: Mw=61,000, Mw/Mn=1.10) in THF is poured in a Teflon Petri dish, which solution is allowed to dry slowly over 14 days in a desiccator to form a film. The thickness of the film is 0.2 mm. The film is further vacuum dried for 3 days. An ultra-thin film is cut out of this film to observe with a transmission electron microscope. As a result, it is confirmed that the PS phase and the PMMA phase are respectively formed continuously into a three-dimensional bicontinuous structure.

The film is irradiated with an electron beam under the conditions of accelerating voltage of 2 MV and exposure dose of 10 kGy, and then the film is developed with a developer for electron beam resist, which is reduced is solubility of PS by addition of IPA, followed by vacuum drying. An ultra-thin film is cut out of the film to observe again with a transmission electron microscope. As a result, it is confirmed that the PMMA phase is removed and the PS phase is formed into a spongy continuous structure. It is confirmed that the structure is almost the same as the three-dimensional bicontinuous structure observed first.

The film is constituted by a PS phase that is three-dimensionally continued with interposing regularly continued cells of the order of nanometers. Such a structure can be applied to a separator for a polymer battery or capacitor.

Example 8

A diblock copolymer (1) is dissolved by 1 wt % in methylene chloride, followed by filtering, and then 1 wt % based on the weight of the polymer of tetrabutylammonium hexachloroplatinate (IV) is added. The solution is cast on a SiO substrate having a diameter of 3 inches to form a film having a thickness of 20 nm. The substrate is heated at 110° C. for 90 seconds to evaporate the solvent. Then, the substrate is placed in an oven and subjected to annealing at 150° C. for 3 hours in a nitrogen atmosphere to form a film having micro polymer phases. At that time, tetrabutylammonium hexachloroplatinate (IV) is segregated in PMMA. After the film having micro polymer phases is rinsed with formaldehyde reducing solution, the film is again subjected to annealing at 200° C. for one hour, thereby reducing the tetrabutylammonium hexachloroplatinate (IV) to platinum.

RIE is performed to the sample under the conditions of $CF_4$, 0.01 Torr, 150 W of progressive wave, and 30 W of reflected wave, thus PMMA is etched selectively and further the underlying SiO substrate is etched by use of the remaining PS pattern as a mask. Thereafter, ashing is performed under the conditions of $O_2$, 0.01 Torr, 150 W of progressive wave, and 30 W of reflected wave to remove the remaining PS mask.

As a result, holes having a diameter of 15 nm and a depth of 10 nm are formed over the entire surface of the SiO substrate having a diameter of 3 inches at a density of about 2000 μm$^2$ and at approximately regular intervals. Furthermore, platinum particles are deposited at the bottoms of the holes. By making use of the substrate, a magnetic material, for example, can be grown over the platinum particles deposited at the bottoms of the holes as nuclei, and therefore the substrate is applicable to a substrate for a hard disk.

Example 9

A diblock copolymer (1) is dissolved in DMF by 1 wt %, followed by filtering, and then a DMF solution, in which 1 wt % based on the weight of the polymer of tetrabutylammonium hexachloroplatinate (IV) is dissolved, is added and mixed homogeneously. A DMF solution of sodium borate hydride is added to the solution to reduce the tetrabutylammonium hexachloroplatinate (IV), thereby precipitating platinum particles having an average particle size of 4 nm. A SiO substrate having a diameter of 3 inches is spin-coated with the solution to form a film having a thickness of 25 nm. The substrate is heated at 110° C. for 90 seconds to evaporate the solvent. Then, the substrate is placed in an oven and subjected to annealing in a nitrogen atmosphere at 200° C. for 3 hours to form a film having micro polymer phases. At that time, platinum particles are segregated in PMMA.

RIE is performed to the sample under the conditions of $CF_4$, 0.01 Torr, 150 W of progressive wave, and 30 W of reflected wave, thus PMMA is selectively etched and further the underlying SiO substrate is etched by use of the remaining PS pattern as a mask. Thereafter, ashing is performed under the conditions of $O_2$, 0.01 Torr, 150 W of progressive wave, and 30 W of reflected wave, thus the remaining PS mask is removed.

As a result, holes having a diameter of 17 nm and a depth of 10 nm are formed over the entire surface of the SiO substrate having a diameter of 3 inches at a density of about 2000 μm$^2$ and at approximately regular intervals. Furthermore, platinum particles are deposited at the bottoms of the holes. By making use of the substrate, a magnetic material, for example, can be grown over the platinum particles deposited at the bottoms of the holes as nuclei, and therefore the substrate is applicable to a substrate for a hard disk.

Example 10

A diblock copolymer (1) is dissolved by 1 wt % in methylene chloride, followed by filtering, and then 1 wt % based on the weight of the polymer of tetrabromogold(III) cetylpyridinium salt is added. The solution is cast on a SiO substrate having a diameter of 3 inches to form a film having a thickness of 20 nm. The substrate is heated at 110° C. for 90 seconds to evaporate the solvent. Then, the substrate is place in an oven and subjected to annealing in a nitrogen atmosphere by raising the temperature from 100° C. to 200° C. over 3 hours to form a film having micro polymer phases. As a result of the annealing, the tetrabromogold(III) cetylpyridinium salt is reduced, thereby precipitating gold fine particles. At that time, the gold fine particles are segregated in PMMA.

RIE is performed to the sample under the conditions of $CF_4$, 0.01 Torr, 150 W of progressive wave, and 30 W of reflected wave, thus PMMA is selectively etched and further the underlying SiO substrate is etched by use of the remaining PS pattern as a mask. Thereafter, ashing is performed under the conditions of $O_2$, 0.01 Torr, 150 W of progressive wave, and 30 W of reflected wave to remove the remaining PS mask.

As a result, holes having a diameter of 15 nm and a depth of 10 nm are formed over the entire surface of the SiO substrate having a diameter of 3 inches at a density of about $2000/\mu m^2$ and at approximately regular intervals. Furthermore, gold particles are deposited at the bottoms of the holes. It is also possible to produce platinum fine particles in the same manner as described above. By making use of the substrate, a magnetic material, for example, can be grown over the platinum particles deposited at the bottoms of the holes as nuclei, and therefore the substrate is applicable to a substrate for a hard disk.

Example 11

Two kinds of telechelic polymers, i.e., carboxyl-terminated polystyrene (Mw=83,000, Mw/Mn=1.08) represented by the chemical formula (11a) is blended with amino-terminated polymethyl methacrylate (Mw=19,600, Mw/Mn=1.03) represented by the chemical formula (11b) in equal moles, and then, dissolved in PGMEA to obtain a 2 wt % solution. The polystyrene and PMMA are allowed to react with each other in the solution to prepare a diblock copolymer. The solution is filtered, and then applied to a SiO substrate having a diameter of 3 inches by spin coating at a rate of 2,500 rpm. The substrate is heated at 110 for 90 seconds to evaporate the solvent. Thereafter, the substrate is placed in an oven and subjected to annealing in a nitrogen atmosphere at 210° C. for 10 minutes, subsequently at 135° C. for 10 hours to form a film having micro polymer phases.

RIE is performed to the sample under the conditions of $CF_4$, 0.01 Torr, 150 W of progressive wave, and 30 W of reflected wave, thus PMMA in the film having micro polymer phases is etched selectively and further the underlying substrate is etched with the remaining PS pattern being used as a mask. Thereafter, ashing is performed under the conditions of $O_2$, 0.01 Torr, 150 W of progressive wave, and 30 W of reflected wave to remove the remaining PS mask.

As a result, holes having a diameter of 25 nm and a depth of 16 nm are formed over the entire surface of the SiO substrate having a diameter of 3 inches at a density of about $1000 \mu m^2$ and at approximately regular intervals.

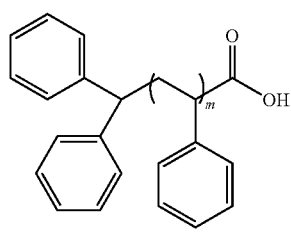

(11a)

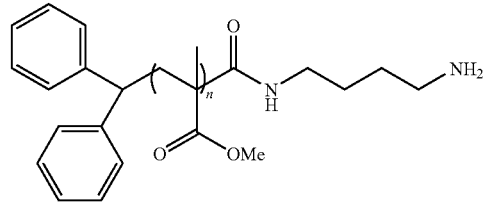

(11b)

Example 12

Dimethylchlorosilyl-terminated polystyrene (Mw=85,000, Mw/Mn=1.04) represented by the chemical formula (12a) is blended with hydroxyl-terminated polydimethyl siloxane (Mw=16,800, Mw/Mn=1.10) represented by the chemical formula (12b) in equal moles, to which a small quantity of triethyl amine is added, and then the blend is dissolved in PGMEA to obtain a 2 wt % solution. In the solution, polystyrene and polydimethyl siloxane are allowed to react with each other in the presence of trimethyl amine to produce a diblock copolymer. The solution is filtered and then, is applied to a SiO substrate having a diameter of 3 inches by spin coating at a rate of 2,500 rpm. The substrate is heated at 110° C. for 90 seconds to evaporate the solvent. Then, the substrate is placed in an oven and subjected to annealing in a nitrogen atmosphere at 210° C. for 10 minutes, subsequently at 135° C. for 10 hours to forming a film having micro polymer phases.

RIE is performed to the sample under the conditions of $CF_4$, 0.01 Torr, 150 W of progressive wave, and 30 W of reflected wave. Under the etching conditions, the etch rate ratio between PS and polydimethyl siloxane comes to be 1:4 or more. As a result, only the polydimethyl siloxane in the film having micro polymer phases is selectively etched, and further the underlying SiO substrate is etched with using the remaining PS pattern as a mask. Thereafter, ashing is performed under the conditions of $O_2$, 0.01 Torr, 150 W of progressive wave, and 30 W of reflected wave to remove the remaining PS mask.

As a result, holes having a diameter of 25 nm and a depth of 17 nm are formed over the entire surface of the SiO substrate having a diameter of 3 inches at a density of about $1000 \mu m^2$ and at approximately regular intervals.

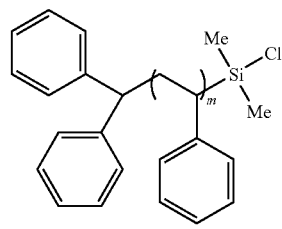

(12a)

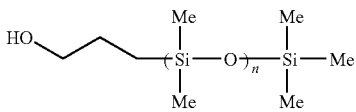

(12b)

Example 13

A diblock copolymer of polyphenylmethyl silane-polystyrene (polyphenylmethyl silane: Mw=12,000, polystyrene:

Mw=48,000, Mw/Mn=2.1) is synthesized by the method of S. Demoustier-Champagne et al. (Journal of Polymer Science: Part A: Polymer Chemistry, Vol. 31, 2009-2014 (1993)).

After 1.5 wt % of the diblock copolymer is dissolved in toluene and filtered, the solution is applied to an SiO substrate having a diameter of 3 inches by spin coating at a rate of 2,500 rpm. The substrate is heated at 110° C. for 90 seconds to evaporate the solvent. Then, the substrate is placed in an oven and subjected to annealing in a nitrogen atmosphere at 210° C. for 10 minutes, subsequently at 135° C. for 10 hours to form a film having micro polymer phases.

RIE is performed to the sample under the conditions of $CF_4$, 0.01 Torr, 150 W of progressive wave, and 30 W of reflected wave. Under the etching conditions, the etch rate ratio between PS and polysilane comes to be 1:4 or more. As a result, only the polysilane in the film having micro polymer phases is selectively etched, and further the underlying SiO substrate is etched with using the remaining PS pattern as a mask. Then, ashing is performed under the conditions of $O_2$, 0.01 Torr, 150 W of progressive wave, and 30 W of reflected wave to remove the remaining PS mask.

As a result, holes having a diameter of 12 nm and a depth of 10 nm are formed over the entire surface of the SiO substrate having a diameter of 3 inches at a density of about 2400/$\mu m^2$ and at approximately regular intervals.

Example 14

Using masked disilane represented by the chemical formula (14a) as a monomer and phenyl methacrylate represented by the chemical formula (14b), a diblock copolymer represented by the chemical formula (14c) is synthesized by living anion polymerization. Specifically, the polymerization is performed in a THF solution using sec-butyl lithium as an initiator, setting the reaction temperature to −78° C. and adding the monomer successively. The diblock copolymer is found to be 70,500 in weight average molecular weight (Mw), Mw/Mn=1.2, 14,500 in molecular weight of polysilane block, and 56,000 in molecular weight of polyphenyl methacrylate block.

After 1.5% weight of the diblock copolymer is dissolved in toluene and filtered, the solution is applied to a SiO substrate having a diameter of 3 inches by spin coating at a rate of 2,500 rpm. The substrate is heated at 110 for 90 seconds to evaporate the solvent. Then, the substrate is placed in an oven and subjected to annealing in a nitrogen atmosphere at 210% for 10 minutes, subsequently at 135° C. for 10 hours to form a film having micro polymer phases.

RIE is performed to the sample under the conditions of $CF_4$, 0.01 Torr, 150 W of progressive wave, and 30 W of reflected wave. Under the etching conditions, only the polysilane in the film having micro polymer phases is selectively etched, and further the underlying SiO substrate is etched with using the remaining polyphenyl methacrylate pattern as a mask. Thereafter, ashing is performed under the conditions of $O_2$, 0.01 Torr, 150 W of progressive wave, and 30 W of reflected wave to remove the remaining polyphenyl methacrylate.

As a result, holes having a diameter of 14 nm and a depth of 10 nm are formed over the entire surface of the SiO substrate having a diameter of 3 inches at a density of about 2400 $\mu m^2$ and at approximately regular intervals.

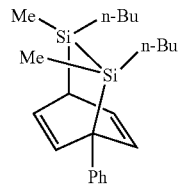

(14a)

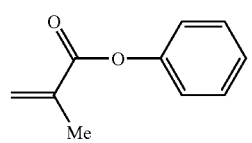

(14b)

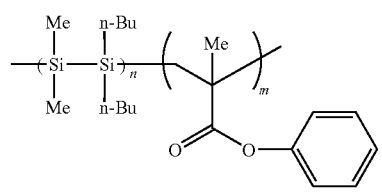

(14c)

Example 15

Styrene-terminated polyethylene oxide macromer represented by the chemical formula (15a) (Mw=14,100, Mw/Mn=1.04) and styrene are dissolved in THF, to which solution AIBN as a radical initiator is added, and then the resultant mixture is heated in an argon atmosphere at 60° C. for 60 hours for radical polymerization to synthesize a graft copolymer. This graft copolymer is found to be 101,000 in weight average molecular weight (Mw), Mw/Mn=2.1, 16,400 in molecular weight of styrene chain, and 84,600 in molecular weight of polyethylene oxide macromer unit.

After 2 wt % of the graft copolymer is dissolved in ethyl lactate and filtered, the solution is applied to an SiO substrate having a diameter of 3 inches by spin coating at a rate of 2,500 rpm. The substrate is heated at 110° C. over 90 seconds to evaporate the solvent. Then, the substrate is placed in an oven and subjected to annealing in a nitrogen atmosphere at 210% for 10 minutes, subsequently at 135% for 10 hours to form a film having micro polymer phases.

RIE is performed to the sample under the conditions of $CF_4$, 0.01 Torr, 150 W of progressive wave, and 30 W of reflected wave. Under the conditions, only the polyethylene oxide in the film having micro polymer phases is selectively etched, and further the underlying SiO substrate is etched with using the remaining PS pattern as a mask. Then, ashing is performed under the conditions of $O_2$, 0.01 Torr, 150 W of progressive wave, and 30 W of reflected wave to remove the remaining PS mask.

As a result, innumerable projections having a diameter of 18 nm and a height of 10 nm are formed over the entire surface of the substrate.

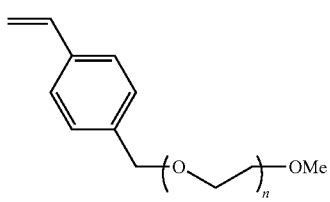

(15a)

Example 16

An electrolyte separator for electrochemical cell is manufactured as follows.

First, a diblock copolymer is synthesized. To anhydrous THF distilled in the presence of metallic sodium, α-styryl lithium is added as an initiator, and isoprene and methyl methacrylate are successively added, thereby synthesizing a diblock copolymer comprising a polyisoprene chain and a polymethyl methacrylate chain. The diblock copolymer is found to be 81,000 in weight average molecular weight (Mw), Mw/Mn=1.3, and 67% in weight fraction of polyisoprene unit.

A solution of the diblock copolymer is prepared and formed into a film by casting. The film is annealed under a nitrogen gas flow at 130° C. for 5 hours to form a structure having micro polymer phases. When the structure having micro polymer phases is observed with TEM, a Gyroid structure having openings of about 40 nm in size is formed.

The film having a Gyroid structure is irradiated with an electron beam under the conditions of 2 MV in accelerating voltage and 10 kGy in exposure dose, thereby cutting the main chain of the polymethacrylate phase, and, at the same time, cross-linking the polyisoprene phase (gelation). The film is rinsed with a mixed solvent of MIBK and isopropyl alcohol (volume ratio: 3.7) to remove the polymethacrylate phase. When the film is observed with TEM, it is confirmed that the film retains the Gyroid structure and is porous with continuous pores.

The porous film is impregnated with a 1M solution of LiClO$_4$ (anhydride) in propylene carbonate and punched out into a disk having a diameter of 0.5 cm to provide an electrolyte-impregnated porous film having a thickness of about 50 μm. The electrolyte-impregnated porous film is sandwiched between platinum electrodes to give a cell, which is measured for AC impedance using an impedance gain phase analyzer 1260 (Schlumberger Instruments Co., Ltd.) at room temperature and at a frequency of 30 MHz to 0.05 Hz. Thus, ion conductivity of the cell is determined from σ=(1/R) (d/s), where R is electric resistance of the film given by the measured AC impedance; s (cm$^2$) is the area of the film; and d (cm) is the thickness of the film. The porous film exhibits good ion conductivity of 4.2 mScm$^{-1}$ at 25° C. The porous film holds the electrolyte solution well, and hence, no liquid leakage occurs.

Further, an electrolyte-impregnated porous film is prepared in the same manner as described above except that 3 wt %, based on the diblock copolymer, of silica fine particles (Tokuseal P, Tokuyama Soda Co., Ltd.) is dispersed in the solution of diblock copolymer. The resultant porous film exhibits good ion conductivity of 4.5 mScm$^{-1}$ at 25° C.

It is found from these results that the electrolyte-impregnated porous film in this example has an excellent property useful for an electrolyte separator for an electrochemical cell such as a lithium ion secondary battery, and for a dye-sensitizing photovoltaic cell such as an electrochromic cell and a Gratzer cell.

Example 17

Using the same diblock copolymer comprising polyisoprene chain and polymethyl methacrylate chain as used in Example 16, an electrolyte separator for electrochemical cell is manufactured by melt extrusion molding as described below.

First, a little amount (about 1 wt % based on the polymer) of a vulcanizing agent is added to the diblock copolymer, and then the copolymer is dissolved in dimethylformamide (DMF) to form a stock solution for extrusion molding. The viscosity of the stock solution is 2400 mPaòs at 40° C. The stock solution is ejected from a sheet die having a rectangular nozzle of 60 μm in slit width into a 40% solution of DMF, thereby manufacturing a diblock copolymer sheet. The sheet is annealed under a nitrogen gas flow at 130° C. for 5 hours to give a structure having micro polymer phases. Thereafter, the sheet is annealed at 150° C. for 5 hours to cross-link the polyisoprene chain. The sheet is irradiated with an electron beam under the conditions of 2 MV in accelerating voltage and 10 kGy in exposure dose. The sheet is rinsed with a mixed solvent of MIBK and isopropyl alcohol (volume ratio: 3.7) to obtain a porous sheet.

The porous sheet is impregnated with a 1M solution of LiClO$_4$ (anhydride) in propylene carbonate, and then punched out in to a disk having a diameter of 0.5 cm to provide an electrolyte-impregnated porous sheet having a thickness of about 50 μm. When the electrolyte-impregnated porous sheet is measured for ion conductivity of in the same manner as in Example 16, it exhibits good ion conductivity of 4.6 mScm$^{-1}$.

Example 18

Using the same diblock copolymer comprising polyisoprene chain and polymethyl methacrylate chain as used in Example 16, an electrolyte separator for electrochemical cell is manufactured by melt extrusion molding as described below.

A mixture of the diblock copolymer added with 2 wt % of a phenol-based antioxidant (Sumilizer BP-76, Sumitomo Kagaku Kogyo Co., Ltd.) is kneaded at 180% to prepare pellets. The pellets are fed to an extruder and melt at 190° C., and then ejected from a sheet die having a rectangular nozzle to manufacture a diblock copolymer sheet. The sheet is annealed under a nitrogen gas flow at 130 for 5 hours, and then irradiated with an electron beam under the conditions of 2 MV in accelerating voltage and 10 kGy in exposure dose. The sheet is rinsed with a mixed solvent of MIBK and isopropyl alcohol (volume ratio: 3.7) to obtain a porous sheet.

The porous film is impregnated with a 1M solution of LiClO$_4$ (anhydride) in propylene carbonate, and the punched out into a disk having a diameter of 0.5 cm to provide an electrolyte-impregnated porous sheet having a thickness of about 50 μm. When the electrolyte-impregnated porous sheet is measured for ion conductivity in the same manner as in Example 16, it exhibits good ion conductivity of 4.1 mScm$^{-1}$.

Example 19

A hollow fiber filter is manufactured as follows.

A diblock copolymer (7) of polystyrene (PS) and polymethyl methacrylate (PMMA) (Mw=75,000, weight ratio of polystyrene unit=68%, Mw/Mn=1.03) is dissolved in propylene glycol methyl ether acetate (PGMEA) to prepare a solution. A hollow fiber made of polymethyl methacrylate is dip-coated with the solution. After being air-dried at 70° C., the hollow fiber is annealed under a nitrogen gas flow at 135% for 10 hours. Thereafter, the hollow fiber is irradiated with an electron beam under the conditions of 2 MV in accelerating voltage and 10 kGy in exposure dose. The hollow fiber is rinsed with a mixed solvent of MIBK and isopropyl alcohol (volume ratio: 3.7) to provide a porous hollow fiber. The resultant porous hollow fiber has an inner diameter of 500 μm and an outer diameter of 600 μm, and the side wall thereof is made porous to which an OBDD type phase-separated structure of 35 nm in pore size is transferred.

Example 20

A hollow fiber filter is manufactured as follows.
A polymer blend of polystyrene (Mw=51,000, Mw/Mn=1.03) and polymethyl methacrylate (Mw=72,000, Mw/Mn=1.06) (weight ratio=6:4) is dissolved in PGMEA to prepare a solution. A hollow fiber made of polymethyl methacrylate is dip-coated with the solution. After being air-dried at 70° C., the hollow fiber is annealed under a nitrogen gas flow at 135° C. for one hour to form a covering film having a thickness of 45 μm. Further, a solution of the diblock copolymer (7) of PS-PMMA in PGMEA, which is the same as that employed in Example 19, is prepared. The above hollow fiber is dip-coated with the solution. The hollow fiber is air-dried to form a covering film having a thickness of 5 μm. The hollow fiber is annealed under a nitrogen gas flow at 135° C. for 10 hours. Thereafter, the hollow fiber is irradiated with an electron beam under the conditions of 2 MV in accelerating voltage and 10 kGy in exposure dose. The hollow fiber is rinsed with a mixed solvent of MIBK and isopropyl alcohol (volume ratio: 3.7) to provide a porous hollow fiber. The resultant porous hollow fiber has an inner diameter of 500 μm and an outer diameter of 600 μm, and the side wall thereof has an asymmetrical film structure composed by an outer layer, to which an OBDD type phase-separated structure of 35 nm in pore size is transferred, and a porous inner layer having continuous pores of about 0.5 to 1 μm in pore size.

Example 21

A diblock copolymer of polystyrene (PS) and poly-tert-butyl acrylate (PtBA) is prepared. Then, 2 wt % of the diblock copolymer is dissolved in PGMEA. Naphthylimidyl trifluoromethane sulfonate as a photo-acid generator is added to the solution at a ratio of 1.5 wt % based on the diblock copolymer. A glass substrate is spin-coated with the solution, and the dried on a hot plate at 110° C. for 3 minutes to form a film having a thickness of 100 nm.
The glass substrate is set to a stepper, and then the diblock copolymer film is exposed with an i-line (365 nm). In the exposed portions, acid is generated from the naphthylimidyl trifluoromethane sulfonate, with which acid as a catalyst the tertiary butyl group of PtBA is decomposed, and hence the PtBA is turned into polyacrylic acid. The glass substrate is placed in an oven and subjected to annealing at 160° C. for one hour, thereby forming a structure having micro polymer phases in the film.
Next, RIE with $CF_4$ gas is performed. The microdomains of polyacrylic acid can be easily etched in the exposed portions, and further the underlying glass substrate portion is also etched, but PS is left unetched. In the unexposed portion, both PS and PtBA are left unetched. As a result, a pattern of holes having a diameter of about 90 nm can be formed only in the exposed portions.

Example 22

A diblock copolymer of polystyrene (PS) and polymethyl methacrylate (PMMA) is prepared. Then, 2 wt % of the diblock copolymer is dissolved in PGMEA. A glass substrate is spin-coated with the solution and dried on a hot plate at 110° C. for 3 minutes to form a film having a thickness of 100 nm. The glass substrate is placed in an oven and annealed in a nitrogen atmosphere at 210° C. for 10 minutes, subsequently at 135% for 10 hours, thereby forming a structure having micro polymer phases in the film.
The glass substrate is set to an electron beam irradiation apparatus (EX-8D, Toshiba Co., Ltd.) and the diblock copolymer film is exposed to an electron beam to cut the main chain of the PMMA. The film is developed with a developer (a 3:7 mixed solution of MIBK and IPA) for an electron beam resist. In the exposed portions, PMMA whose main chain is cut is etched, but PS is left unetched. In the unexposed portions, both PS and PtBA are left unetched. Next, the glass substrate at portions exposed to outside is etched with hydrofluoric acid for one minute using the pattern of remaining polymer as a mask. Thereafter, the substrate is subjected to an ultrasonic washing in acetone, thereby removing the pattern of remaining polymer. As a result, a pattern of holes having a diameter of about 90 nm can be formed only in the exposed portions.

Example 23

A film having micro polymer phases is formed on a 3-inch SiO substrate by annealing in a nitrogen gas atmosphere in the same manner as described in Example 1 except that 0.1 wt %, based on the diblock copolymer, of a phenol-based antioxidant (Sumilizer BP-101, Sumitomo Kagaku Kogyo Co., Ltd.) is added to a solution of the diblock copolymer (1).
When the annealed film having micro polymer phases is measured for infrared absorption spectrum, chemical denaturing such as oxidation resulting from annealing is found suppressed in the film having micro polymer phases.
Thereafter, in the same manner as described in Example 1, the SiO substrate is etched using the film having micro polymer phases as a mask. As a result, holes having a diameter of 12 nm and a depth of 18 nm can be formed over the entire surface of the SiO substrate at a density of about 2000 $\mu m^2$ and at approximately regular intervals. As compared with the holes of Example 1, the depth of holes formed in this example is deeper and dispersion of intervals between holes is reduced by half.
As described above, addition of an antioxidant can suppress the oxidative denaturing of the diblock copolymer resulting from annealing, making it possible to improve pattern-forming capability and etching properties of the diblock copolymer.
Further, even if annealing is performed in air atmosphere, it is possible to form holes having a diameter of 12 nm and a depth of 18 nm over the entire surface of the SiO substrate at a density of about 2000 $\mu m^2$ and at approximately regular intervals like the above case. On the other hand, in the case where a diblock copolymer containing no antioxidant is annealed in air atmosphere to form a film having micro polymer phases, the depth of holes formed in the substrate is as shallow as 10 nm and the intervals between holes are relatively uneven. As described above, when an antioxidant is added to a diblock copolymer, it is possible to form a good pattern even in air as that given under nitrogen gas flow.

Further, pattern formation is performed in the same manner as described above using a phosphorus-based antioxidant such as Sumilizer-P-16 and Adecastab PEP-24G; sulfur-based antioxidant such as Sumilizer-TPM and Sumilizer-TP-D (all available from Sumitomo Kagaku Kogyo Co., Ltd.); and an HALS-type antioxidant such as Sanol LS-770 (Sankyo Co., Ltd.) in place of the phenol-based antioxidant. Even when any of these antioxidants is used, it is possible to increase the depth of the holes by about 20% and to suppress dispersion in intervals between the holes as compared with those obtained in Example 1 irrespective of whether the annealing atmosphere is nitrogen or air.

Example 24

A film having micro polymer phases is formed on a 3-inch SiO substrate and then, a pattern is formed in the same manner as described in Example 2 except that 0.1 wt %, based on the diblock copolymer, of an ester type antioxidant represented by the following chemical formula is added to a solution of the diblock copolymer (1) and that annealing is performed in air atmosphere. As a result, it is possible to obtain a good pattern as in the case of Example 2.

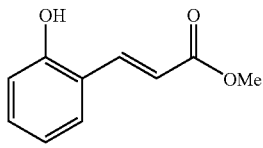

Further, pattern formation is performed in the same manner as described above using a phenol-based antioxidant such as Sumilizer-GA-80, Sumilizer-BP-101, Sumilizer-BP-76 (all available from Sumitomo Kagaku Kogyo Co., Ltd.), 3,5-di-tert-butyl-4-hydroxy toluene (BHT), a phosphorus-based antioxidant such as Sumilizer-P-16 and Adecastab PEP-24G, sulfur-based antioxidant such as Sumilizer-TPM and Sumilizer-TP-D (all available from Sumitomo Kagaku Kogyo Co., Ltd.), and an HALS-type antioxidant such as Sanol LS-770 (Sankyo Co., Ltd.) in place of the ester-type antioxidant. Even when any of these antioxidants is used, it is possible to provide a good pattern as in the case of Example 2.

Incidentally, when annealing is performed in air without adding an antioxidant, the size of holes and dispersion of intervals between holes in the formed pattern are increased. It is confirmed from these results that the addition of an antioxidant to the diblock copolymer is effective.

Example 25

A phenol-based antioxidant such as Sumilizer-GA-80, Sumilizer-BP-101 and Sumilizer-BP-76 (all available from Sumitomo Kagaku Kogyo Co., Ltd.), BHT, the aforementioned ester type antioxidant, a phosphorus-based antioxidant such as Sumilizer-P-16 and Adecastab PEP-24G, a sulfur-based antioxidant such as Sumilizer-TPM and Sumilizer-TP-D (all available from Sumitomo Kagaku Kogyo Co., Ltd.), and an HALS-type antioxidant such as Sanol LS-770 (Sankyo Co., Ltd.) are provided.

A pattern transfer step and patterning of $SiO_2$ film are performed in the same manner as described in Example 5 except that 0.1 wt % of an antioxidant is added to polysilane constituting a pattern transfer film and that annealing for forming a microphase separation is performed in air. As a result, even when any of these antioxidants is used, it is possible to increase the depth of the holes by about 30% as compared with that obtained in Example 5.

Example 26

A phenol-based antioxidant such as Sumilizer-GA-80, Sumilizer-BP-101 and Sumilizer-BP-76 (all available from Sumitomo Kagaku Kogyo Co., Ltd.), BHT, the aforementioned ester-type antioxidant, a phosphorus-based antioxidant such as Sumilizer-P-16 and Adecastab PEP-24G, a sulfur-based antioxidant such as Sumilizer-TPM and Sumilizer-TP-D (all from Sumitomo Kagaku Kogyo Co., Ltd.), and an HALS-type antioxidant such as Sanol LS-770 (Sankyo Co., Ltd.) are provided.

Patterning is performed in the same manner as described in Example 13 except that 0.1 wt % of an antioxidant is added to the diblock copolymer and that annealing for forming microphase separation is performed in air. As a result, even when any of these antioxidants is used, it is possible to increase the depth of the holes formed in the SiO substrate by about 20% as compared with that obtained in Example 13.

Incidentally, when annealing is performed in air without adding an antioxidant, the size of holes and intervals between holes in the formed pattern are increased, and at the same time, the depth of holes is decreased by about 20%. It is confirmed from these results that addition of an antioxidant to the diblock copolymer is effective.

Example 27

Figure 9:
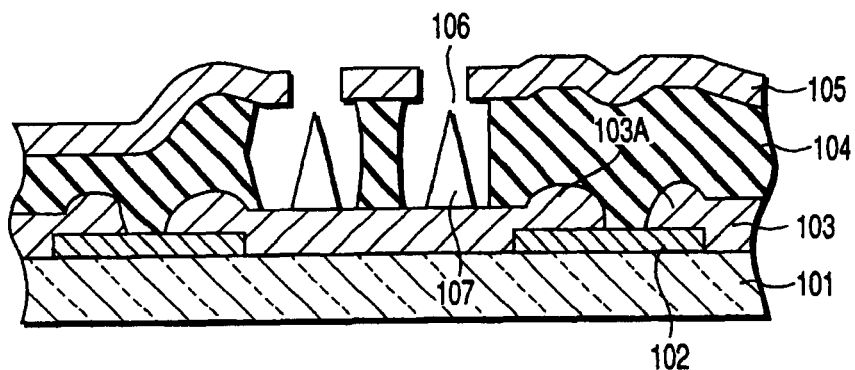
FIG. 9 is a cross-sectional view of a field emission display according to the present invention.

An example of manufacturing a field emission display (FED) as shown in FIG. 9 will be described. The cathode conductor 102 consisting of a thin film made of a metal such as niobium (Nb), molybdenum (Mo) or aluminum (Al) is formed on the insulative substrate 101 such as glass. A portion of the cathode conductor 102 is etched by means of photolithography to form a rectangular cut-out portion having a side length of about 40 to 100 µm. The resistance layer 103 having a thickness of 0.5 to 2.0 µm is formed to cover the cathode conductor 102 by sputtering or CVD. As for the material for the resistance layer 103, $In_2O_3$, $Fe_2O_3$, ZnO or NiCr alloy or silicon doped with impurities can be employed. The resistivity of the resistance layer 103 should preferably be in the range of about $1\times10$ to $1\times10^6$ Ωcm.

The resistance layer 103 is patterned by wet etching with an alkaline solution such as ammonia or reactive ion etching (RIE) with a fluorine-based gas, thereby forming a plurality of terminals 103A. Then, the insulating layer 104 consisting of silicon dioxide and having a thickness of about 1.0 µm is formed by sputtering or CVD to cover the cathode conductor 102 and the resistance layer 103. Further, the gate conductor 105 made of Nb or Mo having a thickness of 0.4 µm is formed by sputtering on the insulating layer 104.

Then, a resist (OFPR 800, 100 pc, Tokyo Ohka Co., Ltd.) is patterned to protect intersecting portions between gate wires and emitter wires. Subsequently, according to Example 6, a solution of the diblock copolymer (5) and polystyrene homopolymer is applied to the gate conductor 105 by spin coating and then dried, followed by annealing, thereby forming a film having micro polymer phases. RIE with $CF_4$ gas is performed to the film having micro polymer phases, thus the PMMA in the film having micro polymer phases is selectively etched, and further the gate conductor 105 is etched with using the pattern of remaining PS as mask, thereby transferring the pattern to the gate conductor 105. Thereafter, ashing is performed with an $O_2$ asher, thereby removing the remaining organic substances. In such a manner, many openings 106 having a diameter of about 840 nm are formed in the gate conductor 105. Wet etching with a buffered hydrofluoric acid (BHF) or RIE with a gas such as $CHF_3$ is performed to remove the insulating layer 104 in the openings 106 until the resistance layer 103 is exposed to the outside.

Then, aluminum is obliquely deposited by electron beam (EB) evaporation to form a peeling layer. Molybdenum is normally deposited on the peeling layer in the perpendicular direction by EB evaporation, thereby depositing molybdenum in a conical configuration inside the openings 106 to form the emitters 107. Thereafter, the peeling layer is removed with a peeling solution such as phosphoric acid, thereby manufacturing an FED device as shown in FIG. 9.

Example 28

Figure 10:
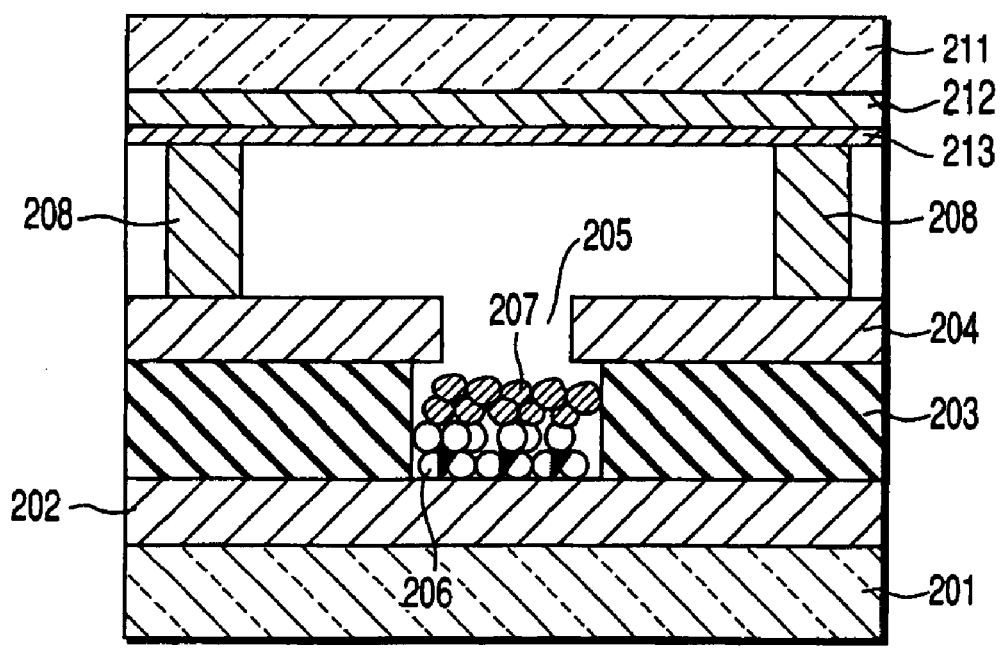
FIG. 10 is a cross-sectional view of another field emission display according to the present invention.

An example of manufacturing an FED device as shown in FIG. 10 will be described. The Pyrex glass substrate 201 having a width across corner of 14 inches and a thickness of 5 mm is cleaned, and then the surface thereof is roughened by plasma treatment. The emitter wires 202 having a width of 350 μm are formed on the glass substrate 201 parallel to the long side of the glass substrate 201 with a pitch of 450 μm. On this occasion, the regions on the substrate 201 having a width of 2 inches measured from each side parallel to the direction of the emitter wires 202 are made margins, respectively, for which patterning is performed so that the emitter wires 202 are not formed in these regions. Specifically, patterning is performed in such a manner that a PVA film is applied to the substrate, which is exposed to an ultraviolet ray through a mask (photopolymerized), followed by being developed, so as to leave the PVA film in the regions between the emitter wires 202. The patterning precision at that time is 15 μm. A 50-nm thick Ni film is deposited by electroless plating, and then the PVA film and the Ni film thereon are lifted-off. A 1-μm thick Au film is deposited by electroplating using the remaining Ni film as an electrode.

The $SiO_2$ film 203 having a thickness of 1 μm as an insulating film is deposited by means of an LPD method. Even though a large number of particle defects are included in $SiO_2$ film 203, the density thereof is about $1,000/cm^2$, which is in a level that brings about no problem in practical viewpoint. Although the film formed on the Au layer is slightly darkened, the film has a breakdown voltage of 100V per 1 μm, which is in a level that brings about no problem in practical viewpoint. The $SiO_2$ film 203 covers step portions of Au—Ni wire conformally, thus there are no exposed portions of Au. A 30-nm thick Pd film is deposited on the $SiO_2$ film 203 by electroless plating, and then a 200-nm thick Ir film is deposited by electroplating to form a gate film. Then, the gate film is patterned in the direction parallel to the shorter side of the substrate, thereby forming the gate wires 204 having a width of 110 μm with a pitch of 150 μm. On this occasion, the regions on the substrate 201 having a width of 2 inches measured from each side parallel to the direction of the gate wires 204 are made margins, respectively, for which patterning is performed so that the gate wires 204 are not formed in these regions. Specifically, patterning is performed in such a manner as described above that a PVA film is applied to the substrate, which is exposed to an ultraviolet ray through a mask (photopolymerized), followed by being developed, so as to leave the PVA film on the gate wires 202 and remove the remaining exposed regions of the PVA film. The patterning precision at that time is also 15 μm.

Next, patterning is performed to remove a part of the gate wires 204 and $SiO_2$ film 203 until the emitter wire 202 is exposed to the outside, thereby forming the openings 205 in an approximately circular form. There are two reasons for separately performing the patterning of the gate wires 204 and the patterning of the $SiO_2$ film 203. One of the reasons is that, since the diameter of the openings 205 is about 1 μm, it is required to employ a patterning method ensuring optical resolution of 1 μm or so. The other reason is that, since the openings 205 are not necessarily arrayed regularly, it is only required that the openings 205 having approximately uniform diameter are present in almost equal numbers for respective pixels.

Specifically, patterning for the openings 205 is performed as follows. A diblock copolymer (polystyrene: Mw=150,700, poly(t-butyl acrylate): Mw=1033,000, Mw/Mn=1.30) and polystyrene homopolymer (Mw=45,000, Mw/Mn=1.07) are blended together at a weight ratio of 21:79, and then the blend is dissolved in cyclohexane with 5 wt % of solid matters, to which 1% of naphthylimide triflate, based on the solid matters, is added as a photo-acid generator, followed by filtering. The solution is applied to the gate wires 204 by spin coating, followed by drying at 110° C. thereby forming a polymer film having a thickness of 970 nm. Excluding the intersecting portions between the gate wires 204 and the emitter wires 202, only the regions where the openings 205 are to be formed are exposed to g-line, thereby generating acid from the photo-acid generator. The sample is placed in an oven and subjected to annealing in a nitrogen atmosphere at 150° C. for one hour, thereby forming a film having micro polymer phases, and, at the same time, decomposing exposed portions of poly(t-butyl acrylate) with acid to convert into polyacrylic acid. Note that, since reflow of the polymer occurs during annealing, the thickness of the polymer film on the gate wires 204 is decreased to 1 μm. The substrate is entirely immersed in an alkaline solution for 3 minutes to remove the "island" portions of the acrylic acid, followed by rinsing with pure water, thus the gate wires 204 are exposed to the outside. RIE is performed to etch the gate wires 204 and further to etch the $SiO_2$ film 203 under the gate wires 204, thus the emitter wires 202 are exposed to the outside.

Next, the resistance layer 206 is deposited inside the openings 205 by electrophoresis. The operation is performed for separated regions each including 100 lines of emitter wires, respectively. As a material for the resistance layer 206, employed is a mixture of polyimide fine particles having particle size of 100 nm (PI Technique Research Co., Ltd.) and carbon fine particles containing fullerene having a particle size of 10 nm at a weight ratio of 1000:1. The mixture is dispersed by 0.4 wt % in a dispersion solvent (Isoper L, Exxon Chemical Co., Ltd.). On the other hand, zirconium naphthenate (Dai Nippon Ink Kagaku Kogyo Co., Ltd.) as a metal salt is added by 10 wt % to the mixture of polyimide and carbon fine particles. The substrate 201 is immersed in the dispersion solution and an counter electrode is disposed at a space of 100 μm away from the substrate 201, and the emitter wires 202 are grounded, under which setting a voltage of +100V is applied to the counter electrode while applying an ultrasonic wave. Immediately after the application of the voltage, a current of several mA begins to flow, but the current is exponentially attenuated, which comes to be not observed two minutes later. At this moment, the resistance material dispersed in the dispersion solvent is all deposited on the substrate 201. Subsequently, the counter substrate is grounded and a voltage of +50V is applied to the gate wire 204, thereby migrating the fine particles adhered on the gate wire 204 in the solvent so as to be removed. Further, annealing is performed in a nitrogen gas atmosphere at 300° C. to fix the resistance layer 206 to the emitter wires 202.

Then, a fine particle-emitter layer 207 is deposited on the resistance layer 206 by electrophoresis in the same manner as described above. As a material for the fine particle-emitter layer 207, cubic boron nitride fine particles having a particle size of 100 nm (trade name SBN-B, Showa Denko Co., Ltd.) are provided. The BN fine particles are treated with hydrofluoric acid, followed by hydrogen plasma treating at 450° C. The BN fine particles are dispersed by 0.2 wt % in the same solvent as employed in the deposition of the resistance layer. Further, zirconium naphthenate is added by 10 wt % to the BN fine particles. After the BN fine particles are deposited in the same manner as described above, the BN fine particles adhered on the gate wires 204 are removed. Further, annealing in a hydrogen atmosphere at 350° C., thereby fixing the fine particle-emitter layer 207 to the resistance layer 206.

To the resultant electron-emitting element array, a faceplate 211 provided with an anode layer 212 made of ITO and a phosphor layer 213 is mounted with interposing spacers 208 having a height of 4 mm, which product is placed in a vacuum chamber. The pressure inside the vacuum chamber is reduced to $10^{-6}$ Torr by means of a turbo-molecular pump. The anode potential is set to 3500V. The potentials of non-selected emitter wires 202 and gate wires 204 are both set to 0V. The potentials of a selected emitter wire 202 and a gate wire 204 are biased to −15V and +15V, respectively. As a result, electron emission is caused, and hence a bright spot is observed on the fluorescence layer 213. Several pixels are selected from the entire displaying region of the display to measure for brightness under the same conditions. As a result, dispersion of the brightness is found to be within 3%.

Example 29

First, for the purpose of employing a porous film manufactured from a block copolymer as a separator of a lithium ion secondary battery, a preliminary experiment is performed as follows.

A diblock copolymer comprising a polyvinylidene fluoride chain and a polymethyl methacrylate chain (weight average molecular weight Mw=79,000, Mw/Mn=2.2, and weight fraction of polyvinylidene fluoride=66%) is dissolved in a solvent, to which silica (Tokuseal P, Tokuyama Soda Co., Ltd.) is added by 3 wt % based on the diblock copolymer. The resultant solution is cast to provide a cast film of the diblock copolymer. The film is heat-treated under a nitrogen flow at 130° C. for hours to form a structure having micro polymer phases therein. When the structure having micro polymer phases is observed with TEM, a bicontinuous structure having a pore size of 40 nm or so is formed. The cast film is irradiated with an electron beam under the conditions of 2 MV in accelerating voltage and 10 kGy in exposure dose, thereby decomposing the polymethyl methacrylate phase, and, at the same time, cross-linking the polyvinylidene fluoride phase to cause gelation. The film is rinsed with ethyl acetate to remove the polymethacrylate phase. TEM observation shows that a porous film is formed having continuous pores retaining the bicontinuous structure.

$LiClO_4$ anhydride is dissolved in a mixed solvent of propylene carbonate and dimethyl carbonate (1:1) to prepare a 1M concentration of electrolyte solution. The porous film having a thickness of about 50 μm obtained as above is impregnated with the electrolyte solution, and the film is punched out into a disk having a diameter of 0.5 cm. The electrolyte-impregnated porous film is sandwiched between a pair of platinum electrodes to constitute a cell, which is measured for AC impedance using an impedance gain phase analyzer 1260 (Schlumberger Instruments Co., Ltd.) at room temperature and at a frequency of 30 MHz to 0.05 Hz. As a result, the film exhibits good ion conductivity of 4 $mScm^{-1}$ at 25° C. In addition, the porous film holds the electrolyte solution well, and hence, no liquid leakage occurs.

Next, a lithium ion secondary battery is manufactured as follows.

As an active material for a positive electrode, $LiCoO_2$ is employed. The $LiCoO_2$ is heated under an argon atmosphere at 300° C. for 3 hours so as to be dried. Thereafter, $LiCoO_2$, conductive carbon black and the above diblock copolymer are mixed together at a ratio of 85:10:5, to which mixture a small quantity of DMF is added, and then kneaded. The kneaded product is uniformly applied to an aluminum mesh having a thickness of 20 μm and a size of 4 cm×4.5 cm and dried to manufacture a positive electrode having a thickness of about 50 μm. The resultant positive electrode has $LiCoO_2$ weight per unit area of 17 $mg/cm^2$. The active material for positive electrode shows a capacity of 150 mAh/g.

As an active material for a negative electrode, hard carbon (non-graphitizing carbon) that is obtained by sintering furfuryl alcohol at 1,100% is employed. The hard carbon is heated under an argon atmosphere at 600° C. for 3 hours so as to be dried. The hard carbon, conductive carbon black and the above diblock copolymer are mixed together at a weight ratio of 85:10:5, to which mixture a small quantity of DMF is added, and then kneaded. The kneaded product is uniformly applied to a copper mesh having a thickness of 20 μm and a size of 4 cm×4.5 cm and dried to manufacture a negative electrode having a thickness of about 50 μm. The resultant positive electrode has hard carbon weight per unit area of 7 $mg/cm^2$. The active material for negative electrode shows a capacity of 150 mAh/g.

The aforementioned diblock copolymer is dissolved in a solvent, to which silica (Tokuseal P, Tokuyama Soda Co., Ltd.) is added 3 wt % based on the diblock copolymer. The solution is cast to form a cast film of the diblock copolymer. The positive electrode, the negative electrode and the cast film are respectively heat-treated under a nitrogen flow at 130° C. for 5 hours, and then they are irradiated with electron beam under the conditions of 2 MV in accelerating voltage and 10 kGy in exposure dose. The positive electrode, the cast film and the negative electrode are laminated in the order, followed by pressing with a hot press, to manufacture a laminate. The laminate is rinsed with ethyl acetate to remove the polymethacrylate phase in the diblock polymer. The laminate is heated under vacuum at 70° C. for 20 hours so as to be dried, thereby manufacturing a cell structure. $LiPF_6$ anhydride is dissolved in a mixed solvent of propylene carbonate and dimethyl carbonate (1:1) to prepare a 1M concentration of electrolyte solution. The cell structure is immersed in the electrolyte solution to be impregnated with the electrolyte solution. The resultant cell structure is wrapped with waterproof and airtight aluminum laminate film and sealed under an argon flow. External electrode terminals are connected the negative and positive electrodes, respectively, thereby manufacturing a lithium ion secondary battery.

The resultant lithium ion secondary battery is charged with a constant current of 50 $\mu A/cm^2$, and, after the battery voltage reaches 4.2V, charged with a constant voltage. The charging time is defined as the time at which excessive capacity of 30% is charged relative to the capacity of 300 mAh/g of the active material for the negative electrode. After completion charging, the battery is allowed to stand for 30 minutes, and then the battery is discharged with a constant current of 50 $\mu A/cm^2$ until the battery voltage decreases to 2.5V. After completion of discharging, the battery is allowed to stand for 30-minutes. The above procedures are defined as one cycle, and the charge-and-discharge cycles are repeated to examine the battery capacity per gram of the active material (hard carbon) for the negative electrode (i.e., negative electrode-reduced capacity: mAh/g) and the charge-and-discharge efficiency (%) (a ratio of discharge capacity to charge capacity), for each cycle.

Even when the charge-and-discharge cycle test is repeated up to 500 cycles, any substantial change is not recognized in a charge-and-discharge curve and the battery capable is maintained at 80% or more, showing excellent in charge-and-discharge characteristics. Further, no internal short-circuit occurs. A lithium ion secondary battery manufactured in the same manner as described above except that the positive and negative electrodes and cast film are laminated, followed by hot-pressing, which laminate is irradiated with an electron beam, also shows excellent characteristics similar to those described above.

Example 30

A diblock copolymer comprising a polyvinylidene fluoride chain and a polymethyl methacrylate chain (weight average molecular weight Mw=79,000, Mw/Mn=2.2, and weight fraction of polyvinylidene fluoride=66%) is dissolved in a solvent to prepare a solution. The solution is applied to a fiber of polymethyl methacrylate by dip coating, followed by being air-dried at 70%, and further the fiber is heated and dried under a nitrogen flow at 135% for 10 hours, and thus a film is formed on the surface of the polymethyl methacrylate fiber. The surface of the fiber is irradiated with an electron beam under the conditions of 2 MV in accelerating voltage and 10 kGy in exposure dose, thereby decomposing the polymethacrylate phase, and, at the same time, cross-linking the polyvinylidene fluoride phase to cause gelation. The fiber is rinsed with ethyl acetate to remove the polymethacrylate phase, thereby providing a porous hollow fiber. The resultant porous hollow fiber has an inner diameter of 500 µm and an outer diameter of 530 µm, and the side wall thereof has a porous structure retaining a Gyroid type phase-separated structure having a pore size of 40 nm.

A filter module having an effective length of 25 cm is manufactured using a hundred hollow fibers obtained, and the module is used for filtration of a solution of silica sol having an average particle size of 100 nm. No silica sol is observed in the filtrate.

Example 31

Pellets of a diblock copolymer comprising a polyacrylic acid chain and a polymethyl methacrylate chain (weight average molecular weight Mw=82,000, Mw/Mn=1.3, and weight fraction of polyacrylic acid=26%) are prepared with using an extruder. The pellets are fed into a uniaxial extruder and extrusion-molded into a fiber having a diameter of 50 µm. A plain weave fabric is made using the fiber, and then the fabric is heat-treated under a nitrogen flow at 135° C. for 10 hours. Thereafter, the fabric is irradiated with an electron beam under the conditions of 2 MV in accelerating voltage and 10 kGy in exposure dose, thereby decomposing the PMMA phase. The fabric is rinsed with a mixed solvent of MIBK and isopropyl alcohol (volume ratio: 3.7) to remove the PMMA phase. Observation of the resultant fabric with SEM shows that the fabric is formed of an aggregate consisting of a bundle of ultrafine fibers made of polyacrylic acid having a diameter of about 26 nm. It is assumed from the result that the annealed fiber is formed into a cylindrical structure.

Example 32

A fabric is manufactured in the same manner as in Example 32 except that a diblock copolymer comprising a polyacrylic acid chain and a polymethyl methacrylate chain (weight average molecular weight Mw=104,000, Mw/Mn=1.3, and weight fraction of polyacrylic acid=55%) is employed. Observation of the fabric with SEM shows that the fabric is formed of an aggregate consisting of a bundle of fibers in a form of thin piece made of polyacrylic acid having a thickness of 67 nm. It is assumed from the result that the annealed fiber is formed into a lamella structure.

Example 33

A fabric is manufactured in the same manner as in Example 32 except that a diblock copolymer comprising a polyacrylic acid chain and a polymethyl methacrylate chain (weight average molecular-weight Mw=42,000, Mw/Mn=1.3, and weight fraction of polyacrylic acid=65%) is employed. Observation of the fabric with TEM shows that the fabric is formed of porous fibers made of polyacrylic acid including continuous pores having an average pore size of 16 nm. It is assumed from the result that the annealed fiber is formed into a bicontinuous structure.

Example 34

A 2-wt % of diblock copolymer (molecular weight: polystyrene=65,000; polymethyl methacrylate=13,200; Mw/Mn=1.04) is dissolved in propyleneglycol monoethyl ether acetate (PGMEA) to prepare a solution, followed by filtering, and then the solution is applied to a SiO substrate having a diameter of 3 inches by spin coating at a rate of 2,500 rpm. The substrate is heated at 120° C. for 90 seconds to evaporate the solvent. Then the substrate is placed in an oven and subjected to annealing in a nitrogen atmosphere at 210% for 10 minutes, subsequently at 135° C. for 10 hours. As a result, formed is a film having micro polymer phases of a sea-island structure including islands having a diameter of 17 nm.

RIE is performed to the sample under the conditions of $CF_4$, 0.01 Torr, 150 W of progressive wave, and 30 W of reflected wave. Under the conditions, the PMMA is selectively etched, and further the underlayer is etched with the remaining PS pattern being used as a mask. A 15-nm thick CoPtCr film is deposited by ordinary sputtering on the sample that has been subjected to etching. The sample on which the CoPtCr film is deposited is immersed in a cellosolve-based solvent and subjected to ultrasonic cleaning, and thus the remaining polystyrene and the CoPtCr film thereon are lifted off. The surface of the sample after lift-off process is observed with a scanning electron microscope. As a result, observed is a structure that CoPtCr magnetic particles having a size of about 17 nm are present in the glass substrate matrix.

In order to use the sample as a high-density magnetic recording medium, carbon having a thickness of 10 nm is deposited as a protective film on the substrate by sputtering, from which anomalous projections are removed by tape vanishing, and then a lubricant is applied thereto in a wet process. Measurement for the magnetic characteristics of the sample shows perpendicular magnetic anisotropy with coercivity of 2 kOe.

Alternatively, a magnetic recording medium is manufactured in the same manner as described above except that patterning of the diblock copolymer is preformed according to the method in Example 2. As a result, the resultant magnetic recording medium has almost the same characteristics as above.

Further, a magnetic recording medium is manufactured in the same manner as described above except that patterning of the diblock copolymer is preformed according to the method in Example 4. Since the depth of holes formed by using the method is as deep as 30 nm, the resultant magnetic recording medium has higher coercivity than that of above magnetic recording medium.

Example 35

First, a diblock copolymer of polystyrene (molecular weight: 6,300) and polymethyl methacrylate (molecular weight: 13,000) with Mw/Mn of 1.4 is dissolved in propyleneglycol monoethyl ether acetate (PGMEA) to prepare a solution. The solution is applied in a thickness of about 10 nm to a glass substrate having a diameter of 2.5 inches by spin coating. The coated substrate is placed in a thermostat and subjected to annealing at 150% for 24 hours, and further at 120° C. for 2 hours, and the returned to room temperature. The surface of the glass substrate sample after annealing is observed with a scanning electron microscope. As a result, it is confirmed that a structure in which spherical islands having an average diameter of 17 nm and the sea surrounding the islands are phase-separated is formed.

Reactive ion etching (RIE) treatment with $CF_4$ is performed to the sample. As a result, only the island portions are selectively etched. Measurement for thickness of the film shows that the selectivity between the island and sea to RIE is sea: island=1:4.

A 15-nm thick CoPtCr film is deposited by ordinary sputtering on the sample that has been subjected to etching. The sample on which the CoPtCr film is deposited is immersed in a cellosolve-based solvent and subjected to ultrasonic cleaning, and thus the remaining polystyrene and the CoPtCr film thereon are lifted off. The surface of the sample after lift-off process is observed with a scanning electron microscope. As a result, observed is a structure that CoPtCr magnetic particles having a size of about 15 nm are present in the glass substrate matrix.

In order to use the sample as a high-density magnetic recording medium, carbon having a thickness of 10 nm is deposited as a protective film on the substrate by sputtering, from which anomalous projections are removed by tape vanishing, and then a lubricant is applied thereto in a wet process. Measurement for the magnetic characteristics of the sample shows perpendicular magnetic anisotropy with coercivity of 2 kOe.

Example 36

An aluminum layer having a thickness of 500 nm is formed on a silicon wafer, and then the aluminum layer is patterned using a resist for semiconductor (EOBR-800), thereby forming a pair of electrodes spaced apart from each other by 5 μm. A $SiO_2$ film is formed on the wafer, and the surface thereof is flattened by CMP, thereby exposing the electrode portions to the outside. An aluminum layer having a thickness of 20 nm is deposited on the wafer, and then a SiO layer having a thickness of 5 nm is deposited on the aluminum layer. Patterning for forming electrodes is again performed using the resist for semiconductor (EOBR-800), and then, RIE is slightly performed so as to expose the electrode portions to the outside.

A diblock copolymer (molecular weight: polystyrene=146,700; polymethyl methacrylate=70,700; Mw/Mn=1.11) is dissolved in PGMEA to prepare a 2 wt % solution, which is applied to the wafer by spin coating at a rate of 3,000 rpm, and then the wafer is placed on a hot plate heated at 120% to form a diblock polymer thin film having a thickness of 45 nm.

The thin film is annealed in a nitrogen atmosphere at 230° C., 40 hours, while applying a voltage of 10V between the electrodes. During the operation, the diblock copolymer of polystyrene and polymethyl methacrylate causes microphase separation, resulting in a structure that cylinder phases are oriented perpendicular to the electrodes. The wafer is cooled to 80° C. over two hours, and further naturally cooled to room temperature.

The wafer is then subjected to reactive ion etching with $CF_4$ under the conditions of 0.01 Torr, 30 sccm, and 150 W of progressive wave for 180 seconds. As a result, the PMMA phases are selectively etched, and further underlying aluminum is also etched. As a result, an electrode in a comb shape having intervals of about 50 nm is formed between electrodes spaced apart from each other by 5 μm.

Example 37

Aluminum is deposited on a silicon wafer to form a thin film having a thickness of 10 nm. A 10-wt % solution of a diblock copolymer (molecular weight: polystyrene=322,400; polymethyl methacrylate=142,000; Mw/Mn=1.11) in toluene is applied to the wafer by spin coating at a rate of 3,000 rpm, and then the wafer is placed on a hot plate heated at 120° C. to form a diblock polymer thin film having a thickness of 500 nm. The thin film is dried in vacuum at 60° C. over 14 days. Further, aluminum is deposited on the thin film of the diblock copolymer to form a thin film having a thickness of 10 nm.

The thin film is annealed in a nitrogen atmosphere at 210° C. for 40 hours, while applying a voltage of 1V between a pair of aluminum layers. During the operation, the diblock copolymer of polystyrene and polymethyl methacrylate causes microphase separation, resulting in a structure that cylinder phases are oriented perpendicular to the electrodes. The wafer is cooled to 80° C. over two hours, and further naturally cooled to room temperature.

The wafer is then subjected to reactive ion etching with $CF_4$ under the conditions of 0.01 Torr, 30 sccm, and 150 W of progressive wave for 600 seconds. As a result, the PMMA phases are selectively etched, and further underlying aluminum and the substrate are also etched. Ashing with oxygen is performed to remove the remaining polymer. As a result, trenches having a diameter of 100 nm at maximum and a depth of 1 μm can be provided in the substrate.

Example 38

A Pyrex glass substrate is cleaned, and then the surface thereof is roughened by plasma treatment. Gold is deposited on the glass substrate to form a thin film having a thickness of 100 nm. A 10-wt % solution of a diblock copolymer comprising a polystyrene chain and a polymethyl methacrylate chain (weight average molecular weight Mw=37,000, Mw/Mn=1.3, and weight fraction of polymethyl methacrylate=26%) in toluene is applied to the substrate by spin coating, and then the substrate is placed on a hot plate heated to dry at 120° C. to form a diblock polymer thin film having a thickness of 500 nm. The thin film is dried in vacuum at 60° C. over 14 days. Further, aluminum is deposited on the thin film of the diblock copolymer to form a thin film having a thickness of 50 nm.

The thin film is annealed in a nitrogen atmosphere at 210° C. for 40 hours, while applying a voltage of 1V between the gold film and the aluminum film. During the operation, the diblock copolymer of polystyrene and polymethyl methacrylate causes microphase separation, resulting in a structure that cylinder phases are oriented perpendicular to the electrodes. The substrate is cooled to 80° C. over two hours, and further naturally cooled to room temperature.

Then, the aluminum deposited film formed on the surface is removed by immersing the substrate in an aqueous solution of hydrochloric acid, and then the substrate is irradiated with an electron beam. After electron beam irradiation, the cast film is rinsed with a mixed solution of MIBK and IPA in 3:7 by volume ratio, thereby making the polymer film porous. Observation of the porous polymer film with an electron microscope shows that holes, which reach the gold film, having a diameter of 10 nm are formed perpendicular to the substrate. The porous film is subjected to potentiostatic electrolysis in a gold plating bath to deposit gold in the through-holes. When the porous polymer layer is removed by ashing with oxygen after electroforming, provided is a structure in which many gold fibers having a diameter of about 8 nm are arranged on the gold film with perpendicularly oriented to the substrate like a pinholder. Likewise, when iridium is subjected to electroforming, it is possible to provide a pinholder structure similar to that in the case of gold.

Then, the field emission ability of the pinholder structure is examined. By making use of the gold film bearing the pinholder structure of iridium having a diameter of 8 nm as a cathode electrode, and by making use of an ITO substrate on which red-emitting europium-doped $Al_2O_3$ phosphor as a counter anode electrode, a cell having a space between electrodes of 30 μm is manufactured. The cell is actuated at a voltage of 300V in vacuum ($1\times10^{-6}$ Torr). As a result, it is observed red emission due to effective field emission, which shows that the pinholder structure is capable of operating as emitters of a cold emission display.

Further, an FED panel is manufactured by making use of the emitter in the pinholder structure. In this case, the FED panel is manufactured by the same procedures as described in Example 27 except that, instead of forming a Spindt type emitter on an insulating layer by EB evaporation, the pinholder structure of iridium is formed as described above. To the resultant electron emission element array, a face plate provided with an anode layer made of ITO and with a phosphor layer is mounted through spacers having a height of 4 mm, in the same manner as described in Example 28, and then the circumferential portions of the panel is sealed leaving a discharge port for evacuation. The pressure inside the element panel is reduced with a turbo-molecular pump to $10^{-6}$ Torr, and then the discharge port is completely sealed to manufacture the FED panel. In order to operate the FED panel, the anode potential is set to 3500V, the potentials of non-selected emitter wires and gate wires are both set to 0V, and the potentials of selected emitter wire and gate wire are biased to −15V and +15V, respectively. As a result, electron emission is caused, and hence a bright spot is observed on the fluorescence layer. Several pixels are selected from the entire displaying region of the display to measure for brightness under the same conditions. As a result, dispersion of the brightness is found to be within 3%.

Example 39

Gold is deposited on a copper foil to form a thin film having a thickness of 100 nm. A 10-wt % solution of a diblock copolymer comprising a polystyrene chain and a polymethyl methacrylate chain (weight-average molecular weight Mw=370,000, Mw/Mn=1.2, and weight fraction of polymethyl methacrylate chain=26%) in toluene is cast and air-dried and further drying is performed in vacuum at 60° C. for 8 hours to form a diblock polymer film having a thickness of 30 nm. Aluminum is deposited on the cast film to form a film having a thickness of 50 nm.

Annealing is performed in a nitrogen atmosphere at 210° C. for 40 hours, while applying a voltage of 60V between the gold film and the aluminum film. During the operation, microphase separation of the diblock copolymer of the polystyrene and polymethyl methacrylate is caused, and cylinder phases of polymethyl methacrylate are oriented perpendicular to the electrodes. The sample is cooled to 80° C. over two hours, and then naturally cooled to room temperature.

Thereafter, the aluminum deposition film formed on the surface is removed by immersing the sample in an aqueous solution of hydrochloric acid, and then the sample is irradiated with an electron beam. After the electron beam irradiation, the cast film is rinsed in a 3:7 mixed solution of MIBK and IPA to make the polymer film porous. When the porous polymer film is observed with an electron microscope, it is found that holes having a diameter of 120 nm, which reach the gold film, are formed perpendicular to the substrate. The porous film is subjected to potentiostatic electrolysis in a nitrogen-purged $Bi^{3+}/HTeO^{2+}$ bath using a platinum mesh as a counter electrode, thereby depositing bismuth telluride in the through-holes. When the porous polymer layer is removed after the electroforming, it is possible to obtain a structure in which many bismuth telluride fibers having a diameter similar to that of the cylinder and oriented perpendicular to the substrate are formed on the gold film like a pinholder. The bismuth telluride fiber can be employed for a high-efficiency thermoelectric conversion element.

Example 40

A solution of a diblock copolymer comprising a polystyrene chain and a polymethyl methacrylate chain (weight-average molecular weight Mw=82,000, Mw/Mn=1.3, and weight fraction of polystyrene chain=26%) is applied to an aluminum wire by dip coating. After application, the wire is air-dried. After drying, aluminum is deposited on the surface of coating by a thickness of 100 nm. After deposition, annealing is performed in a nitrogen atmosphere at 200° C. for 40 hours, while applying a voltage of 30V between the aluminum wire and the aluminum deposited film. During the annealing, microphase separation of the diblock copolymer of the polystyrene and polymethyl methacrylate is caused, and cylinder phases are oriented perpendicular to the electrodes. The wire is cooled to 80° C. over two hours, and then naturally cooled to room temperature. After the heat treatment, the wire is immersed in an aqueous solution of hydrochloric acid to remove the aluminum deposited film formed on the surface of the wire. After the surface aluminum deposited film is removed, the wire is irradiated with an electron beam at a dose of 150 KGr. After the electron beam irradiation, the cast film is rinsed in the mixed solution of MIBK and IPA in the ratio of 3:7 by volume to make the polymer film porous. The wire is immersed in an aqueous solution of hydrochloric acid to dissolve and remove the aluminum wire forming the core, and thus a hollow fiber filter is provided.

The resultant hollow fiber has an inner diameter of 500 μm and an outer diameter of 530 μm, whose wall surface represents a porous structure to which a cylinder type phase-separated structure having a pore size of about 27 nm is transferred. The cylindrical fine pores are formed into through-holes oriented perpendicular to the wall surface, which shows a suitable form for a filter.

When a minimodule (effective length: 25 cm) using 100 hollow fiber filters is manufactured, the module works well as a filter apparatus.

Example 41

A diblock copolymer comprising a polyacrylic acid chain and a polymethyl methacrylate chain (weight-average molecular weight Mw=82,000, Mw/Mn=1.3, and weight fraction of polyacrylic acid chain=26%) is palletized with an extruder, and then the pellets are extruded through a T-die to form a film having a thickness of about 100 μm. The film is heat-treated under a nitrogen gas flow at 135° C. for 10 hours. After the heat treatment, the film is irradiated with an electron beam at the dose of 150 kGy. After the electron beam irradiation, the film is rinsed in the mixed solution of MIBK and IPA in the ratio of 3:7 by volume. SEM and TEM observation shows that formed is a flat material like a non-woven fabric in which fiber bundles of ultra fine fiber having a thickness of 26 nm are entangled. The flat material shows excellent flexibility and can also be used well as a high-precision filter.

Example 42

A diblock copolymer of 1,2-polybutadiene and polymethyl methacrylate (Mw=281,000, weight fraction of 1,2-polybutadiene=32%, Mw/Mn=1.05) is mixed with a 2-wt % of 3,3',4, 4'-tetra(t-butylperoxycarbonyl) benzophenone, and a cyclohexanone solution thereof is prepared. The solution is applied to a glass plate using an applicator to form a sheet having a thickness of 20 μm. The sheet is subjected to heat treatment under a nitrogen gas flow at 135° C. for two hours. The sheet is irradiated with an electron beam under the conditions of 2 MV in accelerating voltage and 200 kGy in exposure dose. The sheet is rinsed with ethyl lactate for 24 hours, and then rinsed with methanol for one hour to provide a porous sheet. The resultant porous sheet has a porous structure to which transferred is a bicontinuous phase-separated structure consisting of polybutadiene cylinder phases having a diameter of about 50 nm and highly branched in a three-dimensional network configuration.

The resultant porous sheet is subjected to repeating processes comprising steps of being impregnated with a poly(2-bromoethyl) silsesquioxane, being irradiated with an ultraviolet ray, and being heat-treated at 80° C., by five times, and thus poly(2-bromoethyl)silsesquioxane is sufficiently loaded into pores of the porous sheet. The porous sheet is subjected to heat-treatment in a nitrogen gas flow at 150° C. for one hour and at 450° C. for one hour. As a result, manufactured is a silica porous body having a nanostructure that is transferred using the porous structure of the porous sheet as a template.

A mixed solution of acrylonitrile mixed with 10 wt % of 3,3',4,4'-tetra(t-butylperoxycarbonyl) benzophenone is prepared. The silica porous body is impregnated with the solution. The silica porous body is irradiated with an ultraviolet ray, thereby polymerizing and curing the acrylonitrile. The structure is heated in air at 210° C. for 24 hours, and then heated in a nitrogen gas flow from 210° C. to 800° C. at a rate of temperature rise of 10° C. per minute so as to be carbonized. The composite of silica and carbon is treated with hydrofluoric acid to solve out the silica. As a result, it is possible to manufacture porous carbon having continuous pores reflecting the morphology of the 1,2-polybutadiene porous sheet.

Example 43

Synthesis of Diblock Copolymer

In this example, a diblock copolymer consisting of polycyclohexadiene derivative polymer chain (poly(cis-5,6-bis(pivaloyloxy)-2-cyclohexen-1,4-ylene)) and polyethylene oxide (PEO) chain is synthesized by anion polymerization.

N-butyl lithium is employed as a reaction initiator. Employed ethylene oxide is dried by passing through the column of calcium hydride, and then, is distilled after a small amount of n-butyl lithium is added. Tetrahydrofuran (THF) used as a solvent is distilled twice using metallic sodium as a desiccating agent under an argon gas flow. As a polymerization apparatus, a pressure reactor (Taiatsu Glass Co., Ltd.) is employed. The reaction is carefully performed in argon atmosphere under a pressure of 4 atm so as to prevent an external air from entering the interior of the reaction system.

Poly(cis-5,6-bis(pivaloyloxy)-2-cyclohexen-1,4-ylene is charged into the reactor, and then THF is introduced into the reactor immediately after it is distilled. After the interior of the reactor is made into an argon gas atmosphere, a solution of n-butyl lithium in heptane is introduced into the reactor at −80° C., and then the mixture is stirred for one week. Subsequently, a predetermined quantity of ethylene oxide is introduced into the reactor, and the mixture is further stirred. After 2 mL of 2-propanol containing a small amount of hydrochloric acid is added to the mixture to terminate the reaction, the reactor is opened. After the reaction solution is concentrated by three-times, the reaction solution is dropped in a sufficient amount of petroleum ether, thereby allowing a polymer to reprecipitate. After the polymer is separated by filtration, the polymer is dried in vacuum at room temperature, thereby providing a diblock copolymer.

The poly(cis-5,6-bis(pivaloyloxy)-2-cyclohexen-1,4-ylene) unit has Mw of 65,000, the polyethylene oxide unit has Mw of 13,200, and Mw/Mn is 1.5.

Pattern Formation:

A mixture of the resultant diblock copolymer mixed with 5 wt % of 3,3',4,4'-tetrakis(t-butylperoxy-carbonyl)benzophenone is dissolved in methylene chloride at a concentration of 2 wt %, followed by filtering, and then the solution is applied to a quartz glass substrate having a diameter of 3 inches by spin coating at a rate of 2,500 rpm to form a pattern forming film. The substrate is heated at 110° C. for 90 seconds to evaporate the solvent. Thereafter, the substrate is placed in an oven and then heat-treated in a nitrogen atmosphere at 150° C. for 5 hours, at 200° C. for 5 hours, at 300° C. for 5 hours and at 350% for 30 minutes. When the surface of the substrate after heat-treatment is observed with AFM, it is found that holes having a diameter of 12 nm are formed over the entire surface of the pattern forming film.

Reactive ion etching is performed under the conditions of $CF_4$, 0.01 Torr, 150 W of progressive wave, and 30 W of reflected wave to etch the substrate. Thereafter, reactive ion etching is performed under the conditions of $O_2$, 0.01 Torr, 150 W of progressive wave, and 30 W of reflected wave to remove the residue of the pattern forming film. Under the conditions, only the organic substances can be efficiently ashed. As a result, holes having a diameter of 12 nm and a depth of 25 nm are formed over the entire surface of the quartz substrate at a density of about 2000 µm² and at approximately equal intervals.

A CoPtCr thin film having a thickness of 15 nm is deposited over the entire surface of the quartz substrate by sputtering. Carbon having a thickness of 10 nm is deposited as a protective film on the CoPtCr thin film by sputtering, from which anomalous projections are removed by tape vanishing, and then a lubricant is applied thereto to manufacture a high-density magnetic recording medium. The medium has perpendicular magnetic anisotropy of 2 kOe.

Example 44

Synthesis of Diblock Copolymer

In this example, a diblock copolymer consisting of polybutylmethylsilane chain and polyethylene oxide chain is synthesized by living anion polymerization.

A masked disilene represented by the following chemical formula and ethylene oxide are employed as monomers and sec-butyl lithium is employed as a polymerization initiator, and these monomers are successively introduced into in THF at a reaction temperature of −78° C. to synthesize the diblock copolymer. The weight-average molecular weights of respective blocks constituting the diblock copolymer are 65,000 for polybutylmethylsilane and 13,200 for polyethylene oxide. In addition, molecular weight distribution (Mw/Mn) is 1.1.

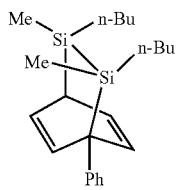

Pattern Formation:

A 3-inch silicon wafer is spin-coated with a solution of polyamic acid (that is prepared by diluting Semicofine SP-341 available from Toray Co., Ltd. with N-methyl-2-pyrrolidone). Thereafter, the sample is heated under a nitrogen gas flow successively at 150', at 250% and at 350%, for one hour, respectively, thereby forming a pattern transfer film consisting of polyimide having a thickness of 30 nm.

The synthesized diblock copolymer is dissolved in THF at a concentration of 2 wt %, followed by filtering, and then the solution is applied to the pattern transfer film made of polyimide by spin coating at a rate of 2500 rpm, thereby forming a pattern forming film. The sample is heated at 110° C. for 90 seconds to evaporate the solvent. Thereafter, the sample is placed in an oven and is heat-treated in a nitrogen atmosphere at 150° C. for 5 hours. Then, the sample is irradiated with an ultraviolet ray from a low-pressure mercury lamp in air. The sample is placed again in the oven and is heat-treated in a nitrogen atmosphere at 150% for one hour, at 200% for 5 hours, at 300% for 5 hours, and at 350% for 30 minutes. When the surface of the substrate is observed with AFM, it is found that holes having a diameter of about 13 nm are formed over the entire surface of the pattern forming film.

Reactive ion etching is performed to the sample under the conditions of $O_2$, 0.01 Torr, 150 W of progressive wave, and 30 W of reflected wave. As a result, holes having relatively high aspect ratio of a diameter of 13 nm and a depth of 30 nm are formed over the entire surface of polyimide film (a pattern transfer film) on the silicon wafer at a density of about 2000/µm² and at approximately equal intervals. RIE is performed under the conditions of $CF_4$, 0.01 Torr, 150 W of progressive wave, and 30 W of reflected wave using the polyimide porous film as an etching mask to etch the silicon wafer. Subsequently, ashing is performed under the conditions of $O_2$, 0.01 Torr, 150 W of progressive wave, and 30 W of reflected wave to etch the remaining polyimide film. As a result, holes of having a high aspect ratio of a diameter of 14 nm and a depth of 70 nm are formed over the entire surface of the silicon wafer at a density of about 2000 µm² and at approximately equal intervals.

From the results described above, it is found that a porous mask can be formed from a diblock copolymer consisting of a polybutylmethylsilane chain and a polyethylene oxide chain, and that a dot pattern having a high aspect ratio can be formed in the polyimide film as a pattern transfer film, and further that the underlying substrate can be preferably processed.

Example 45

Synthesis of Diblock Copolymer

In this example, a diblock polymer (PEO-b-PDMSO) consisting of a polyethylene oxide (PEO) chain and a polydimethylsiloxane (PDMSO) chain is synthesized by living anion polymerization.

Using a polyethylene oxide macromer as a reaction initiator, hexamethylcyclotrisiloxane is polymerized. Tetrahydrofuran (THF) used as a solvent is distilled twice using metallic sodium as a desiccating agent under an argon gas flow. The polyethylene oxide has an OH group at one terminal and is capped with methoxy group at the other terminal, which is freeze-dried from a solution in benzene immediately before use. As for the polymerization apparatus, a pressure reactor (Taiatsu Glass Co., Ltd.) is employed. The reaction is carefully performed in an argon atmosphere under pressure of 4 atm so as to prevent an external air from entering the interior of the reaction system.

While flowing an argon gas, a solution of polyethylene oxide dissolved in dehydrated benzene is introduced into the reactor, and the solution is freeze-dried in vacuum over 5 hours. Under vacuum, THF is distilled and directly introduced into the reactor. The interior of the reactor is filled with an argon gas atmosphere again, to which n-butyl lithium is added at 0° C. followed by stirring at 30° C. for one hour, and then hexamethylcyclotrisiloxane is added at 25° C. to the solution with stirring so as to be polymerized. A small amount of the reaction solution is taken out to measure the molecular weight by GPC. Based on the measured molecular weight, an amount of hexamethylcyclotrisiloxane to be added to give a desired molecular weight is calculated and added so to the solution. A series of these procedures are carefully performed under a pressurized argon atmosphere so as to prevent an external air from entering the interior of the reaction system. After it is confirmed by GPC that a desired molecular weight is given, trimethylchlorosilane is added to the solution to terminate the reaction, and then the reactor is opened. The reaction solution is concentrated by three-times, and then the solution is dropped in a sufficient amount of petroleum ether to reprecipitate the polymer. The polymer is separated by filtration and then is dried in vacuum at room temperature, thus the diblock copolymer is provided.

The polyethylene oxide has Mw of 65,000, the polydimethyl siloxane has Mw of 62,000, and Mw/Mn is 1.20.

Pattern Formation:

A 3-inch silicon wafer is spin-coated with a solution of polyamic acid (that is prepared by diluting Semicofine SP-341 available from Toray Co., Ltd. with N-methyl-2-pyrrolidone (NMP)). The sample is heated under a nitrogen gas flow successively at 150° C., at 250° C. and at 350° C., for one hour, respectively, thereby forming a pattern transfer film consisting of polyimide having a thickness of 30 nm.

A mixture prepared by mixing the synthesized diblock copolymer with 1,3,5,7,9,11,13-heptacyclopentyl-15-vinyl-pentacyclo [9.5.1.1$^{3,9}$.1$^{5,15}$.1$^{7,13}$]octasiloxane (Vinyl-POSS) and azobisisobutyronitrile in a weight ratio of 1:1:0.05 is dissolved in THF at a concentration of 2-wt %, followed by filtering. The solution is applied to the pattern transfer film made of polyimide by spin coating at a rate of 2500 rpm, thereby forming a pattern-forming film. The sample is heated at 60° C. for 90 seconds to evaporate the solvent. The sample is heat-treated a nitrogen atmosphere at 80° C. for 5 hours. Thereafter, the pattern-forming film is exposed to hydrochloric acid vapor. Then, the sample is heat-treated in a nitrogen atmosphere at 200° C. for one hour, at 250° C. for one hour, at 300° C. for one hour, and at 350° C. for 30 minutes. When the surface of the sample is observed with AFM, it is found that holes having a diameter of about 15 nm are formed over the entire surface of the pattern forming film.

Reactive ion etching is performed to the sample under the conditions of $O_2$, 0.01 Torr, 150 W of progressive wave, and 30 W of reflected wave. As a result, holes having a relatively high aspect ratio of a diameter of 15 nm and a depth of 30 nm are formed over the entire surface of polyimide film (a pattern transfer film) on the silicon wafer at approximately equal intervals. RIE is performed using the polyimide porous film as a mask under the conditions of $CF_4$, 0.01 Torr, 150 W of progressive wave, and 30 W of reflected wave to etch the silicon wafer. Subsequently, ashing is performed under the conditions of $O_2$, 0.01 Torr, 150 W of progressive wave, and 30 W of reflected wave to remove the remaining polyimide film. As a result, holes having a high aspect ratio of a diameter of 14 nm and a depth of 70 nm are formed over the entire surface of the silicon wafer at approximately equal intervals.

Example 46

Pattern Formation

A mixture of the diblock copolymer comprising polyethylene oxide and polydimethylsiloxane synthesized in Example 45 and polyamic acid synthesized from biphenyltetracarboxylic acid dianhydride and p-phenylene diamine in a weight ratio of 1:1 is dissolved in THF at a concentration of 2 wt %, followed by filtering. The solution is applied to a 3-inch silicon wafer by spin coating at a rate of 2500 rpm to form a pattern forming film. The sample is heated at 60° C. for 90 seconds to evaporate the solvent, and then is heat-treated in a nitrogen atmosphere at 80° C. for 5 hours. Thereafter, the pattern-forming film is exposed to hydrochloric acid vapor. Then, the sample is heat-treated in a nitrogen atmosphere at 200° C. for one hour, at 250° C. for one hour, at 300° C. for one hour, and at 350° C. for 30 minutes. When the surface of the sample is observed with AFM, it is found that holes having a diameter of 15 nm are formed over the entire surface of the pattern forming film.

RIE is performed using the porous film as an etching mask under the conditions of $CF_4$, 0.01 Torr, 150 W of progressive wave, and 30 W of reflected wave to etch the silicon wafer. Thereafter, ashing of the remaining polymer is performed under the conditions of $O_2$, 0.01 Torr, 150 W of progressive wave, and 30 W of reflected wave. As a result, holes having a diameter of 14 nm and a depth of 5 nm are formed over the entire surface of the silicon wafer at approximately equal intervals.

Example 47

Synthesis of Diblock Copolymer

In this example, a triblock copolymer (PAN-PEO-PAN) consisting of polyethylene oxide (PEO) chain and polyacrylonitrile (PAN) chains is synthesized by living anion polymerization. Using a polyethylene oxide macromer (disodium salt of polyethylene oxide) as a reaction initiator, acrylonitrile is polymerized. Tetrahydrofuran and benzene used as solvents are distilled twice using lithium aluminum hydride as a desiccating agent under an argon gas flow, to which molecular sieves 4A is charged. The acrylonitrile employed as a monomer is washed successively with a saturated aqueous solution of $NaHSO_3$, a saturated aqueous solution of NaCl containing 1% of NaOH, and a saturated aqueous solution of NaCl, and then vacuum-distilled using calcium chloride as a desiccating agent, and further vacuum-distilled using calcium hydride as a desiccating agent under an argon gas flow, to which molecular sieves 4A is charged. Sodium naphthalene is prepared by reacting naphthalene with metallic sodium in THF. Crown ether (dicyclohexyl-18-crown-6) is freeze-dried from a solution in benzene, and then is dissolved in benzene. Polyethylene oxide, which has OH groups at both ends, is freeze-dried from a solution in benzene immediately before use. As for the polymerization apparatus, a pressure reactor (Taiatsu Glass Co., Ltd.) is employed. The reaction is carefully performed in an argon atmosphere under pressure of 4 atm so as to prevent an external air from entering the interior of the reaction system.

A solution of polyethylene oxide dissolved in dehydrated benzene is introduced into the reactor with flowing an argon gas, and is freeze-dried in vacuum over 5 hours. THF distilled under vacuum is directly introduced into the reactor. After the interior of the reactor is made into an argon gas atmosphere again, sodium naphthalene is introduced into the reactor at 0° C. and further a solution of crown ether in benzene is introduced at 30° C. with stirring. After the mixture is stirred for one hour, acrylonitrile is added to the mixture at −78° C. and allowed to polymerize with stirring. A small amount of reaction solution is taken out to measure the molecular weight thereof by GPC. Based on the measured molecular weight, an amount of acrylonitrile to be added to give a desired molecular weight is calculated and added so to the solution. A series of these procedures are carefully performed under a pressurized argon atmosphere so as to prevent an external air from entering the interior of the reaction system. After it is confirmed by GPC that a desired molecular weight is given, 2 mL of 2-propanol is added to the solution to terminate the reaction, and then the reactor is opened. The reaction solution is concentrated by three-times and then is dropped in a sufficient amount of petroleum ether to reprecipitate a polymer. After the polymer is separated by filtration, the polymer is vacuum-dried at room temperature, thus the triblock copolymer is provided.

The polyacrylonitrile has Mw of 65,000, the polyethylene oxide has Mw of 13,200, and Mw/Mn is 1.40.

Pattern Formation:

A 2-wt % solution of resultant PAN-PEO-PAN triblock copolymer is filtered, and then the solution is applied to a 3-inch quartz glass substrate by spin coating at a rate of 2,500 rpm to form a pattern forming film. The sample is heated at 110° C. for 90 seconds to evaporate the solvent. Thereafter, the sample is placed in an oven and is heat-treated in a nitrogen atmosphere at 200° C. for 10 minutes, subsequently at 135° C. for 10 hours. The heat treatment at 200° C. flattens the film and can eliminate the histeresis after the spin-coating. In addition, the heat treatment at 135° C. can efficiently advance microphase separation. The sample is heat-treated in air at 200° C. for 24 hours, and then is heat-treated in a nitrogen atmosphere at 350° C. for 30 minutes. When the surface of the substrate after the heat treatments is observed with AFM, it is found that holes having a diameter of about 12 nm are formed over the entire surface of the pattern forming film.

Reactive ion etching is performed to the sample under the conditions of $CF_4$, 0.01 Torr, 150 W of progressive wave, and 30 W of reflected wave to etch the substrate. Thereafter, reactive ion etching is performed under the conditions of $O_2$, 0.01 Torr, 150 W of progressive wave, and 30 W of reflected wave to remove the residue of the pattern forming film.

As a result, holes having a diameter of 12 nm and a depth of 20 nm are formed over the entire surface of quartz glass substrate at a density of about 2000 $\mu m^2$ and at approximately equal intervals. The substrate can be used as a substrate for a hard disk.

Example 48

Ten wt % of dioctyl phthalate is added as a plasticizer to the PAN-PEO-PAN triblock copolymer synthesized in Example 47. Heat-treatment conditions for forming microphase separation of the block copolymer is set to: under a nitrogen gas flow at 200° C. for 10 minutes, subsequently at 135° C. for one hour, in air at 200° C. for 24 hours, and then under a nitrogen gas flow at 350° C. for 30 minutes. A film having micro polymer phases is formed in a similar manner to that in Example 47 except for these conditions. The sample is etched using the film having micro polymer phases as a mask. As a result, a pattern similar to that in Example 47 can be formed in the substrate. As described above, addition of the plasticizer can shorten the heat-treating time.

Example 49

A 2-wt % solution of PAN-PEO-PAN triblock copolymer synthesized in Example 47 is filtered, and then the solution is applied to a 3-inch quartz glass substrate by spin coating at a rate of 2,500 rpm to form a pattern forming film. The sample is heated at 110% for 90 seconds to evaporate the solvent. The sample is placed in an oven and is heat-treated in a nitrogen atmosphere at 200° C. for 10 minutes and at 135° C. for 10 hours. The sample is heat-treated in air for 24 hours at 200° C., and then is heat-treated in a nitrogen atmosphere at 350° C. for 30 minutes. Next, the substrate is etched with hydrofluoric acid for one minute. Thereafter, ultrasonic washing is performed in acetone to remove the remaining polymer.

As a result, holes having a diameter of 15 nm and a depth of 12 nm are formed over the entire surface of quartz glass substrate at a density of about 2000/$\mu m^2$ and at approximately equal intervals. In such a manner, the substrate can be patterned with only wet etching without using a dry etching process. The substrate can be used as a substrate for a hard disk.

Example 50

Synthesis of Diblock Copolymer

Using polyethylene oxide having a methoxy group at one terminal and having an OH group at the other terminal, a diblock polymer (PAN-b-PEO) consisting of a polyethylene oxide (PEO) chain and a polyacrylonitrile (PAN) chain is synthesized by living anion polymerization by a similar method to that in Example 47. The polyacrylonitrile has Mw of 10,600, the polyethylene oxide has Mw of 35,800, and Mw/Mn is 1.37.

Pattern Formation:

A CoPtCr magnetic film is formed on a quartz glass substrate. A pattern forming film made of the above diblock copolymer is formed on the magnetic film, and then the pattern forming film is allowed to form a structure having micro polymer phases. Thereafter, the CoPtCr magnetic film is subjected to wet etching in a similar manner to that in Example 49. As a result, formed is a magnetic film structure in which projections having a diameter of 15 nm and a height of 12 nm are formed over the entire surface of quartz glass substrate at a density of about 1800/$\mu m^2$ and at approximately equal intervals.

Example 51

A quartz substrate is spin-coated with a solution of polyamic acid (that is prepared by diluting Semicofine SP-341 available from Toray Co., Ltd. with N-methyl-2-pyrolidone). The substrate is heated under a nitrogen gas flow subsequently at 150° C., at 250° C. and at 350° C., respectively, for one hour, to form a lower pattern transfer film consisting of polyimide having a thickness of 500 nm. Aluminum is deposited thereon to a thickness of 15 nm to form an upper pattern transfer film. The PAN-PEO-PAN triblock copolymer synthesized by the similar method to that in Example 47 is applied thereto in a thickness of 80 nm spin-coated to form a pattern forming film. The polyacrylonitrile block has Mw of 144,600, the polyethylene oxide has Mw of 70,700, and Mw/Mn is 1.41. Then, a porous pattern forming film having a structure having micro polymer phases is manufactured by the same method as in Example 47.

Reactive ion etching is performed to the sample under the conditions of $CF_4$, 0.01 Torr, 150 W of progressive wave, and 30 W of reflected wave, to transfer the phase-separated pattern of the pattern forming film to the upper pattern transfer film made of aluminum. Subsequently, reactive ion etching is performed to the sample under the conditions of $O_2$, 0.01 Torr, 150 W of progressive wave, and 30 W of reflected wave, to remove the residue of the pattern forming film, and at the same time, to etch the lower pattern transfer film formed of polyimide that are exposed to outside through openings in the upper pattern transfer film. Further, reactive ion etching is performed under the conditions of $CF_4$, 0.01 Torr, 150 W of progressive wave, and 30 W of reflected wave, to remove the upper pattern transfer film, and at the same time, to etch a part of the quartz substrate exposed through the openings formed in the pattern transfer film. Reactive ion etching is performed again under the conditions of $O_2$, 0.01 Torr, 150 W of progressive wave, and 30 W of reflected wave, to remove the lower pattern transfer film. As a result, holes having a very high aspect ratio of a diameter of 110 nm and a depth of 1200 nm are formed over the entire surface of the quartz substrate at a density of 35 $\mu m^2$.

Example 52

A $SiO_2$ film having a thickness of 500 nm is formed on a silicon wafer. A solution of polysilane represented by the following chemical formula (Mw=12,000, x=0.4) in toluene is applied to the $SiO_2$ film, followed by baking, thereby manufacturing a polysilane pattern transfer film having a thickness of 100 nm. To the polysilane transfer film, 0.5 wt % of 3,5-di-tert-butyl-4-hydroxy toluene is added as an antioxidant.

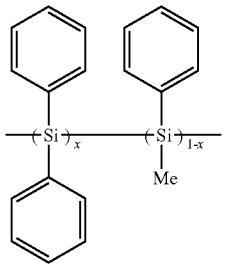

The pattern transfer film consisting of polysilane is coated with a diblock copolymer consisting of polyacrylonitrile (Mw=12,000) and polyethylene oxide (Mw=28,000) synthesized by the same method as that in Example 50, followed by baking at 90° C. for two minutes, to form a pattern forming film having a thickness of 40 nm. The sample is placed in an oven, and heat-treated in a nitrogen atmosphere at 200° C. for 10 minutes and then at 135° C. for 10 hours, and in air at 200° C. for 24 hours, and further in a nitrogen atmosphere at 350% for 30 minutes.

The polysilane film is etched using the pattern forming film as a mask under the conditions of HBr flow rate of 50 sccm, vacuum degree of 80 mTorr and excitation power of 200 W. As a result, the pattern can be transferred to the polysilane film. Since the pattern forming film is left remained on the polysilane film, it is found that the pattern forming film has sufficient etch resistance. Then, the $SiO_2$ film is etched using the polysilane film pattern as a mask under the conditions of $C_4F_8$ flow rate of 50 sccm, CO flow rate of 10 sccm, Ar flow rate of 100 sccm, $O_2$ flow rate of 3 sccm, vacuum degree of 10 mTorr, and excitation power of 200 W. The polysilane film has sufficient etch resistance, so that the pattern can be preferably transferred to the $SiO_2$ film. The remaining polysilane film can be easily removed using an aqueous organoalkali solution or a diluted hydrofluoric acid solution.

Incidentally, when the same procedures as described above are performed without addition of 3,5-di-tert-butyl-4-hydroxy toluene to the polysilane transfer film, etching selectivity between the pattern forming film and the polysilane pattern transfer film is reduced by 30%.

Example 53

A gold electrode is deposited on a glass substrate having a diameter of 10 inches, a $SiO_2$ film having a thickness of 100 nm is formed thereon, and an aluminum film having a thickness of 50 nm is deposited thereon.

A diblock copolymer (polyacrylonitrile: Mw=127,700, polymethylene oxide: Mw=1,103,000; Mw/Mn=1.30) and polyacrylonitrile (Mw=45,000, Mw/Mn=1.37) are mixed at the weight ratio of 21:79. The mixture is dissolved in acetonitrile by 5 wt %, followed by filtering, to prepare a solution. The solution is applied to the quartz glass substrate by spin coating and dried at 110° C. to form a pattern forming film having a thickness of 970 nm.

The sample is placed in an oven and heat-treated in a nitrogen atmosphere at 210° C. for 10 minutes and then at 135% for 10 hours, and in air at 200° C. for 24 hours, and further in a nitrogen atmosphere at 350° C. for 30 minutes, to make the pattern-forming film porous.

The sample is subjected to wet etching with an aqueous solution of hydrochloric acid and then by hydrofluoric acid, thereby transferring the phase-separated pattern of the pattern forming layer to the aluminum layer as well as to the $SiO_2$ layer. Thereafter, ashing is performed with an asher to remove the residue of pattern forming layer.

As a result, holes having a diameter of about 840 nm can be formed in the aluminum layer and $SiO_2$ layer at a density of about 23,000 per unit area of 300 μm×100 μm. The size distribution of holes is very uniform within the range of ±10%. This is because the block copolymer uniform in molecular weight is used. Also, since the islands of block copolymer are present in the sea of the homopolymer, holes are formed at random positions in some degree. Thus, if the sample is used as a porous gate electrode of a field emission display (FED) of three-electrode structure, it is expected that interference fringe due to regularity of electrodes can be prevented from occurring. Therefore, the method of this example can be suitably applied to the manufacture of porous gate electrode of FED.

Example 54

Dioctyl phthalate as a plasticizer is added by 10 wt % to the mixture in Example 53 of the diblock copolymer and the polyacrylonitrile homopolymer. The heat-treatment conditions for form microphase separation are set to as follows: under a nitrogen gas flow at 200° C. for 10 minutes and then at 135° C. for one hour, and in air at 200° C. for 24 hours, and further under a nitrogen gas flow at 350° C. for 30 minutes. A film having micro polymer phases is formed in a similar manner to that in Example 53 except for these conditions. Etching is performed using the film having micro polymer phases. As a result, a pattern of holes same as that in Example 53 can be formed in the substrate. As described above, addition of the plasticizer can shorten the heat treatment time.

Example 55

Gold is sputtered on the surface of a copper plate. A 10% solution of a diblock copolymer (polymethylphenylsilane Mw=135,000, PMMA: Mw=61,000, Mw/Mn=1.10) in PGMEA is applied to the gold film, and then dried over 9 days in a desiccator. The resultant film has a thickness of 0.2 mm. The film is vacuum-dried for 3 days. An ultra-thin film is cut out from this film, which is observed with a transmission electron microscope. As a result, it is confirmed that formed is a three-dimensional bicontinuous structure in which both the polysilane phase and the PMMA phase are formed continuously.

The sample is irradiated with an electron beam at an exposure dose of 150 kGy, and the is heat-treated in air at 150° C. for 2 hours and at 200° C. for 12 hours, and further under an argon gas flow at 500° C. for one hour. When the film is observed with a transmission electron microscope (TEM), it is observed that the PMMA phase is eliminated and the polysilane phase forms a continuous structure in the form of a sponge. The structure is almost same as the original three-dimensional bicontinuous structure, in which continuous pores of the order of nanometers are formed regularly.

Copper electroplating is performed using the copper plate on which the porous film is formed as a working electrode, another copper plate as a counter electrode, and a saturated calomel electrode as a reference electrode. A saturated aqueous solution of copper sulfate is employed as an electrolyte solution, and electrolysis voltage is set to −0.1V vs SCE. As a result, a nanocomposite film having a porous film in which pores are filled with copper is manufactured.

Example 56

Synthesis of a Polysilane-polyethylene Oxide Diblock Copolymer

As monomers, a masked disilene and ethylene oxide are employed. As a polymerization initiator, sec-butyl lithium is employed. These monomers are successively introduced into THF at a reaction temperature of −78° C. and thus a diblock copolymer comprising a polybutylmethylsilane chain and a polyethylene oxide chain is synthesized by living anion polymerization. The diblock copolymer has Mw of 70,500 and Mw/Mn of 1.2, the polysilane unit has Mw of 14,500, and the polyethylene oxide unit has Mw of 56,000.

A quartz substrate is spin-coated with a solution of polyamic acid (that is prepared by diluting Semicofine SP-341 available form Toray Co., Ltd. with N-methyl-2-pyrrolidone). The substrate is heated under a nitrogen gas flow at 150° C., at 250° C. and at 350° C., respectively, for one hour, to form a polyimide film (a pattern transfer film). The polyimide film is coated with a solution of the diblock copolymer synthesized as described above to form a pattern forming film. The pattern forming film is irradiated with an ultraviolet ray from a high-pressure mercury lamp to photo-oxidize the polysilane chain. The sample is heat-treated in air at 150° C. for one hour, and in a nitrogen atmosphere at 200° C. for 2 hours, at 250° C. for 2 hours, and at 350° C. for 30 minutes to make the film porous. Reactive ion etching is performed using the porous film as a mask under the conditions of $O_2$, 0.01 Torr, 150 W of progressive wave, and 30 W of reflected wave. At this time, the photo-oxidized polysilane film has sufficient etch resistance, making it possible to transfer a preferable pattern to the polyimide film. Further, the substrate is etched using the polyimide film as a mask. As a result, holes having a diameter of 14 nm and a depth of 10 nm are formed over the entire surface of the substrate at a density of about 2400 μm$^2$ and at approximately equal intervals.

Example 57

The same diblock copolymer as employed in Example 43 is dissolved by 1 wt % in methylene chloride. To the solution, 1 wt % of tetrabutylammonium hexachloro-platinate (IV) based on the weight of the polymer is added. The solution is cast on a SiO substrate to form a pattern forming film having a thickness of 20 nm. The sample is heated at 110 for 90 seconds to evaporate the solvent. Thereafter, the sample is placed in an oven and is heat-treated in a nitrogen atmosphere at 150° C. for 5, at 200° C. for 5 hours, at 300° C. for 5 hours and at 350° C. for 30 minutes.

Reactive ion etching is performed to the sample under the conditions of $CF_4$, 0.01 Torr, 150 W of progressive wave, and 30 W of reflected wave to etch the SiO substrate. As a result, holes having a diameter of 12 nm and a depth of 25 nm are formed over the entire surface of the SiO substrate at a density of about 2000/μm$^2$ and at approximately equal intervals. Further, platinum particles are deposited in the holes. By allowing a magnetic material to grow using the deposited platinum particles as nuclei, a magnetic recording medium of hard disk can be manufactured.

Example 58

Synthesis of Graft Copolymer

Styrene-terminated polyethylene oxide macromer (a) (Mw=14,100, Mw/Mn=1.04) and polysilsesquioxane derivative monomer (b) (where R is a hexyl group), represented by the following chemical formulas, respectively, are dissolved in THF, to which AIBN as a radical initiator is added, and then the mixture is heated in an argon atmosphere at 60° C. for 60 hours to synthesize a graft copolymer by radical polymerization. The graft copolymer has Mw of 101,000 and Mw/Mn of 2.1, the polysilsesquioxane derivative unit has Mw of 16,400, and the polyethylene oxide macromer unit has Mw of 84,600.

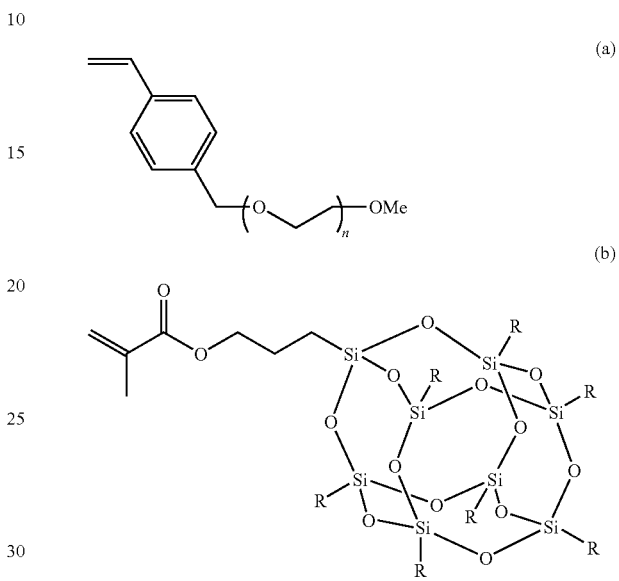

The graft copolymer is dissolved by 2 wt % in ethyl lactate, which is applied to a substrate and the naturally dried to form a pattern forming film. The sample is heated at 110° C. for 90 seconds to evaporate the solvent. The sample is heat-treated at 200° C. for one hour and at 350° C. for 5 hours to make the pattern forming film porous. Reactive ion etching is performed to the sample under the conditions of $CF_4$, 0.01 Torr, 150 W of progressive wave, and 30 W of reflected wave to etch the substrate. As a result, many projections having a diameter of 18 nm and a height of 10 nm are formed on the substrate.

Example 59

A 10% solution of a diblock copolymer (polyacrylonitrile Mw=137,000, polypropylene oxide Mw=32,000, Mw/Mn=1.45) in PGMEA is poured into a Teflon Petri dish, and then dried in a desiccator under an argon gas flow over 9 days. The thickness of the formed film is 0.2 mm. The film is vacuum-dried for 3 days. An ultra-thin film is cut out from the film, which is observed with a transmission electron microscope. As a result, it is confirmed that formed is a cylindrical structure in which cylindrical polypropylene oxide phases are formed in the matrix of the polyacrylonitrile phase.

The sample is irradiated with an electron beam at an exposure dose of 20 kGy. The sample is heat-treated in air at 150° C. for 2 hours and at 200° C. for 12 hours, and under an argon gas flow at 500° C. for one hour and at 1200° C. for one hour. When the sample is observed with TEM, it is found that formed is porous carbon in the form of a honeycomb retaining the cylindrical structure having pores with a diameter of about 20 nm. The porous carbon can be preferably employed as a carbon electrode.

When porous carbon is manufactured in the same manner as described above except that polyacrylonitrile-propylene oxide diblock copolymer (polyacrylonitrile Mw=69,000, polypropylene oxide Mw=14,000, Mw/Mn=1.42) is employed as a diblock copolymer. In this case, the porous carbon has pores with a diameter of about 9 nm.

Example 60

A 10% solution of a diblock copolymer (polyacrylonitrile Mw=137,000, polypropylene oxide Mw=62,000, Mw/Mn=1.45) in PGMEA is poured into a Teflon Petri dish, and then dried in a desiccator under an argon gas flow over 9 days. The thickness of the formed film is 10 μm. The film is vacuum-dried for 3 days. An ultra-thin film is cut out from the film, which is observed with a transmission electron microscope. As a result, it is confirmed the formed is a three-dimensional bicontinuous structure in which both the polyacrylonitrile phase and the polypropylene oxide phase are formed continuously.

The sample is irradiated with an electron beam at an exposure dose of 20 kGy. The film is heat-treated in air at 150° C. for 2 hours and at 200° C. for 12 hours, and under an argon gas flow at 500° C. for one hour and at 1200° C. for one hour. TEM observation shows that porous carbon retaining a bicontinuous structure is formed. The porous carbon can be preferably employed as a carbon electrode.

Example 61

A 10% solution of a diblock copolymer A (polyacrylonitrile Mw=68,000, polypropylene oxide Mw=32,000, Mw/Mn=1.45) is poured into a Teflon Petri dish, and then is dried over 9 days in a desiccator to manufacture a film. Platinate chloride and ruthenium chloride (Pt/Ru=1:1) are added to the solution of the diblock copolymer A. Likewise, a 10% solution of a diblock copolymer B (polyacrylonitrile Mw=137,000, polypropylene oxide Mw=62,000, Mw/Mn=1.45) is poured into a Teflon Petri dish, and then is dried over 9 days in a desiccator to manufacture a film. These films thus manufactured have a thickness of 10 μm, respectively. The films are vacuum-dried for 3 days. Ultra-thin films are cut out from these films, respectively, which are observed with a transmission electron microscope. As a result, it is confirmed that these films has a structure having micro polymer phases in which a polyacrylonitrile phase and a polypropylene oxide phase are entangled with each other. The diblock copolymer A is treated with formalin to generate Pt particles and Ru particles.

A solution of polyamic acid (that is prepared by diluting Semicofine SP-341 available from Toray Co., Ltd. with N-methyl-2-pyrrolidone) is applied to a silicon wafer with an applicator, immediately after that wafer is placed in a large amount of pure water so as not to evaporate the solvent and is immersed in water for 5 hours. The film is vacuum-dried at 50° C. for 8 hours, and further vacuum-dried at 170° C. for 8 hours. Next, the film is heat-treated in a nitrogen gas atmosphere at 200° C., at 250° C., at 300° C. and at 350° C., respectively, for one hour, to provide a three-dimensional porous polyimide film having an average pore size of about 0.5 μm.

The diblock copolymer A film, the diblock copolymer B film and the porous polyimide film are laminated and pressed to each other. The laminate is heat-treated in air at 150° C. for 2 hours and at 200° C. for 12 hours, and further under an argon gas flow at 500° C. for one hour and at 1200° C. for one hour. TEM observation of the cross-section of the sample shows that three-layered porous carbon laminate each having a pore size of about 20 nm, 40 nm and 0.1 to 0.5 μm, respectively.

On the other hand, to the diblock copolymer B (polyacrylonitrile Mw=137,000, polypropylene oxide Mw=62,000, Mw/Mn=1.45), a colloidal solution containing Pt fine particles having an average particle size of 5 nm that are generated using the diblock copolymer B as a coagulation inhibitor is added, and then a cast film having a thickness of 10 μm is formed. Pt fine particles are segregated at the interface of the structure having micro polymer phases of the diblock copolymer B. The cast film is heat-treated in air at 150° C. for 2 hours and at 200° C. for 12 hours, and further under an argon gas flow at 500° C. for one hour and at 1200° C. for one hour to manufacture a Pt-dispersed porous carbon film.

An electrolyte film consisting of Naphyon 117 (DuPont Co., Ltd.) having a thickness of 50 μm is formed on the porous layer having the pore size of 20 nm among the three layers of the porous carbon laminate film employed as a methanol fuel electrode, and then the Pt-dispersed porous carbon film as an air electrode is laminated thereon, thereby manufacturing a thin direct methanol fuel cell having a thickness of as small as 0.1 μm. When methanol and air are supplied to the cell so as to actuate the cell at 60° C., a continuous power generation is confirmed.

Example 62

3.5 g of polyoxyethylene (23) lauryl ether (Wako Junyaku Kogyo Co., Ltd.) as a surfactant, 0.2 g of glycerin, 3.4 g of furfuryl alcohol as a precursor of a thermosetting resin and 1.1 g of hydrochloric acid are dissolved in 29 g of water. To the aqueous solution, 33 g of isooctane is added and vigorously stirred and then the mixture is reacted at 60° C. for one month. The reaction mixture is filtered and the precipitate is separated out and washed with water and dried in vacuum to provide 1.0 g of black carbon precursor powder. The powder is fired in air at 200° C. for 2 hours and subsequently under a nitrogen gas flow at 500° C. for one hour to provide 0.4 g of carbon structure.

Figure 11:
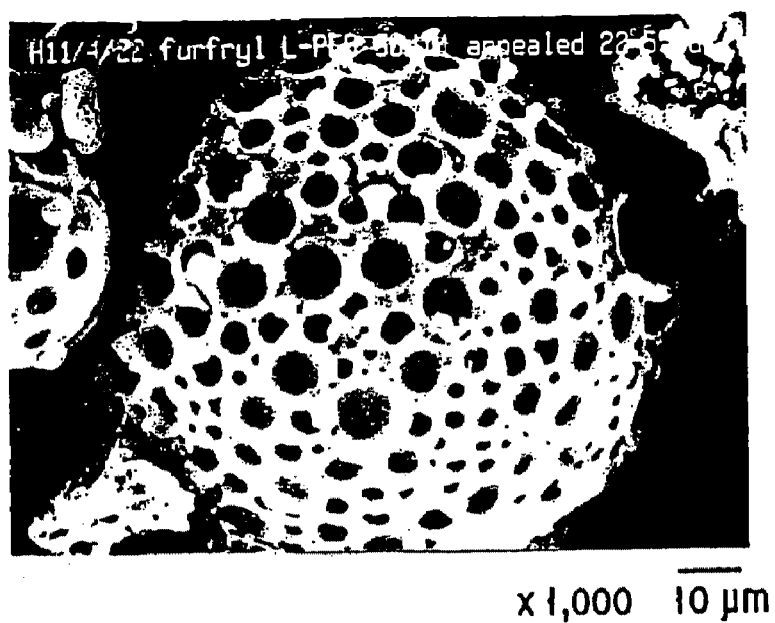
FIG. 11 is an SEM micrograph of a carbon structure manufactured in the present invention.
Figure 12:
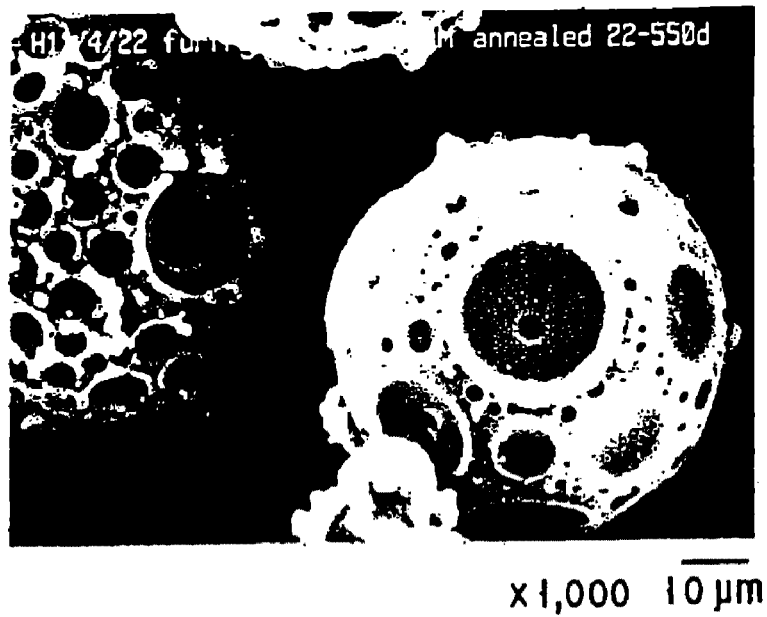
FIG. 12 is an SEM micrograph of a carbon structure manufactured in the present invention.

FIGS. 11 and 12 show SEM photographs of the carbon structures. As shown in FIGS. 11 and 12, the carbon structures have a complex structure that is spherical as a whole and has circular structures on the surface thereof.

When the reaction and firing are performed in the same manner as described above except that 0.2 g of a 20 wt % solution of titanium trichloride in hydrochloric acid is added to the above aqueous solution. In this case, 0.8 g of the carbon structure is obtained. In such a manner, addition of titanium trichloride can improve the yield.

Example 63

Synthesis of Diblock Copolymer

A diblock polymer consisting of 1,2-polybutadiene chain and polyethylene oxide chain is synthesized by living anion polymerization. The 1,2-polybutadiene chain has Mw of 65,000, the polyethylene oxide chain has Mw of 13,200, and Mw/Mn is 1.1.

Pattern Formation:

A 2 wt % solution of a mixture prepared by adding 3 wt % of 3,3',4,4-tetrakis(t-butylperoxycarbonyl) benzophenone to the resultant diblock polymer is filtered. The solution is applied to a 3-inch quartz glass substrate by spin coating at a rate of 2,500 rpm to form a pattern forming film. The sample is placed in an oven and is heat-treated in a nitrogen atmosphere at 135° C. for 2 hours and at 170% for one hour. The heat-treatment at 170° C. allows the 1,2-polybutadiene chain to be three-dimensionally cross-linked. Further, the sample is heat-treated in a nitrogen atmosphere at 170° C. for 30 minutes. When the surface of the substrate after the heat treatments is observed with AFM, it is found that holes having a size of about 13 nm are formed over the entire surface of the pattern forming film.

Reactive ion etching is performed to the sample under the conditions of $CF_4$, 0.01 Torr, 150 W of progressive wave, and 30 W of reflected wave. Thereafter, Reactive ion etching is performed to the sample under the conditions of $O_2$, 0.01 Torr, 150 W of progressive wave, and 30 W of reflected wave to remove the residue of the pattern forming film.

As a result, holes having a diameter of 13 nm and a depth of 15 nm are formed over the entire surface of quartz glass substrate at a density of about 2000 $\mu m^2$ and at approximately equal intervals. A CoPtCr thin film having a thickness of 15 nm is deposited on the quartz substrate by sputtering. Carbon having a thickness of 10 nm is deposited as a protective film on the CoPtCr thin film by sputtering, from which anomalous projections are removed by tape vanishing, and then a lubricant is applied thereto to manufacture a high-density magnetic recording medium. The medium has perpendicular magnetic anisotropy of 1.8 kOe.

Example 64

Pattern Formation

A 2 wt % solution of a mixture that is prepared by adding 3 wt % of 3,3',4,4'-tetrakis(t-butylperoxy-carbonyl)benzophenone is added to the same diblock polymer as that employed in Example 63 is filtered. The solution is applied to a 3-inch quartz glass substrate by spin coating at a rate of 2,500 rpm to form a pattern forming film. The sample is placed in an oven and is heat-treated in a nitrogen atmosphere at 135° C. for 2 hours and at 170° C. for one hour. The heat-treatment at 170° C. allows the polybutadiene chain to be three-dimensionally cross-linked. Further, the sample is heat-treated in a nitrogen atmosphere at 170° C. for 30 minutes. When the surface of the substrate after the heat treatments is observed with AFM, it is found that holes having a size of about 13 nm are formed over the entire surface of the pattern forming film.

Reactive ion etching is performed to the sample under the conditions of $CF_4$, 0.01 Torr, 150 W of progressive wave, and 30 W of reflected wave. After etching, the substrate is further treated with hydrofluoric acid. The sample is immersed in a solution of tin (II) chloride (0.1 mL/L of 37% concentrated sulfuric acid is added to 1.0 g/L of $SnCl_2$) for 20 seconds, and then the sample is washed with pure water. Subsequently, the sample is immersed in a solution of palladium chloride (0.1 mL/L of 37% concentrated sulfuric acid is added to 0.1 g/L of $PdCl_2$) for 20 seconds, and then the sample is washed with pure water. These operations to immerse the sample into the solutions of tin (II) chloride and palladium chloride are repeated several times.

As a result, provided is a structure in which palladium dots having a diameter of about 10 nm are formed over the entire surface of the quartz glass substrate at a density of about 2000 $\mu m^2$ and at approximately equal intervals. A CoPtCr thin film having a thickness of 15 nm is deposited on the quartz substrate by sputtering. Carbon having a thickness of 10 nm is deposited as a protective film on the CoPtCr thin film by sputtering, from which anomalous projections are removed by tape vanishing, and then a lubricant is applied thereto to manufacture a high-density magnetic recording medium.

The above dot-like palladium can also be used as a mask or as a dotted electrode.

Example 65

Polyethylene oxide whose ends are treated with 3,5-diaminobenzoate (weight-average molecular weight Mw=20,000) is reacted with paraphenylenediamine and pyromellitic anhydride to synthesize polyamic acid having polyethylene oxide chains as graft chains. The weight ratio between the polyamic acid moiety and the polyethylene oxide moiety is set to 1:2. One part by weight of bis(4-maleimidophenyl)methane is added to 30 parts by weight of the synthesized polyamic acid, and then a solution in N-methylpyrrolidone is prepared. The solution is applied to a glass plate using an applicator to form a sheet having a thickness of 10 μm. The sheet is subjected to heat-treatment in a nitrogen flow at 150° C., 250° C. and 350° C. for one hour, respectively, to provide a porous sheet. The resultant porous sheet has a porous structure to which transferred is a bicontinuous phase-separated structure consisting of polybutadiene cylinder phases highly branched in a three-dimensional network configuration.

The resultant polyimide porous sheet is subjected to repeating processes comprising steps of being impregnated with a poly(2-bromoethyl)silsesquioxane, being irradiated with an ultraviolet ray, and being heat-treated at 80° C., by five times, and thus poly(2-bromoethyl)silsesquioxane is sufficiently loaded into pores of the porous sheet. The porous sheet is subjected to oxygen ashing under the conditions of 800 W and 1 Torr. As a result, it is possible to manufacture a silica porous body having a nanostructure that is transferred using the porous structure of the polyimide porous sheet as a template.

A mixed solution of acrylonitrile mixed with 10 wt % of 3,3',4,4-tetra(t-butylperoxycarbonyl) benzophenone is prepared. The silica porous body is impregnated with the solution. The silica porous body is irradiated with an ultraviolet ray, thereby polymerizing and curing the acrylonitrile. The structure is heated in air at 210° C. for 24 hours, and then heated in a nitrogen flow from 210° C. to 800° C. at a rate of temperature rise of 10° C. per minute so as to be carbonized. The composite of silica and carbon is treated with hydrofluoric acid to solve out the silica. As a result, it is possible to manufacture porous carbon having continuous pores reflecting the morphology of the polyimide porous sheet.

Example 66

A block copolymer of PS having a molecular weight of 65,000 and PMMA having a molecular weight of 13,000, and platinum particles covered with PMMA are prepared. One wt % of the platinum particle-including PMMA is added to the block copolymer. The resultant mixture is dissolved in ethyl cellosolve acetate to prepare a 10 wt % solution.

A SiO substrate having a diameter of 3 inches is spin-coated with the solution at a rate of 2,500 rpm. The substrate is heated at 110° C. for 90 seconds to evaporate the solvent. The substrate is placed in an oven and the is annealed in a nitrogen atmosphere at 210° C. for 10 minutes, subsequently at 135° C. for 10 hours. When the SiO substrate is observed with an atomic force microscope in a phase mode, it is confirmed that islands of PMMA having a diameter of about 17 nm are formed in the sea of PS.

RIE is performed to the sample under the conditions of $CF_4$, 0.01 Torr, 150 W of progressive wave, and 30 W of reflected wave to etch the PMMA selectively, and further to etch the exposed underlayer using the remaining PS pattern as a mask. Ashing is performed to the sample under the conditions of $O_2$, 0.01 Torr, 150 W of progressive wave, and 30 W of reflected wave to remove the mask made of PS.

It is observed with SEM and AFM that holes having a diameter of about 20 nm are formed over the entire surface of the 3-inch SiO substrate at approximately equal intervals. Also, it is observed that the platinum particles are aggregated at the center of the holes.

Example 67

A block copolymer of polystyrene having a molecular weight of 26,000 and poly(2-vinylpyridine) having a molecular weight of 5,600, platinum particles covered with poly(2-vinylpyridine), and platinum particles covered with polymethyl acrylate are prepared. The two kinds of platinum particle-including polymers are added by 1 wt %, respectively, to the block copolymer. The resultant mixture is dissolved in diglyme to prepare a 10% solution.

A SiO substrate having a diameter of 3 inches is spin-coated with the solution at a rate of 2,500 rpm. The substrate is heated at 110° C. for 90 seconds to evaporate the solvent. The substrate is placed in an oven and is annealed in a nitrogen atmosphere at 210° C. for 10 minutes, subsequently at 135° C. for 10 hours.

Ashing is performed to the entire surface of the sample under the conditions of $O_2$, 0.01 Torr, 150 W of progressive wave, and 30 W of reflected wave to remove the block copolymer. As a result, only platinum particles remain on the substrate.

It is observed with SEM and AFM that platinum particles having a particle size of about 4 nm are dispersed with forming a triangle lattice of about 25 nm over the entire surface of the substrate.

After the surface of the substrate is lightly sputter-etched at 100 W for one minute, CoPt is sputtered under a pressure of 2 Pa, thereby depositing a magnetic layer having a thickness of 20 nm with using the platinum particles as seeds. The result of determination of the coercive force from the hysteresis curve shows 13 kOe.

For the purpose of comparison, a magnetic layer is deposited on a glass substrate on which metal fine particles are dispersed. The magnetic layer has coercive force of 5 kOe.

Example 68

In place of platinum particles covered with poly(2-vinylpyridine) employed in Example 67, platinum particles covered with a block copolymer comprising PS having a molecular weight of 4,800 and poly(2-vinylpyridine) having a molecular weight of 4,300 are employed. One wt % of the platinum particle-including block copolymer is added to the block copolymer employed in Example 67. The resultant mixture is dissolved in ethyl cellosolve acetate to prepare a 10-wt % solution.

A SiO substrate having a diameter of 3 inches is spin-coated with the solution at a rate of 2,500 rpm. The substrate is heated at 110° C. for 90 seconds to evaporate the solvent. The substrate is placed in an oven and is annealed in a nitrogen atmosphere at 210° C. for 4 hours, subsequently at 135° C. for 10 hours.

When the substrate is observed with an atomic force microscope in a phase mode, it is confirmed that islands of poly(2-vinylpyridine) having a size of about 17 nm are dispersed in the sea of PS in which metal fine particles locally exist at the interface between the islands and the sea.

RIE is performed to the sample under the conditions of $CF_4$, 0.01 Torr, 150 W of progressive wave, and 30 W of reflected wave to etch the poly(2-vinylpyridine) selectively, and further to etch the exposed underlayer using the remaining PS pattern as a mask. Ashing is performed to the sample under the conditions of $O_2$, 0.01 Torr, 150 W of progressive wave, and 30 W of reflected wave to remove the mask made of PS.

It is observed with SEM and AFM that holes having a diameter of about 20 nm are formed over the entire surface of the 3-inch SiO substrate at approximately equal intervals. Also, it is observed that the platinum particles are segregated at the edges of the holes.

Example 69

Another method for manufacturing the field emission display (FED) device shown in FIG. 9 will be described. Similar to the method in Example 27, the cathode conductor 102 is formed on the insulative substrate 101, and then a portion of the cathode conductor 102 is etched. The resistance layer 103 formed to cover the cathode conductor 102, and then the resistance layer 103 is patterned to form a plurality of terminals 103A. The insulating layer 104 is formed to cover the cathode conductor 102 and the resistance layer 103, and then the gate conductor 105 is formed on the insulating layer 104.

Then, a resist is patterned to protect intersecting portions between gate wires and emitter wires. A solution of a mixture of the PS-PMMA diblock copolymer used in Example 66 and platinum particles coated with PMMA is applied to the gate conductor 105 by spin coating and then dried, followed by annealing, thereby forming a film having micro polymer phases. RIE with $CF_4$ gas is performed to the film having micro polymer phases, thus the PMMA in the film having micro polymer phases is selectively etched, and further the gate conductor 105 is etched with using the pattern of remaining PS as mask, thereby transferring the pattern to the gate conductor 105. Thereafter, ashing is performed with an $O_2$ asher, thereby removing the remaining organic substances. In such a manner, many openings 106 having a diameter of about 840 nm are formed in the gate conductor 105. Wet etching with a buffered hydrofluoric acid (BHF) or RIE with a gas such as $CHF_3$ is performed to remove the insulating layer 104 in the openings 106 until the resistance layer 103 is exposed to the outside. As a result, it is confirmed that platinum particles are deposited on the bottom of the openings 106.

Then, aluminum is obliquely deposited by electron beam (EB) evaporation to form a peeling layer. Molybdenum is normally deposited on the peeling layer in the perpendicular direction by EB evaporation, thereby depositing molybdenum in a conical configuration inside the openings 106 to form the emitters 107. Thereafter, the peeling layer is removed with a peeling solution such as phosphoric acid, thereby manufacturing an FED device.

Example 70

A block copolymer comprising poly(2-vinylpyridine) having a molecular weight of 83,000 and poly(methyl acrylate) having a molecular weight of 78,000, platinum particles coated with poly(2-vinylpyridine) and platinum particles coated with polymethyl acrylate are prepared. Then, 1 wt % of each of the polymer-coated platinum particles is added to the block copolymer. The mixture is dissolved in THF to prepare a 10-wt % solution. The solution is placed in a Teflon Petri dish to allow the solvent to evaporate over 10 days. Further, drying is performed in vacuum at 60 over 3 days, and thus a first film having a thickness of 0.2 mm is provided.

Poly(2-vinylpyridine) having a molecular weight of 143,000 and platinum particles covered with poly(2-vinylpyridine) are prepared. Then, 1 wt % of the polymer-coated platinum particles is added to the homopolymer. The mixture is dissolved in THF to prepare a 10-wt % solution. The solution is placed in a Teflon Petri dish to allow the solvent to evaporate over 10 days. Further, drying is performed in vacuum at 60° C. for 3 days, thus a second film having a thickness of 0.05 mm is provided.

Polymethyl acrylate having a molecular weight of 160,000 and platinum particles covered with polymethyl acrylate are prepared. Then, 1 wt % of the polymer-coated platinum particles is added to the homopolymer. The mixture is dissolved in THF to prepare a 10-wt % solution. The solution is placed in a Teflon Petri dish to allow the solvent to evaporate over 10 days. Further, drying is performed in vacuum at 60° C. for 3 days, thus a third film having a thickness of 0.05 mm is provided.

The second film, the first film and the third film are laminated in this order and annealed in a nitrogen atmosphere at 160° C. for 40 hours. Observation with TEM shows that a lamella structure is formed in the first film. Further, these films are annealed at 240° C. for 10 hours. Observation again with TEM shows that the polymer is fired and platinum is made into a continuous product. Aluminum is deposited on both sides of the structure to form electrodes. The structure is then cut into 1 cm×1 cm to manufacture a capacitor.

Example 71

Figure 13:
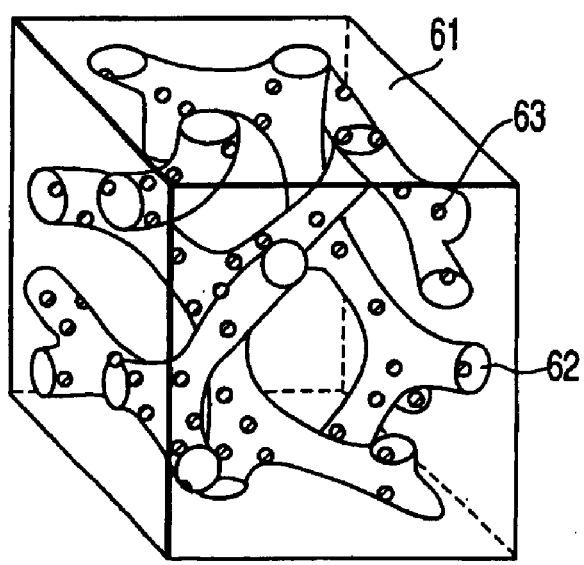
FIG. 13 is a perspective view showing a catalytic layer of a fuel cell according to the present invention.

A block copolymer comprising polystyrene (molecular weight: 35,000) and polyethylene oxide (molecular weight: 70,000), and platinum particles covered with the block copolymer are prepared. Then, 1 wt % of the polymer-coated platinum particles is added to the block copolymer. The mixture is dissolved in THF to prepare a 10% solution. The solution is placed in a Teflon Petri dish to allow the solvent to evaporate over 10 days. Further, drying is performed in vacuum at 60° C. for 3 days to provide a film having a thickness of 0.05 mm. The film is annealed in a nitrogen atmosphere at 140° C. for 40 hours. TEM observation shows that a cylindrical structure is formed in the film. Further, the film is annealed at 240° C. for 10 hours. When the film is observed by TEM again, many pores 62 are formed in the polymer 61 as shown in FIG. 13, and many platinum particles 63 are adhered on the wall facing the pores 62. The film is employed as a cathode catalytic layer of a fuel cell.

A block copolymer comprising polystyrene (molecular weight: 35,000) and polyethylene oxide (molecular weight: 70,000), and platinum particles covered with this block copolymer coating are prepared. Then, 1 wt % of the polymer-coated ruthenium particles is added to the block copolymer. The mixture is dissolved in THF to prepare a 10-wt % solution. The solution is placed in a Teflon Petri dish to allow the solvent to evaporate over 10 days. Further, drying in vacuum at 60° C. over 3 days provides a film having a thickness of 0.05 mm. The film is annealed in a nitrogen atmosphere at 140° C. for 40 hours. Observation with TEM shows that a cylindrical structure appears in the film. The film is annealed for 10 hours at 240%. Observation again with TEM shows that a large number of pores are formed and a large number of ruthenium fine particles are adhered on the walls facing the pores, as shown in FIG. 13. The thin film is employed as a cathode catalytic layer of fuel cell.

A direct methanol fuel cell shown in FIG. 7 is manufactured.

FIG. 7 shows a conceptual diagram of a direct methanol fuel cell. The anode catalytic layer 11 and the cathode catalytic layer 14 sandwiches the electrolyte film 16 made of a proton conductor. On the side of the anode catalytic layer 11, the fuel-evaporating layer 12 and the fuel-permeating layer 13 are provided. On the side of the cathode catalytic layer 14, the water-holding gas channel 14 is provided.

For the purpose of comparison, using a cathode catalytic layer having a structure that a platinum catalyst is buried in the matrix of a film and a cathode catalytic layer having a structure that a ruthenium catalyst is buried in the matrix of a film, a direct methanol fuel cell shown in FIG. 7 is manufactured.

The fuel cell of the present invention has higher power generation efficiency by at least twice as compared with the fuel cell of the comparative example.

What is claimed is:

1. A method for manufacturing a porous structure comprising:
   forming a molded product comprised of a pattern forming material, wherein the pattern forming material comprises a block copolymer or graft copolymer comprising:
   a polymer chain selected from the group consisting of a polyacrylonitrile chain, a polyacrylonitrile derivative chain, a polycyclohexadiene derivative chain and a polybutadiene chain; and
   a thermally decomposable polymer chain;
   forming a microphase-separated structure in the molded product, said microphase-separated structure comprising a thermally decomposable polymer phase and a remaining polymer phase;
   forming a porous structure having the remaining polymer phase by removing the thermally decomposable polymer phase by heating said molded product to a thermal decomposition temperature or more.

2. The method according to claim 1, further comprising filling one or more pores of the porous structure with an inorganic material.

3. The method according to claim 1, further comprising using said porous structure as at least part of one or more electrodes in an electrochemical cell comprising at least a pair of electrodes and an electrolyte layer interposed between the electrodes.

4. The method according to claim 3, wherein the porous structure has a three-dimensional network structure comprising microdomains, and said porous structure comprises a continuous pore having correlation distances at both $2\sqrt{3}$ times and 4 times a radius of gyration of cross section of the microdomains.

5. The method according to claim 3, wherein the porous structure is a porous carbon structure.

6. The method according to claim 5, wherein the porous carbon structure has cylindrical pores having an average size from 0.1 to 100 nm which are arranged in a honeycomb manner.

7. The method according to claim 1, wherein the porous structure has a three-dimensional network structure comprising microdomains, and said porous structure comprises a continuous pore having correlation distances at both $2\sqrt{3}$ times and 4 times a radius of gyration of cross section of the microdomains.

8. The method according to claim 1, wherein the porous structure is a porous carbon structure.

9. The method according to claim 1, wherein the porous carbon structure has cylindrical pores having an average size from 0.1 to 100 nm which are arranged in a honeycomb manner.

* * * * *